(12) United States Patent
Yamazaki et al.

(10) Patent No.: US 12,058,878 B2
(45) Date of Patent: Aug. 6, 2024

(54) LIGHT-EMITTING DEVICE, LIGHT-EMITTING APPARATUS, LIGHT-EMITTING MODULE, LIGHTING DEVICE, DISPLAY APPARATUS, DISPLAY MODULE, AND ELECTRONIC DEVICE

(71) Applicant: Semiconductor Energy Laboratory Co., Ltd., Kanagawa-ken (JP)

(72) Inventors: Shunpei Yamazaki, Tokyo (JP);
Daisuke Kubota, Kanagawa (JP);
Nobuharu Ohsawa, Kanagawa (JP);
Takeyoshi Watabe, Kanagawa (JP);
Taisuke Kamada, Saitama (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 482 days.

(21) Appl. No.: 17/414,058

(22) PCT Filed: Dec. 12, 2019

(86) PCT No.: PCT/IB2019/060681
§ 371 (c)(1),
(2) Date: Jun. 15, 2021

(87) PCT Pub. No.: WO2020/128735
PCT Pub. Date: Jun. 25, 2020

(65) Prior Publication Data
US 2022/0029121 A1 Jan. 27, 2022

(30) Foreign Application Priority Data

Dec. 21, 2018 (JP) .................................. 2018-239832
Dec. 21, 2018 (JP) .................................. 2018-239835

(51) Int. Cl.
*H10K 50/13* (2023.01)
*H10K 50/16* (2023.01)
(Continued)

(52) U.S. Cl.
CPC ......... *H10K 50/131* (2023.02); *H10K 50/852* (2023.02); *H10K 65/00* (2023.02); *H10K 50/16* (2023.02); *H10K 2102/311* (2023.02)

(58) Field of Classification Search
CPC .... H10K 50/131; H10K 50/852; H10K 65/00; H10K 50/16; H10K 2102/311;
(Continued)

(56) References Cited

U.S. PATENT DOCUMENTS 7,042,444 B2  5/2006  Cok
7,202,856 B2  4/2007  Cok
(Continued)

FOREIGN PATENT DOCUMENTS

CN   102956841 A   3/2013
CN   104867957 A   8/2015
(Continued)

OTHER PUBLICATIONS

International Search Report (Application No. PCT/IB2019/060681) Dated Mar. 17, 2020.
(Continued)

*Primary Examiner* — Mohammad A Rahman
(74) *Attorney, Agent, or Firm* — Husch Blackwell LLP

(57) ABSTRACT

A display apparatus having a function of emitting visible light and infrared light and a light detection function is provided. The display apparatus includes a first light-emitting device, a second light-emitting device, and a light-receiving device in a display portion. The first light-emitting device emits both visible light and infrared light and the second light-emitting device emits visible light. The light-receiving device has a function of absorbing at least part of visible light and infrared light. The first light-emitting device includes a first pixel electrode, a first light-emitting layer, a second light-emitting layer, and a common electrode. The
(Continued)

second light-emitting device includes a second pixel electrode, a third light-emitting layer, and the common electrode. The light-receiving device includes a third pixel electrode, an active layer, and the common electrode. The first light-emitting layer includes a light-emitting material emitting infrared light. The second light-emitting layer and the third light-emitting layer include light-emitting materials emitting visible light with different wavelengths. The active layer includes an organic compound.

39 Claims, 32 Drawing Sheets

(51) Int. Cl.
*H10K 50/852* (2023.01)
*H10K 65/00* (2023.01)
*H10K 102/00* (2023.01)

(58) Field of Classification Search
CPC .. H10K 50/19; H10K 2102/351; H10K 50/13; H10K 59/35; H10K 59/351; H10K 59/60; H10K 50/15; H10K 50/805; H10K 59/00; H10K 77/111; G02B 5/208; G02B 5/20; Y02E 10/549; H05B 33/14; H05B 33/26; H05B 33/02; H05B 33/24; H05B 33/28; H05B 33/12; H05B 33/22; C09K 2211/185; C09K 11/06; G01J 1/02; G09F 9/301; G09F 9/30; H01L 27/32
See application file for complete search history.

(56) References Cited

U.S. PATENT DOCUMENTS

| | | | |
|---|---|---|---|
| 7,355,340 B2 | 4/2008 | Shitagaki et al. |
| 7,956,349 B2 | 6/2011 | Tsutsui et al. |
| 8,399,821 B2 | 3/2013 | Matsumoto |
| 8,698,395 B2 | 4/2014 | Im et al. |
| 8,803,138 B2 | 8/2014 | Fujita et al. |
| 9,088,006 B2 | 7/2015 | Yamazaki et al. |
| 9,159,932 B2 | 10/2015 | Fujita et al. |
| 9,178,102 B2 | 11/2015 | Fujita et al. |
| 9,224,928 B2 | 12/2015 | Fujita et al. |
| 9,401,460 B2 | 7/2016 | Fujita et al. |
| 9,412,909 B2 | 8/2016 | Fujita et al. |
| 9,553,274 B2 | 1/2017 | Xia et al. |
| 9,817,520 B2 | 11/2017 | Ikeda et al. |
| 9,917,257 B2 | 3/2018 | Lee et al. |
| 9,921,670 B2 | 3/2018 | Wang et al. |
| 9,978,960 B2 | 5/2018 | Inoue et al. |
| 10,388,706 B2 | 8/2019 | Lee et al. |
| 10,734,589 B2 | 8/2020 | Suzuki et al. |
| 10,985,220 B2 | 4/2021 | Lee et al. |
| 2006/0113907 A1 | 6/2006 | Im et al. |
| 2013/0168654 A1* | 7/2013 | Fujita ................... H01L 33/504 257/40 |
| 2014/0225100 A1 | 8/2014 | Yokoyama et al. |
| 2015/0021627 A1 | 1/2015 | Fujita et al. |
| 2015/0243712 A1 | 8/2015 | Wang et al. |
| 2015/0333271 A1 | 11/2015 | Chung et al. |
| 2015/0364527 A1 | 12/2015 | Wang et al. |
| 2016/0126500 A1 | 5/2016 | Uesaka et al. |
| 2016/0141515 A1 | 5/2016 | Hayama et al. |
| 2017/0200901 A1* | 7/2017 | Fujita ................... G01R 31/44 |
| 2018/0261652 A1 | 9/2018 | Kim et al. |
| 2018/0261655 A1* | 9/2018 | Lee ....................... H10K 59/13 |
| 2018/0261773 A1 | 9/2018 | Yamamoto et al. |
| 2019/0002488 A1 | 1/2019 | Humphries et al. |
| 2019/0031673 A1 | 1/2019 | Yamaguchi et al. |
| 2019/0062357 A1 | 2/2019 | Yoo et al. |
| 2019/0096959 A1 | 3/2019 | Lee et al. |
| 2019/0115542 A1 | 4/2019 | Yokoyama et al. |
| 2019/0131540 A1 | 5/2019 | Sim et al. |
| 2019/0165058 A1* | 5/2019 | Managaki ............. H10K 50/805 |
| 2019/0341434 A1 | 11/2019 | Lee et al. |
| 2019/0372028 A1 | 12/2019 | Qiao et al. |
| 2020/0152887 A1 | 5/2020 | Yamaguchi et al. |
| 2020/0176715 A1* | 6/2020 | Abe ....................... H10K 50/852 |
| 2021/0384442 A1* | 12/2021 | Watabe ................... H05B 33/26 |

FOREIGN PATENT DOCUMENTS

| | | |
|---|---|---|
| CN | 105304673 A | 2/2016 |
| CN | 108573994 A | 9/2018 |
| CN | 108573995 A | 9/2018 |
| CN | 109560175 A | 4/2019 |
| EP | 1450245 A | 8/2004 |
| EP | 3 373 336 A1 | 9/2018 |
| EP | 3 373 355 A2 | 9/2018 |
| JP | 2010-050014 A | 3/2010 |
| JP | 2013-140839 A | 7/2013 |
| JP | 2014-197522 A | 10/2014 |
| JP | 2015-162463 A | 9/2015 |
| JP | 2016-066626 A | 4/2016 |
| JP | 2018-147877 A | 9/2018 |
| KR | 2015-0101509 A | 9/2015 |
| KR | 2015-0142816 A | 12/2015 |
| KR | 2018-0103206 A | 9/2018 |
| KR | 2018-0103207 A | 9/2018 |
| KR | 2019-0035984 A | 4/2019 |
| TW | 200422921 | 11/2004 |
| TW | 201834295 | 9/2018 |

OTHER PUBLICATIONS

Written Opinion (Application No. PCT/IB2019/060681) Dated Mar. 17, 2020.
Taiwanese Office Action (Application No. 108145479) Dated Oct. 31, 2023.
Chinese Office Action (Application No. 201980085307.7) Dated Nov. 22, 2023.

* cited by examiner

FIG. 3A

| 47R | 47G | 47B (IR) |
|---|---|---|
| 115 | | |
| 194R | 194G | 194B |
| 193R | 193G | 193B |
| | | 193N |
| 192R | 192G | 192B |
| 191 | 191 | 191 |
| 45 | | |
| 151 | | |

FIG. 3B

| 47R | 47G | 47B (IR) |
|---|---|---|
| 115 | | |
| 114 | | |
| 193R | 193G | 193B |
| | | 193N |
| 112 | | |
| 191 | 191 | 191 |
| 45 | | |
| 151 | | |

FIG. 3C

| 47R (IR) | 47G | 47B |
|---|---|---|
| 115 | | |
| 114 | | |
| 194R | 194G | 194B |
| 193N | 193G | 193B |
| 193R | | |
| 192R | 192G | 192B |
| 112 | | |
| 191 | 191 | 191 |
| 45 | | |
| 151 | | |

FIG. 3D

| 47R (IR) | 47G | 47B |
|---|---|---|
| 115 | | |
| 114 | | |
| 194R | 194G | 194B |
| 193R | 193G | 193B |
| 193N | | |
| 192R | 192G | 192B |
| 112 | | |
| 191 | 191 | 191 |
| 45 | | |
| 151 | | |

FIG. 4A

| 47R | 47G | 47B (IR) |
|---|---|---|
| colspan: 115 | | |
| 194R | 194G | 194B |
| 193R | 193G | 193B |
| | | 193N — 198 |
| 192R | 192G | 192B |
| 191 | 191 | 191 |
| 45 | | |
| 151 | | |

FIG. 4B

| 47R | 47G | 47B (IR) |
|---|---|---|
| 115 | | |
| 114 | | |
| 193R | 193G | 193B |
| | | 193N — 198 |
| 112 | | |
| 191 | 191 | 191 |
| 45 | | |
| 151 | | |

FIG. 4C

| 47R (IR) | 47G | 47B |
|---|---|---|
| 115 | | |
| 114 | | |
| 194R | 194G | 194B |
| 193N | 193G | 193B |
| 193R | | |
| 192R | 192G | 192B |
| 112 | | |
| 191 | 191 | 191 |
| 45 | | |
| 151 | | |

| 47R | 47G | 47B (IR) |
|---|---|---|
| 116 | | |
| 115 | | |
| 194R | 194G | 194B |
| 193R | 193G | 193B |
| | | 193N |
| 192R | 192G | 192B |
| 191 | 191 | 191 |
| 45 | | |
| 151 | | |

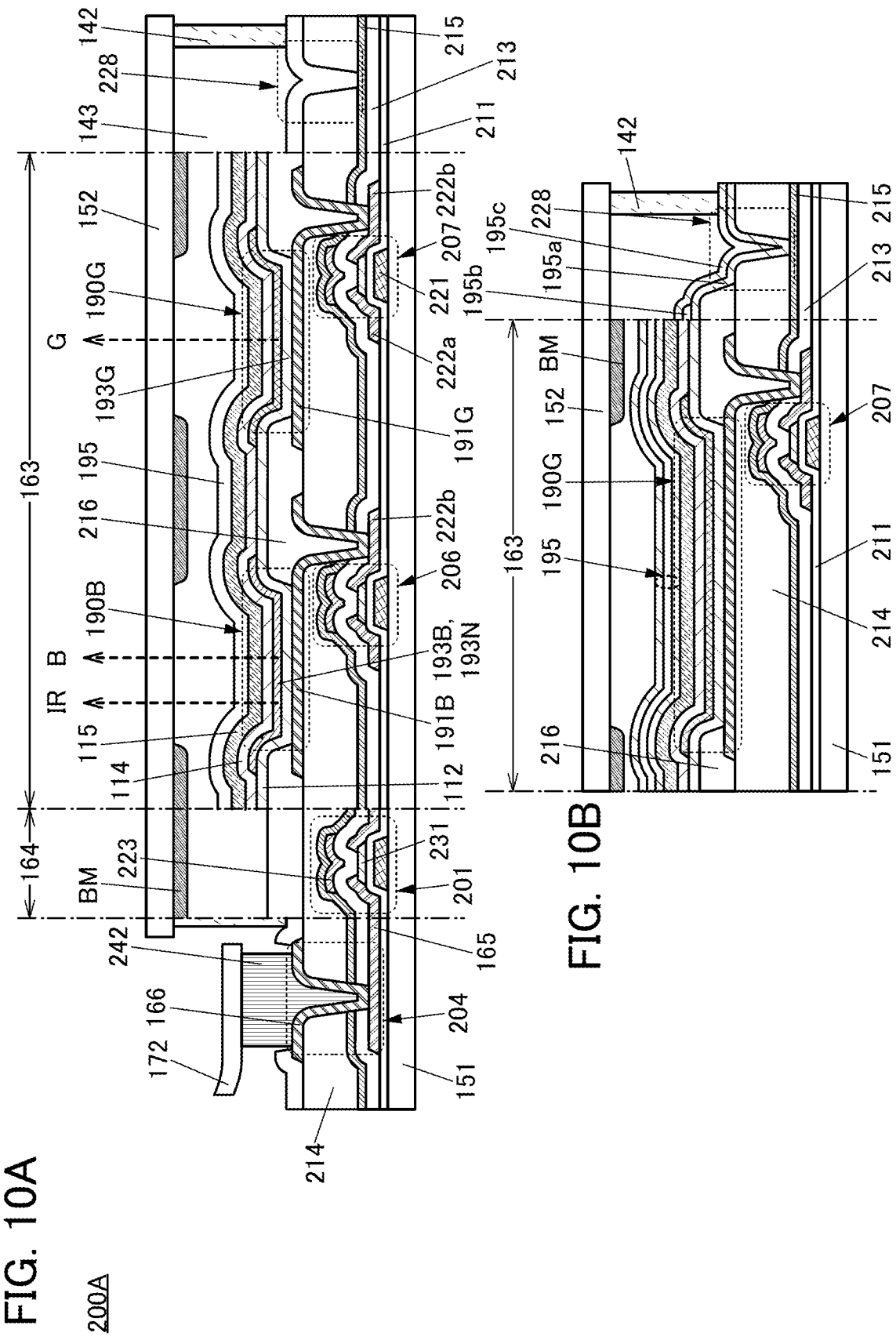

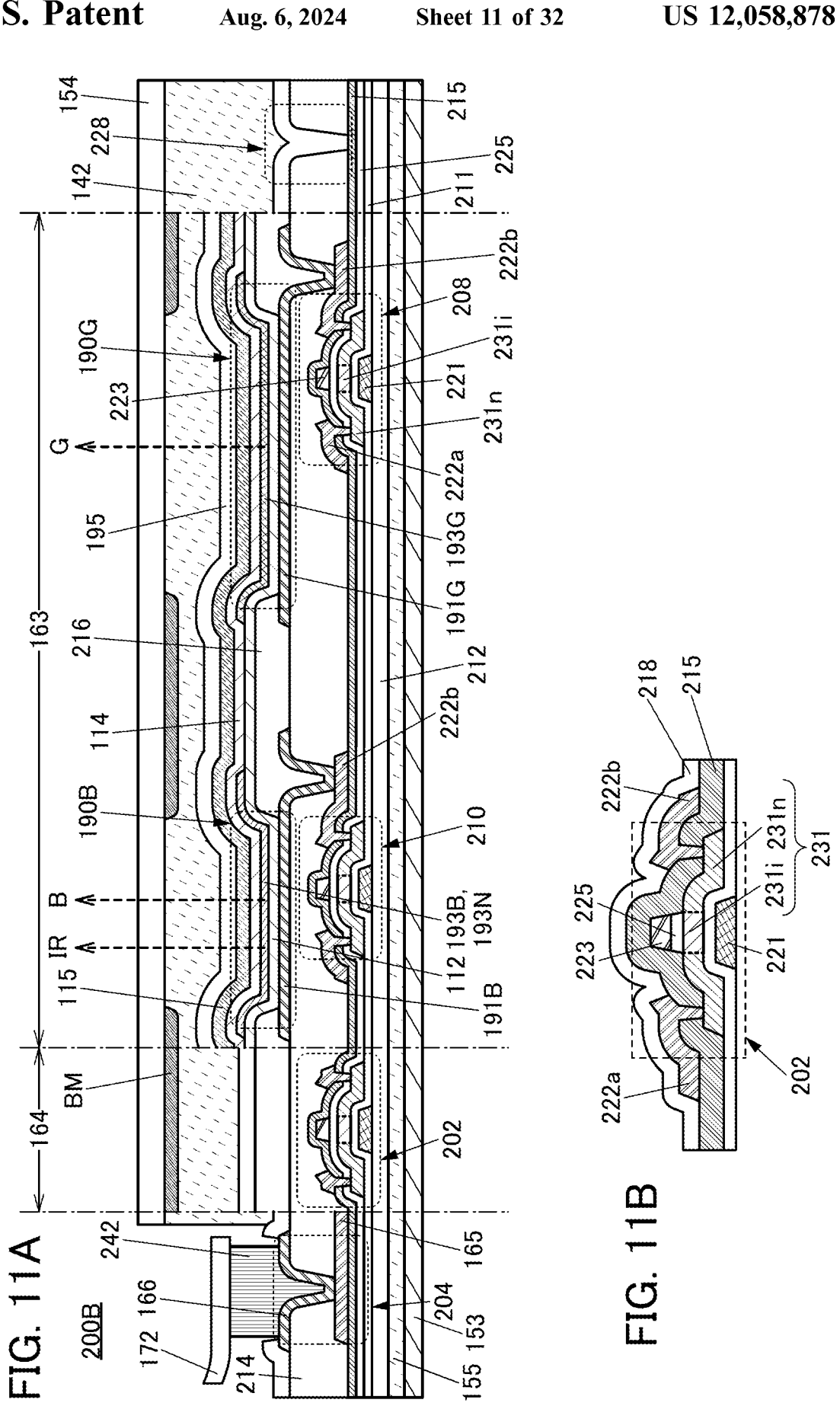

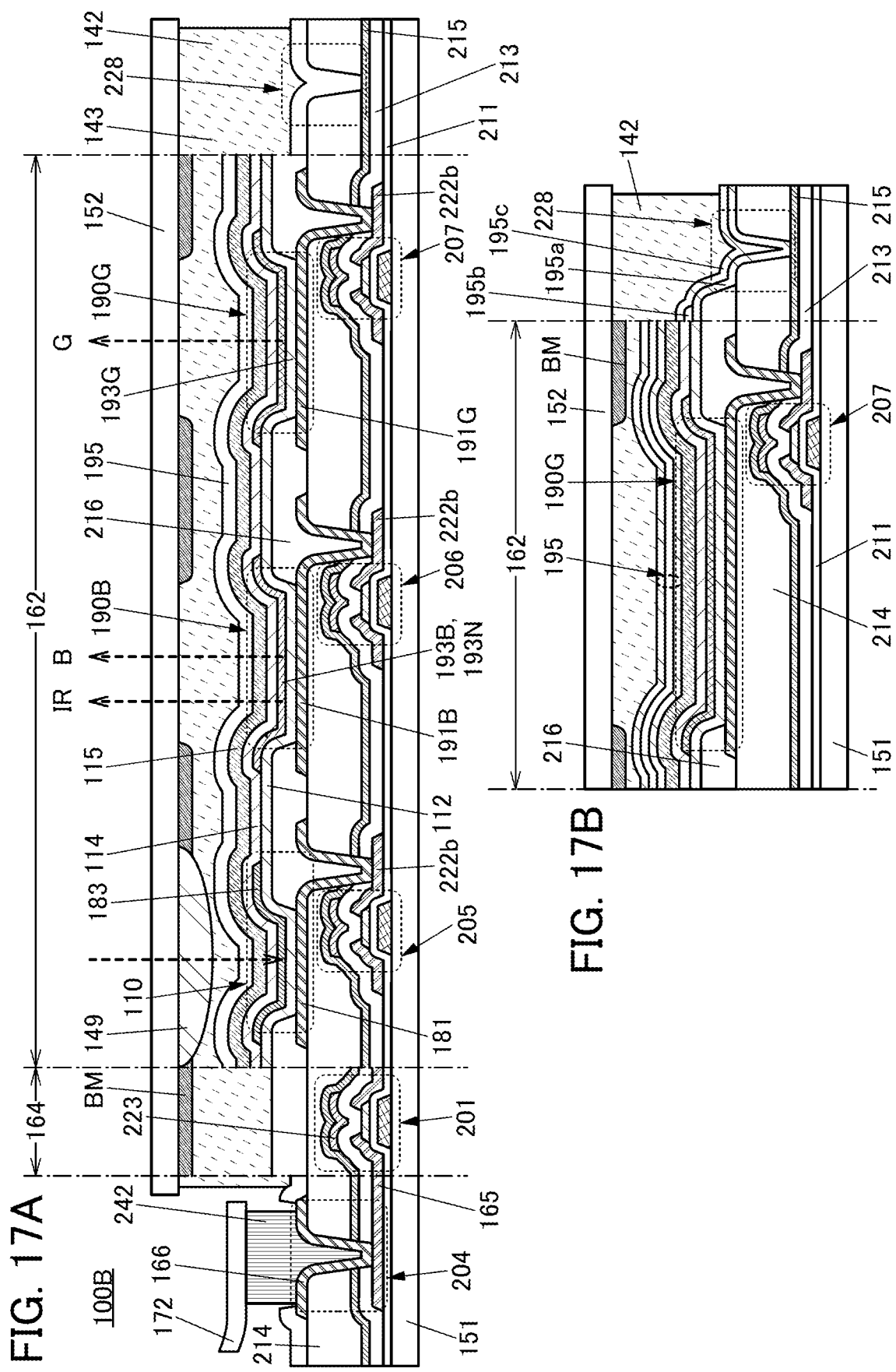

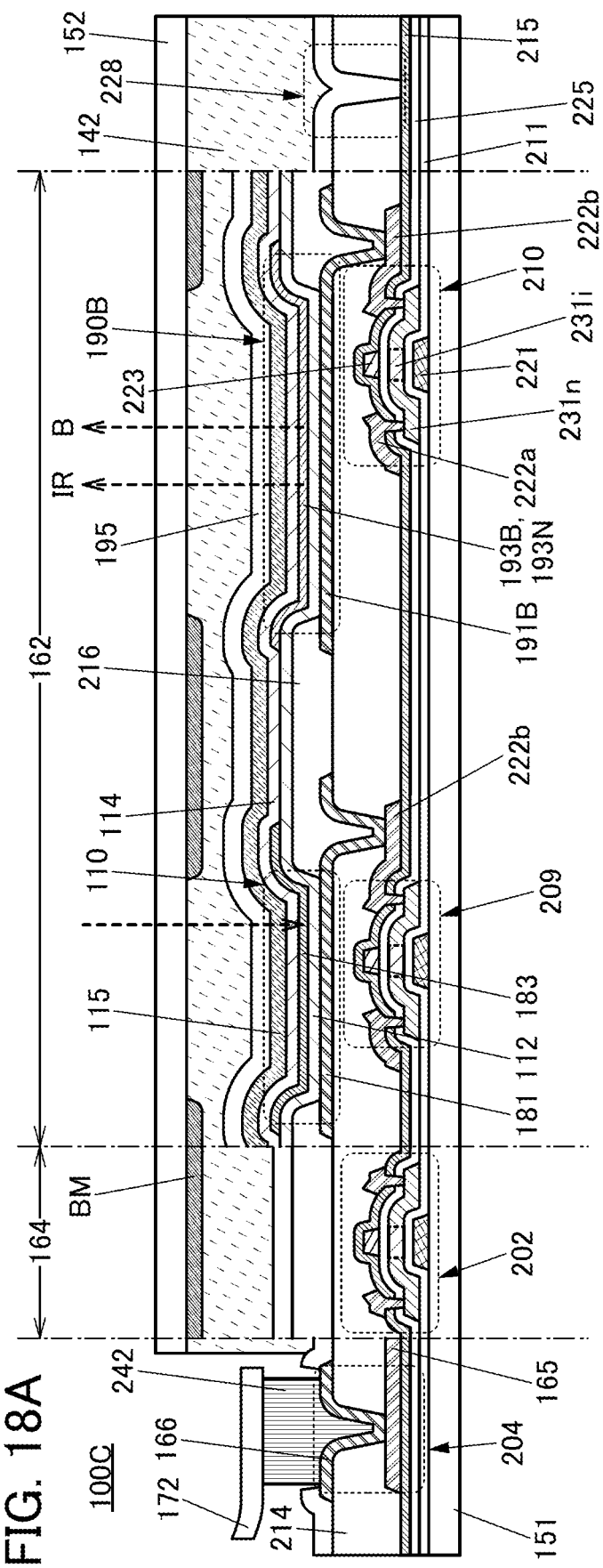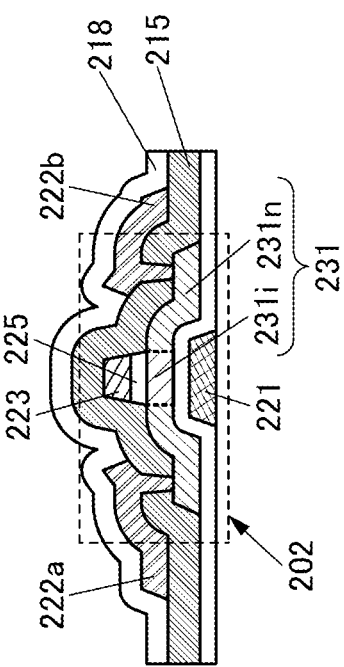

LIGHT-EMITTING DEVICE, LIGHT-EMITTING APPARATUS, LIGHT-EMITTING MODULE, LIGHTING DEVICE, DISPLAY APPARATUS, DISPLAY MODULE, AND ELECTRONIC DEVICE

This application is a 371 of international application PCT/IB2019/060681 filed on Dec. 12, 2019 which is incorporated herein by reference.

TECHNICAL FIELD

One embodiment of the present invention relates to a light-emitting device, a light-emitting apparatus, a light-emitting module, an electronic device, and a lighting device. One embodiment of the present invention relates to a display apparatus, a display module, and an electronic device. One embodiment of the present invention relates to a display apparatus including a light-receiving device and a light-emitting device.

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a driving method thereof, or a manufacturing method thereof.

BACKGROUND ART

In recent years, application of display apparatuses to a variety of uses has been expected. Examples of uses for a large display apparatus include a television device for home use (also referred to as a TV or a television receiver), digital signage, and a PID (Public Information Display). In addition, a smartphone and a tablet terminal including a touch panel are being developed as portable information terminals.

Light-emitting apparatuses including light-emitting devices (also referred to as light-emitting elements) have been developed, for example, as display apparatuses. Light-emitting devices (also referred to as EL devices or EL elements) utilizing an electroluminescence (hereinafter referred to as EL) phenomenon have features such as ease of reduction in thickness and weight, high-speed response to an input signal, and driving with a direct-current low voltage source, and have been used in display apparatuses. For example, Patent Document 1 discloses a flexible light-emitting apparatus including an organic EL device (also referred to as organic EL element).

Image sensors have been used in a variety of applications such as personal authentication, defect analysis, medical diagnosis, and security. The wavelength of light sources used for image sensors is different depending on applications. Light having a variety of wavelengths, for example, light having a short wavelength, such as visible light and X-rays, and light having a long wavelength, such as near-infrared light, is used for image sensors.

Light-emitting devices have been considered to be applied to light sources of image sensors such as the above.

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a light-emitting apparatus having a function of emitting visible light and infrared light. An object of one embodiment of the present invention is to provide a highly convenient light-emitting apparatus. An object of one embodiment of the present invention is to provide a multi-functional light-emitting apparatus. An object of one embodiment of the present invention is to provide a novel light-emitting apparatus.

An object of one embodiment of the present invention is to provide a display apparatus having a light detection function. An object of one embodiment of the present invention is to provide a display apparatus having a function of emitting visible light and infrared light and a light detection function. An object of one embodiment of the present invention is to provide a highly convenient display apparatus. An object of one embodiment of the present invention is to provide a multifunctional display apparatus. An object of one embodiment of the present invention is to provide a novel display apparatus.

Note that the description of these objects does not preclude the existence of other objects. One embodiment of the present invention does not need to achieve all the objects. Other objects can be derived from the descriptions of the specification, the drawings, and the claims.

Means for Solving the Problems

One embodiment of the present invention is a light-emitting apparatus including a first light-emitting device and a second light-emitting device. The first light-emitting device includes a first pixel electrode, a first light-emitting layer, a second light-emitting layer, and a common electrode. The first light-emitting layer and the second light-emitting layer are each positioned between the first pixel electrode and the common electrode. The second light-emitting device includes a second pixel electrode, a third light-emitting layer, and the common electrode. The third light-emitting layer is positioned between the second pixel electrode and the common electrode. The first light-emitting layer includes a light-emitting material emitting infrared light. The second light-emitting layer and the third light-emitting layer include light-emitting materials emitting visible light with different wavelengths.

In the case where the first pixel electrode has a function of reflecting visible light and infrared light, the common electrode has a function of transmitting visible light and infrared light, and the second light-emitting layer includes a light-emitting material emitting blue light, for example, the first light-emitting layer is preferably positioned between the first pixel electrode and the second light-emitting layer. That is, in the case where light emitted from the first light-emitting device is extracted to the common electrode side, the first light-emitting layer is preferably positioned between the first pixel electrode and the second light-emitting layer.

In the case where the first light-emitting layer emits light with a peak wavelength of $\lambda_a$ and the second light-emitting layer emits light with a peak wavelength of $\lambda_b$, a light-emitting region of the first light-emitting layer is preferably positioned to have an optical distance from the first pixel electrode of $\lambda_a/4$ or the neighborhood thereof, and a light-emitting region of the second light-emitting layer is preferably positioned to have an optical distance from the first pixel electrode of $3\lambda_b/4$ or the neighborhood thereof.

It is preferable that the first light-emitting device further include one or both of a hole-transport layer and an electron-transport layer. In the case where the first light-emitting layer emits light with a peak wavelength of $\lambda_a$ and the second light-emitting layer emits light with a peak wavelength of $\lambda_b$, an ordinary ray refractive index of the hole-transport layer with respect to light with a wavelength of $\lambda_b$ is preferably 0.1 or more higher than an ordinary ray refractive index of the hole-transport layer with respect to light with a wavelength of $\lambda_a$. Furthermore, an ordinary ray refractive index of the electron-transport layer with respect to light with a wavelength of $\lambda_b$ is preferably 0.1 or more higher than an ordinary ray refractive index of the electron-transport layer with respect to light with a wavelength of $\lambda_a$.

In the case where the first pixel electrode has a function of transmitting visible light and infrared light, the common electrode has a function of reflecting visible light and infrared light, and the second light-emitting layer includes a light-emitting material emitting blue light, for example, the second light-emitting layer is preferably positioned between the first pixel electrode and the first light-emitting layer. That is, in the case where light emitted from the first light-emitting device is extracted to the first pixel electrode side, the second light-emitting layer is preferably positioned between the first pixel electrode and the first light-emitting layer.

In the case where the first light-emitting layer emits light with a peak wavelength of $\lambda_a$ and the second light-emitting layer emits light with a peak wavelength of $\lambda_b$, a light-emitting region of the first light-emitting layer is preferably positioned to have an optical distance from the first pixel electrode of $3\lambda_a/4$ or the neighborhood thereof, and a light-emitting region of the second light-emitting layer is preferably positioned to have an optical distance from the first pixel electrode of $\lambda_b/4$ or the neighborhood thereof.

The first light-emitting device preferably has a function of emitting both visible light and infrared light, and the second light-emitting device preferably has a function of emitting visible light.

The first light-emitting device preferably includes a charge generation layer positioned between the first light-emitting layer and the second light-emitting layer.

It is preferable that the first light-emitting device and the second light-emitting device each have a micro optical resonator structure. The micro optical resonator structure of the first light-emitting device is preferably configured to intensify both red, green, or blue light and infrared light. The micro optical resonator structure of the second light-emitting device is preferably configured to intensify red, green, or blue light.

It is preferable that the light-emitting apparatus of one embodiment of the present invention further include a third light-emitting device. The third light-emitting device includes a third pixel electrode, the first light-emitting layer, the second light-emitting layer, and the common electrode. It is preferable that the first light-emitting device and the third light-emitting device each have a micro optical resonator structure. The micro optical resonator structure of the first light-emitting device is preferably configured to intensify infrared light. The micro optical resonator structure of the third light-emitting device is preferably configured to intensify red, green, or blue light.

It is preferable that the first light-emitting device and the second light-emitting device further include a common layer. The common layer preferably includes a region positioned between the first pixel electrode and the common electrode and a region positioned between the second pixel electrode and the common electrode.

One embodiment of the present invention is a light-emitting device including a first electrode, a first light-emitting layer, a second light-emitting layer, and a second electrode, and having a function of emitting both infrared light and visible light. The first light-emitting layer and the second light-emitting layer are each positioned between the first electrode and the second electrode. The first light-emitting layer includes a light-emitting material emitting infrared light. The second light-emitting layer includes a light-emitting material emitting visible light.

In the case where the first electrode has a function of reflecting visible light and infrared light and the second electrode has a function of transmitting visible light and infrared light, the first light-emitting layer is preferably positioned between the first electrode and the second light-emitting layer. At this time, the second light-emitting layer preferably includes a light-emitting material emitting blue light.

In the case where the first light-emitting layer emits light with a peak wavelength of $\lambda_a$ and the second light-emitting layer emits light with a peak wavelength of $\lambda_b$, a light-emitting region of the first light-emitting layer is preferably positioned to have an optical distance from the first electrode of $\lambda_a/4$ or the neighborhood thereof, and a light-emitting region of the second light-emitting layer is preferably positioned to have an optical distance from the first electrode of $3\lambda_b/4$ or the neighborhood thereof.

It is preferable that the light-emitting device of one embodiment of the present invention further include one or both of a hole-transport layer and an electron-transport layer. In the case where the first light-emitting layer emits light with a peak wavelength of $\lambda_a$ and the second light-emitting layer emits light with a peak wavelength of $\lambda_b$, an ordinary ray refractive index of the hole-transport layer with respect to light with a wavelength of $\lambda_b$ is preferably 0.1 or more higher than an ordinary ray refractive index of the hole-transport layer with respect to light with a wavelength of $\lambda_a$. Furthermore, an ordinary ray refractive index of the electron-transport layer with respect to light with a wavelength of $\lambda_b$ is preferably 0.1 or more higher than an ordinary ray refractive index of the electron-transport layer with respect to light with a wavelength of $\lambda_a$.

In the case where the first electrode has a function of reflecting visible light and infrared light and the second electrode has a function of transmitting visible light and infrared light, the second light-emitting layer is preferably positioned between the first electrode and the first light-emitting layer.

It is preferable that the light-emitting device of one embodiment of the present invention further include a charge generation layer positioned between the first light-emitting layer and the second light-emitting layer.

The light-emitting device of one embodiment of the present invention preferably has a micro optical resonator structure configured to intensify both red, green, or blue light and infrared light.

One embodiment of the present invention is a light-emitting apparatus including the light-emitting device with the above structure in a light-emitting portion.

One embodiment of the present invention is a display apparatus including a first light-emitting device, a second light-emitting device, and a light-receiving device in a display portion. The first light-emitting device has a function of emitting both visible light and infrared light. The second light-emitting device has a function of emitting visible light. The light-receiving device has a function of absorbing at least part of visible light and infrared light. The first light-emitting device includes a first pixel electrode, a first light-emitting layer, a second light-emitting layer, and a common electrode. The first light-emitting layer and the second light-emitting layer are each positioned between the first pixel electrode and the common electrode. The second light-emitting device includes a second pixel electrode, a third light-emitting layer, and the common electrode. The third light-emitting layer is positioned between the second pixel electrode and the common electrode. The light-receiving device includes a third pixel electrode, an active layer, and the common electrode. The active layer is positioned between the third pixel electrode and the common electrode. The first light-emitting layer includes a light-emitting material emitting infrared light. The second light-emitting layer and the third light-emitting layer include light-emitting materials emitting visible light with different wavelengths. The active layer includes an organic compound.

One embodiment of the present invention is a display apparatus including a first light-emitting device, a second light-emitting device, and a light-receiving device in a display portion. The first light-emitting device has a function of emitting both visible light and infrared light. The second light-emitting device has a function of emitting visible light. The light-receiving device has a function of absorbing at least part of visible light and infrared light. The first light-emitting device includes a first pixel electrode, a common layer, a first light-emitting layer, a second light-emitting layer, and a common electrode. The first light-emitting layer and the second light-emitting layer are each positioned between the first pixel electrode and the common electrode. The second light-emitting device includes a second pixel electrode, the common layer, a third light-emitting layer, and the common electrode. The third light-emitting layer is positioned between the second pixel electrode and the common electrode. The light-receiving device includes a third pixel electrode, the common layer, an active layer, and the common electrode. The active layer is positioned between the third pixel electrode and the common electrode. The first light-emitting layer includes a light-emitting material emitting infrared light. The second light-emitting layer and the third light-emitting layer include light-emitting materials emitting visible light with different wavelengths. The active layer includes an organic compound. The common layer includes a region positioned between the first pixel electrode and the common electrode, a region positioned between the second pixel electrode and the common electrode, and a region positioned between the third pixel electrode and the common electrode.

Preferred structures for the first light-emitting device and the second light-emitting device of the display apparatus are similar to the structures of the first light-emitting device and the second light-emitting device of the aforementioned light-emitting apparatus.

It is preferable that the display portion further include a third light-emitting device. The third light-emitting device includes a fourth pixel electrode, the first light-emitting layer, the second light-emitting layer, and the common electrode. It is preferable that the first light-emitting device and the third light-emitting device each have a micro optical resonator structure. The micro optical resonator structure of the first light-emitting device is preferably configured to intensify infrared light. The micro optical resonator structure of the third light-emitting device is preferably configured to intensify red, green, or blue light.

It is preferable that the display portion further include a lens. The lens preferably includes a portion overlapping with the light-receiving device. Light passing through the lens enters the light-receiving device.

It is preferable that the display portion further include a bank. The bank preferably covers an end portion of the first pixel electrode, an end portion of the second pixel electrode, and an end portion of the third pixel electrode. The bank preferably electrically insulates the third pixel electrode from each of the first pixel electrode and the second pixel electrode. The bank preferably has a function of absorbing at least part of light emitted by the first light-emitting device.

It is preferable that the display portion further include a colored layer. The colored layer preferably includes a portion in contact with a side surface of the bank. The colored layer preferably includes a color filter or a black matrix.

The display portion preferably has flexibility.

One embodiment of the present invention is a module including the light-emitting apparatus or the display apparatus having any of the above structures. Examples of the module include a module provided with a connector such as a flexible printed circuit (hereinafter referred to as FPC) or a TCP (Tape Carrier Package), a module on which an integrated circuit (IC) is implemented by a COG (Chip On Glass) method, a COF (Chip On Film) method, and the like. Note that in this specification and the like, a module including a light-emitting apparatus is referred to as a light-emitting module and a module including a display apparatus is referred to as a display module in some cases.

One embodiment of the present invention is an electronic device including the above module and at least one of an antenna, a battery, a housing, a camera, a speaker, a microphone, and an operation button.

Effect of the Invention

According to one embodiment of the present invention, a light-emitting apparatus having a function of emitting visible light and infrared light can be provided. According to one embodiment of the present invention, a highly convenient light-emitting apparatus can be provided. According to one embodiment of the present invention, a multifunctional light-emitting apparatus can be provided. According to one embodiment of the present invention, a novel light-emitting apparatus can be provided.

According to one embodiment of the present invention, a display apparatus having a light detection function can be provided. According to one embodiment of the present invention, a display apparatus having a function of emitting visible light and infrared light and a light detection function can be provided. According to one embodiment of the present invention, a highly convenient display apparatus can be provided. According to one embodiment of the present invention, a multifunctional display apparatus can be provided. According to one embodiment of the present invention, a novel display apparatus can be provided.

Note that the description of the effects does not preclude the existence of other effects. One embodiment of the present invention does not need to have all the effects. Other

BRIEF DESCRIPTION OF THE DRAWINGS

FIG. 3A to FIG. 3D are drawings illustrating stacked-layer structures of light-emitting devices.

FIG. 4A to FIG. 4D are drawings illustrating stacked-layer structures of light-emitting devices.

FIG. 10A and FIG. 10B are cross-sectional views showing light-emitting apparatus examples.

FIG. 11A is a cross-sectional view showing a light-emitting apparatus example. FIG. 11B is a cross-sectional view showing a transistor example.

FIG. 17A and FIG. 17B are cross-sectional views showing display apparatus examples.

FIG. 18A is a cross-sectional view showing a display apparatus example. FIG. 18B is a cross-sectional view showing a transistor example.

MODE FOR CARRYING OUT THE INVENTION

Figure 1A:
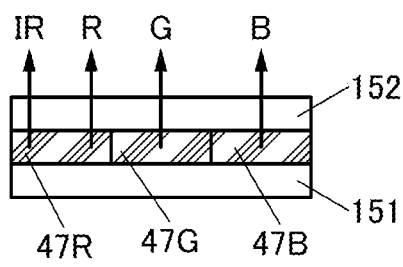
FIG. 1A to FIG. 1F are cross-sectional views showing light-emitting apparatus examples.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, a light-emitting apparatus of one embodiment of the present invention will be described with reference to FIG. 1 to FIG. 11.

The light-emitting apparatus of one embodiment of the present invention includes a light-emitting device emitting visible light and infrared light and a light-emitting device emitting visible light. Examples of visible light include light with wavelengths of greater than or equal to 400 nm and less than 750 nm such as red, green, or blue light. Examples of infrared light include near-infrared light, and specifically, light with wavelengths of greater than or equal to 750 nm and less than or equal to 1300 nm can be given as an example.

The light-emitting apparatus of one embodiment of the present invention includes a first light-emitting device and a second light-emitting device. The first light-emitting device includes a first pixel electrode, a first light-emitting layer, a second light-emitting layer, and a common electrode. The first light-emitting layer and the second light-emitting layer are each positioned between the first pixel electrode and the common electrode. The second light-emitting device includes a second pixel electrode, a third light-emitting layer, and the common electrode. The third light-emitting layer is positioned between the second pixel electrode and the common electrode. The first light-emitting layer includes a light-emitting material emitting infrared light. The second light-emitting layer and the third light-emitting layer include light-emitting materials emitting visible light with different wavelengths.

The light-emitting material included in the first light-emitting layer preferably emits light with a maximum peak wavelength (which can also be rephrased as a wavelength at which the peak intensity is the highest) of greater than or equal to 750 nm and less than or equal to 1300 nm. The light-emitting materials included in the second light-emitting layer and the third light-emitting layer each preferably emit light with a maximum peak wavelength of greater than or equal to 400 nm and less than or equal to 750 nm. Note that a simple term "peak wavelength" in this specification and the like can be replaced with "maximum peak wavelength".

The light-emitting apparatus of one embodiment of the present invention can be used as a light source of a sensor (e.g., an image sensor or an optical touch sensor). The light-emitting apparatus of one embodiment of the present invention can emit both visible light and infrared light and thus can be combined with any of a sensor using visible light for a light source and a sensor using infrared light for a light source, which is highly convenient. The light-emitting apparatus of one embodiment of the present invention can also be used as a light source of a sensor using both visible light and infrared light for the light source, which can increase the functionality of the sensor. In addition, since the light-emitting apparatus of one embodiment of the present invention can emit visible light, it can be used as a display apparatus.

In the light-emitting apparatus of one embodiment of the present invention, one subpixel can be configured to emit both visible light and infrared light. For example, any of three subpixels respectively exhibiting red, green, and blue can be configured to emit infrared light. When the subpixel emitting visible light doubles as a subpixel emitting infrared light, the necessity of providing a separate subpixel emitting infrared light is eliminated. Accordingly, the light-emitting apparatus can be configured to emit both visible light and infrared light without increasing the number of subpixels included in one pixel. This can inhibit a decrease in the aperture ratio of the pixel and can increase the emission efficiency of the light-emitting apparatus.

In addition, the light-emitting apparatus of one embodiment of the present invention can include a layer shared by the light-emitting device emitting visible light and infrared light and the light-emitting device emitting visible light. Thus, a function of emitting infrared light can be added to the light-emitting apparatus, without considerably increasing the number of the manufacturing steps. For example, at least one of a hole-injection layer, a hole-transport layer, an electron-transport layer, and an electron-injection layer can be shared by the light-emitting device emitting visible light and infrared light and the light-emitting device emitting visible light.

FIG. 1A to FIG. 1F are cross-sectional views of light-emitting apparatuses of embodiments of the present invention.

A light-emitting apparatus 40A to a light-emitting apparatus 40F shown in FIG. 1A to FIG. 1F each emit red (R) light, green (G) light, blue (B) light, and infrared light (IR).

The light-emitting apparatus 40A to the light-emitting apparatus 40F each have a structure in which a light-emitting device emitting any one of red light, green light, and blue light can also emit infrared light.

The light-emitting apparatus of one embodiment of the present invention can have any of the following structures: a top emission structure in which light is emitted in a direction opposite to the substrate where the light-emitting device is formed, a bottom emission structure in which light is emitted toward the substrate where the light-emitting device is formed, and a dual emission structure in which light is emitted toward both surfaces.

FIG. 1A to FIG. 1F each illustrate the light-emitting apparatus whose light-emitting device emits light toward a substrate 152.

The light-emitting apparatus 40A shown in FIG. 1A includes a light-emitting device 47R, a light-emitting device 47G, and a light-emitting device 47B between a substrate 151 and the substrate 152.

Figure 1B:
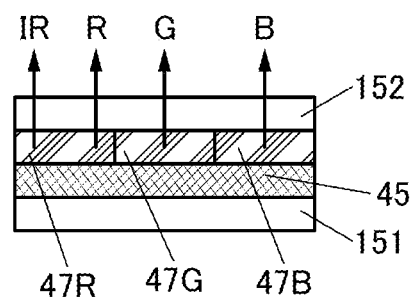

The light-emitting apparatus 40B shown in FIG. 1B includes a layer 45 including transistors between the substrate 151 and the substrate 152, as well as the components of the light-emitting apparatus 40A.

In the light-emitting apparatus 40A and the light-emitting apparatus 40B, the light-emitting device 47R can emit both red (R) light and infrared light (IR), the light-emitting device 47G can emit green (G) light, and the light-emitting device 47B can emit blue (B) light.

Figure 1C:
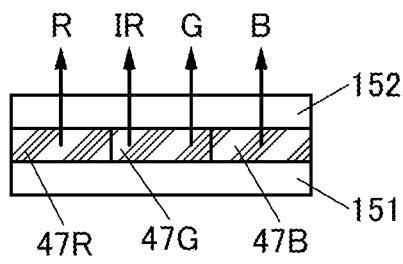

The light-emitting apparatus 40C shown in FIG. 1C includes the light-emitting device 47R, the light-emitting device 47G, and the light-emitting device 47B between the substrate 151 and the substrate 152.

Figure 1D:
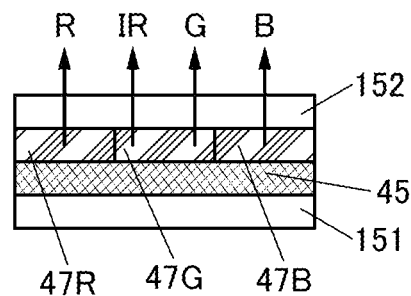

The light-emitting apparatus 40D shown in FIG. 1D includes the layer 45 including transistors between the substrate 151 and the substrate 152, as well as the components of the light-emitting apparatus 40C.

In the light-emitting apparatus 40C and the light-emitting apparatus 40D, the light-emitting device 47G can emit both green (G) light and infrared light (IR), the light-emitting device 47R can emit red (R) light, and the light-emitting device 47B can emit blue (B) light.

Figure 1E:
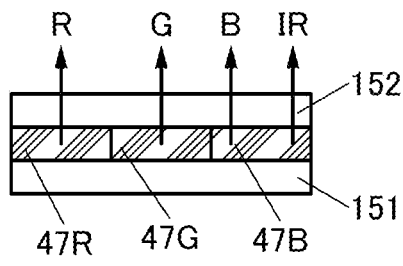

The light-emitting apparatus 40E shown in FIG. 1E includes the light-emitting device 47R, the light-emitting device 47G, and the light-emitting device 47B between the substrate 151 and the substrate 152.

Figure 1F:
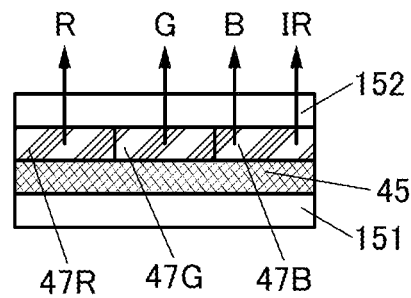

The light-emitting apparatus 40F shown in FIG. 1F includes the layer 45 including transistors between the substrate 151 and the substrate 152, as well as the components of the light-emitting apparatus 40E.

In the light-emitting apparatus 40E and the light-emitting apparatus 40F, the light-emitting device 47B can emit both blue (B) light and infrared light (IR), the light-emitting device 47R can emit red (R) light, and the light-emitting device 47G can emit green (G) light.

The layer 45 including transistors includes a plurality of transistors. The layer 45 including transistors includes a transistor electrically connected to the light-emitting device, for example.

The maximum peak wavelength (also referred to as first peak wavelength) in the visible light region of an emission spectrum of the light-emitting device 47B can be, for example, greater than or equal to 400 nm and less than or equal to 480 nm.

The maximum peak wavelength (also referred to as second peak wavelength) in the visible light region of an emission spectrum of the light-emitting device 47R can be, for example, greater than or equal to 580 nm and less than 750 nm.

The maximum peak wavelength (also referred to as third peak wavelength) in the visible light region of an emission spectrum of the light-emitting device 47G can be a wavelength between the first peak wavelength and the second peak wavelength. For example, the third peak wavelength can be greater than or equal to 480 nm and less than 580 nm.

The maximum peak wavelength (also referred to as fourth peak wavelength) in the infrared region of the emission spectrum of the light-emitting device emitting infrared light can be longer than the second peak wavelength. For example, the fourth peak wavelength can be greater than or equal to 750 nm and less than or equal to 1300 nm.

[Pixel]

FIG. 2A to FIG. 2E show pixel structure examples.

Each of the light-emitting apparatuses of embodiments of the present invention includes a plurality of pixels arranged in a matrix. One pixel includes at least one subpixel. One subpixel includes one light-emitting device. For example, the pixel can include three subpixels (e.g., three colors of R, G, and B or three colors of yellow (Y), cyan (C), and magenta (M)) or four subpixels (e.g., four colors of R, G, B, and white (W) or four colors of R, G, B, and Y).

In the light-emitting apparatus of one embodiment of the present invention, at least one of these subpixels constituting the pixel emits infrared light as well as visible light.

Figure 2A:
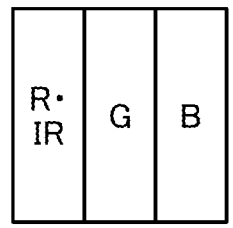
FIG. 2A to FIG. 2E are top views showing pixel examples.
Figure 2B:
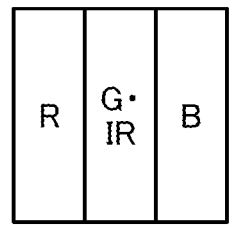
Figure 2C:
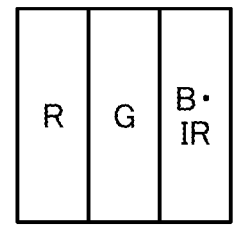

The pixels shown in FIG. 2A to FIG. 2C each include subpixels of three colors (three light-emitting devices) of red (R), green (G), and blue (B). FIG. 2A shows a structure in which the red (R) subpixel emits infrared light (IR); FIG. 2B, a structure in which the green (G) subpixel emits infrared light (IR); and FIG. 2C, a structure in which the blue (B) subpixel emits infrared light (IR).

Figure 2D:
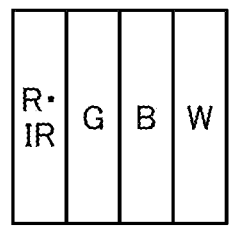
Figure 2E:
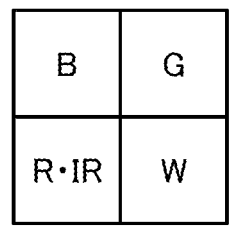

The pixels shown in FIG. 2D and FIG. 2E each include subpixels of four colors (four light-emitting devices) of red (R), green (G), blue (B), and white (W). Although FIG. 2D and FIG. 2E show a structure in which the red (R) subpixel emits infrared light (IR), one embodiment of the present invention is not limited thereto and the subpixel of any of the other colors may emit infrared light. FIG. 2D shows an example in which four subpixels are arranged in a row and FIG. 2E shows an example in which four subpixels are arranged in a matrix of 2×2.

[Structure of Light-Emitting Device]

The structures of the light-emitting devices included in the light-emitting apparatus of one embodiment of the present invention will be described below with reference to FIG. 3 to FIG. 5.

In this specification and the like, unless otherwise specified, in describing a structure including a plurality of components (e.g., light-emitting devices or light-emitting layers), alphabets are not added when a common part of the components is described. For example, when a common part of a light-emitting layer 193R, a light-emitting layer 193G, and the like is described, the light-emitting layers are referred to as the light-emitting layer 193 in some cases.

Light-emitting apparatuses shown in FIG. 3A to FIG. 3D and FIG. 4A to FIG. 4D each include, over the substrate 151, the light-emitting device 47R emitting red (R) light, the light-emitting device 47G emitting green (G) light, and the light-emitting device 47B emitting blue (B) light, with the layer 45 including transistors being positioned between the substrate 151 and the light-emitting devices. At least one of the three light-emitting devices has a function of emitting infrared light. In FIG. 3A to FIG. 3D and FIG. 4A to FIG. 4D, the light-emitting device emitting infrared light is denoted with a reference numeral accompanied by "(IR)".

The light-emitting device of each color includes a pixel electrode 191, a common electrode 115, and at least one light-emitting unit. The pixel electrode 191 is provided in each light-emitting device. The common electrode 115 is shared by the light-emitting devices. The pixel electrode 191 and the common electrode 115 may each have a single-layer structure or a stacked-layer structure. The light-emitting unit includes at least one light-emitting layer 193.

FIG. 3A to FIG. 3D and FIG. 4A to FIG. 4D each show the top emission light-emitting apparatus in which the light-emitting devices are formed over the substrate 151 and the light-emitting devices emit light toward the common electrode 115. The common electrode 115 is an electrode with properties of transmitting visible light and infrared light (also referred to as transparent electrode) or an electrode with properties of transmitting and reflecting visible light and infrared light (also referred to as semi-transmissive and semi-reflective electrode). The pixel electrode 191 is preferably an electrode with properties of reflecting visible light and infrared light (also referred to as reflective electrode).

The light-emitting device may have a single structure in which one light-emitting unit is provided between the pixel electrode 191 and the common electrode 115, or a tandem structure in which a plurality of light-emitting units are provided between the electrodes.

A light-emitting device emitting visible light and not emitting infrared light preferably has a single structure to improve productivity. The light-emitting device emitting both visible light and infrared light also preferably has a single structure to improve productivity. The light-emitting device emitting both visible light and infrared light preferably has a tandem structure to bring advantages such as facilitated optimization of the optical distance and increased emission intensity.

FIG. 3A to FIG. 3D each show an example in which the light-emitting device of each color has a single structure.

FIG. 3A and FIG. 3B each show a structure in which the light-emitting device 47B(IR) emits blue light and infrared light.

The light-emitting device 47R shown in FIG. 3A includes a buffer layer 192R, the light-emitting layer 193R, and a buffer layer 194R in this order between the pixel electrode 191 and the common electrode 115. The light-emitting layer 193R includes a light-emitting material emitting red light.

The light-emitting device 47G shown in FIG. 3A includes a buffer layer 192G, the light-emitting layer 193G, and a buffer layer 194G in this order between the pixel electrode 191 and the common electrode 115. The light-emitting layer 193G includes a light-emitting material emitting green light.

The light-emitting device 47B(IR) shown in FIG. 3A includes a buffer layer 192B, a light-emitting layer 193N, a light-emitting layer 193B, and a buffer layer 194B in this order between the pixel electrode 191 and the common electrode 115. The light-emitting layer 193N includes a light-emitting material emitting infrared light. The light-emitting layer 193B includes a light-emitting material emitting blue light.

Although described later in detail, in the light-emitting device 47B(IR), the light-emitting layer 193N is preferably positioned closer to the reflective electrode (the pixel electrode 191 in FIG. 3A) than the light-emitting layer 193B is. Providing the light-emitting layer 193N between the reflective electrode and the light-emitting layer 193B and placing the light-emitting layer 193B away from the reflective electrode can increase the efficiency of extracting blue light.

In addition to the light-emitting layer 193, the light-emitting unit may further include a layer containing a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), or the like. Such a layer may vary from the light-emitting device of one color to that of another.

For example, the buffer layer 192 provided between the pixel electrode 191 and the light-emitting layer 193 in the light-emitting device of each color preferably includes one or both of a hole-injection layer and a hole-transport layer. Furthermore, the buffer layer 194 provided between the light-emitting layer 193 and the common electrode 115 in the light-emitting device of each color preferably includes one or both of an electron-transport layer and an electron-injection layer. The buffer layers 192R, 192G, 192B, 194R, 194G, and 194B may each have a single-layer structure or a stacked-layer structure.

The light-emitting apparatus shown in FIG. 3B is different from the light-emitting apparatus shown in FIG. 3A in including a common layer 112 instead of the buffer layers 192R, 192G, and 192B and including a common layer 114 instead of the buffer layers 194R, 194G, and 194B.

The common layer 112 preferably includes one or both of a hole-injection layer and a hole-transport layer. The common layer 114 preferably includes one or both of an electron-transport layer and an electron-injection layer. The common layers 112 and 114 may each have a single-layer structure or a stacked-layer structure.

At least one of the layers other than the light-emitting layer 193 can be shared by the light-emitting devices of the respective colors. This is preferable because the number of the manufacturing steps of the light-emitting apparatus can be reduced.

FIG. 3C and FIG. 3D each show a structure in which the light-emitting device 47R(IR) emits red light and infrared light.

The light-emitting device 47R(IR) shown in FIG. 3C and FIG. 3D includes the common layer 112, the buffer layer 192R, the light-emitting layer 193R, the light-emitting layer 193N, the buffer layer 194R, and the common layer 114 between the pixel electrode 191 and the common electrode 115. The light-emitting layer 193R includes a light-emitting material emitting red light. The light-emitting layer 193N includes a light-emitting material emitting infrared light.

The light-emitting device 47R(IR) shown in FIG. 3C includes the light-emitting layer 193R between the pixel electrode 191 and the light-emitting layer 193N. Meanwhile, the light-emitting device 47R(IR) shown in FIG. 3D includes the light-emitting layer 193N between the pixel electrode 191 and the light-emitting layer 193R. The stacking order of the light-emitting layer 193R and the light-emitting layer 193N is not particularly limited.

The light-emitting device 47G shown in FIG. 3C and FIG. 3D includes the common layer 112, the buffer layer 192G, the light-emitting layer 193G, the buffer layer 194G, and the common layer 114 in this order between the pixel electrode 191 and the common electrode 115. The light-emitting layer 193G includes a light-emitting material emitting green light.

The light-emitting device 47B shown in FIG. 3C and FIG. 3D includes the common layer 112, the buffer layer 192B, the light-emitting layer 193B, the buffer layer 194B, and the common layer 114 in this order between the pixel electrode 191 and the common electrode 115. The light-emitting layer 193B includes a light-emitting material emitting blue light.

As shown in FIG. 3C and FIG. 3D, some of the layers (buffer layers) other than the light-emitting layer 193 are separately formed for each color and others (common layers) are shared in the light-emitting devices of the respective colors. Some of the layers other than the light-emitting layer 193 are preferably shared by the light-emitting devices of the respective colors in this manner, in which case the number of the manufacturing steps of the light-emitting apparatus can be reduced. Note that some of the buffer layers 192R, 192G, 192B, 194R, 194G, and 194B and the common layers 112 and 114 are not necessarily included in the light-emitting apparatus of one embodiment of the present invention.

For example, it is preferable that in FIG. 3C and FIG. 3D, the common layer 112 include a hole-injection layer, the buffer layers 192R, 192G, and 192B include a hole-transport layer, the buffer layers 194R, 194G, and 194B include an electron-transport layer, and the common layer 114 include an electron-injection layer.

FIG. 4A to FIG. 4C each show an example in which the light-emitting device emitting infrared light has a tandem structure and the other light-emitting devices have a single structure.

FIG. 4A is different from FIG. 3A in that an intermediate layer 198 is provided between the light-emitting layer 193N and the light-emitting layer 193B. In a similar manner, FIG. 4B is different from FIG. 3B in that the intermediate layer 198 is provided between the light-emitting layer 193N and the light-emitting layer 193B. FIG. 4C is different from FIG. 3C in that the intermediate layer 198 is provided between the light-emitting layer 193N and the light-emitting layer 193R.

The intermediate layer 198 includes at least a charge generation layer. The charge generation layer is positioned between two light-emitting units. The charge generation layer has a function of injecting electrons into one of the light-emitting units adjacent to each other and injecting holes into the other of the light-emitting units when voltage is applied between a pair of electrodes. The intermediate layer 198 may further include a layer containing a substance with a high hole-injection property, a substance with a high hole-transport property, a hole-blocking material, a substance with a high electron-transport property, a substance with a high electron-injection property, a substance with a bipolar property, or the like.

In the case of a single structure in which the light-emitting layer emitting infrared light (the light-emitting layer 193N) and the light-emitting layer emitting visible light (the light-emitting layer 193B, the light-emitting layer 193G, or the light-emitting layer 193R) are included in one light-emitting unit, excitons are shared by the two light-emitting layers, leading to lower emission intensity of visible light and infrared light. The emission intensity of visible light and infrared light can be increased when the light-emitting device has a tandem structure in which the light-emitting unit including the light-emitting layer 193N and the light-emitting unit including the light-emitting layer 193B or the light-emitting layer 193R are separate as shown in FIG. 4A to FIG. 4C.

Also in the case where the light-emitting device emitting both visible light and infrared light has a tandem structure, some of the layers other than the light-emitting layers can be shared with the other light-emitting devices.

For example, the light-emitting device 47B(IR) shown in FIG. 4B includes the common layer 112 between the pixel electrode 191 and the lower light-emitting layer 193N, and the common layer 114 between the common electrode 115 and the upper light-emitting layer 193B. The common layer 112 and the common layer 114 are shared with the other light-emitting devices.

Furthermore, the light-emitting device 47R(IR) shown in FIG. 4C includes the common layer 112 and the buffer layer 192R between the pixel electrode 191 and the lower light-emitting layer 193N, and the common layer 114 and the buffer layer 194R between the common electrode 115 and the upper light-emitting layer 193B. The common layer 112 and the common layer 114 are shared with the other light-emitting devices, and the buffer layer 192R and the buffer layer 194R are formed separately from those of the other light-emitting devices.

The light-emitting apparatus shown in FIG. 4D is different from the light-emitting apparatus shown in FIG. 3A in including a buffer layer 116 over the common electrode 115. Examples of the buffer layer 116 include an organic film, a semiconductor film, and an inorganic insulating film. In the light-emitting apparatus shown in FIG. 4D, light emission from the light-emitting devices is extracted toward the buffer layer 116; thus, the buffer layer 116 preferably has a function of transmitting visible light and infrared light. In this manner, light absorption by the buffer layer 116 can be inhibited and the light extraction efficiency of the light-emitting devices can be increased. Examples of the organic film include a layer which can be used for a light-emitting device and which includes a substance with a high hole-injection property, a substance with a high hole-transport property, a hole-blocking material, a substance with a high electron-transport property, a substance with a high electron-injection property, a bipolar substance, or the like. Examples of the semiconductor film include a semiconductor film transmitting visible light and infrared light. Examples of the inorganic insulating film include a silicon nitride film. The buffer layer 116 preferably has a passivation function. In that case, entry of impurities such as moisture into the light-emitting devices can be inhibited. Furthermore, providing the buffer layer 116 can reduce loss of optical energy due to surface plasmon at the common electrode 115 in the case where the common electrode 115 has a function of reflecting visible light and infrared light.

The light-emitting devices preferably employ a microcavity structure. Therefore, one of the pair of electrodes of the light-emitting devices is preferably an electrode having properties of transmitting and reflecting visible light and infrared light (a semi-transmissive and semi-reflective electrode), and the other is preferably an electrode having a property of reflecting visible light and infrared light (a reflective electrode).

The light transmittance of the electrode with a light-transmitting property is 40% or more. For example, the light-emitting devices preferably include an electrode whose visible light (light with wavelengths of greater than or equal to 400 nm and less than 750 nm) transmittance and near-infrared light (light with wavelengths of greater than or equal to 750 nm and less than or equal to 1300 nm) transmittance are each 40% or more. The visible light reflectance and near-infrared light reflectance of the semi-transmissive and semi-reflective electrode are each higher than or equal to 10% and lower than or equal to 95%, preferably higher than or equal to 30% and lower than or equal to 80%. The visible light reflectance and near-infrared light reflectance of the reflective electrode are higher than or equal to 40% and lower than or equal to 100%, preferably higher than or equal to 70% and lower than or equal to 100%. These electrodes preferably have a resistivity of less than or equal to $1 \times 10^{-2}$ Ωcm.

Described below as an example is a top emission light-emitting device in which a reflective electrode is used as the pixel electrode 191 and a semi-transmissive and semi-reflective electrode is used as the common electrode 115. When the light-emitting device has a microcavity structure, light emission obtained from the light-emitting layer 193 can be resonated between the electrodes, whereby light emitted through the common electrode 115 can be intensified.

Note that the light-emitting device may have a structure in which light is emitted toward the pixel electrode 191 (bottom emission). Specifically, light can be emitted toward the pixel electrode 191 when a reflective electrode is used as the common electrode 115 and an electrode transmitting visible light and infrared light (also referred to as transparent electrode) or a semi-transmissive and semi-reflective electrode is used as the pixel electrode 191.

The material, thickness, and the like of the pair of electrodes can be the same between the light-emitting devices of the respective colors. Accordingly, the manufacturing cost of the light-emitting apparatus can be reduced and the manufacturing process of the light-emitting apparatus can be simplified.

The light-emitting devices are formed to have structures according to their respective colors. In the light-emitting device 47R emitting red light, the thickness of the light-emitting unit is preferably adjusted such that the optical distance between the pair of electrodes intensifies red light emission. In a similar manner, in the light-emitting device 47G emitting green light, the thickness of the light-emitting unit is preferably adjusted such that the optical distance between the pair of electrodes intensifies green light emission. Furthermore, in the light-emitting device 47B emitting blue light, the thickness of the light-emitting unit is preferably adjusted such that the optical distance between the pair of electrodes intensifies blue light emission. In addition, it is preferable that the optical distance between the pair of electrodes in the light-emitting device emitting infrared light also intensify infrared light emission. In other words, in the light-emitting device emitting both visible light and infrared light, the thickness of the light-emitting unit is preferably adjusted such that the optical distance intensifies both visible light (red, green, or blue) and infrared light. Note that when the semi-transmissive and semi-reflective electrode has a stacked-layer structure of a reflective electrode and a transparent electrode, the optical distance between the pair of electrodes represents the optical distance between a pair of reflective electrodes.

Specifically, the adjustment is preferably performed such that the optical distance between the pixel electrode 191 and the common electrode 115 is $n\lambda/2$ (n is a natural number) or the neighborhood thereof, where λ represents the wavelength of light obtained from the light-emitting layer 193.

Note that in this specification and the like, the wavelength λ of the light obtained from the light-emitting layer 193 can be the peak wavelength (specifically, the maximum peak wavelength) of the light-emitting layer 193. In this specification and the like, the neighborhood of a wavelength X means the range of ±20 nm of X, preferably ±10 nm of X.

A microcavity structure can intensify and extract light whose wavelength is a multiple of the optical distance between the pair of electrodes (including a phase shift due to reflection) divided by an integer. For example, when the optical distance is 500 nm, (500×2/1=) 1000-nm light, (500×2/2=) 500-nm light, (500×2/3=) 333-nm light, (500×2/4=) 250-nm light, or the like can be intensified and extracted. Alternatively, when the optical distance is 500 nm, (500×3/1=) 1500-nm light, (500×3/2=) 750-nm light, (500×3/3=) 500-nm light, (500×3/4=) 375-nm light, or the like can be intensified and extracted.

Thus, employing an optical distance corresponding to a common multiple of visible light and infrared light enables efficient extraction of both visible light and infrared light.

Here, some standards are established as quality indicators for full-color display. For example, the sRGB standard, which is an international standard for color spaces defined by the IEC (International Electrotechnical Commission) to standardize color reproductions different between devices such as displays, printers, digital cameras, and scanners, is widely used. Other standards include the NTSC standard, which is a color gamut standard for analog television systems defined by the National Television System Committee of the United States; the DCI-P3 (Digital Cinema Initiatives) standard, which is an international unified standard for distribution of digital movies (cinema); the standard used for a high-resolution UHDTV (Ultra High Definition Television, or super high vision) defined by NHK; and Recommendation ITU-R BT.2020 (hereinafter referred to as BT.2020). Since R, G, and B wavelengths are determined by values of such standards, the wavelength of infrared light which can be extracted together with visible light is limited.

For example, the wavelengths of light corresponding to R, G, and B defined by BT.2020 and n-th light thereof (n is a natural number) are listed in Table 1.

TABLE 1

| n | 1 | 2 | 3 | 4 | 5 | 6 |
|---|---|---|---|---|---|---|
| R | 630 nm | 1260 nm | 1890 nm | 2520 nm | 3150 nm | 3780 nm |
| G | 532 nm | 1064 nm | 1596 nm | 2128 nm | 2660 nm | 3192 nm |
| B | 467 nm | 934 nm | 1401 nm | 1868 nm | 2335 nm | 2802 nm |

It is possible to estimate, from Table 1, the wavelength of the infrared light which a microcavity structure can intensify and extract together with light of R, G, or B defined by BT.2020. Note that too large an n reduces the light extraction efficiency; thus, it is preferable that n be greater than or equal to 1 and less than or equal to 3, and it is particularly preferable that n be 1 or 2. Accordingly, it is found that examples of the infrared light that can be intensified and extracted together with light of R, G, or B include 934 nm, 1064 nm, and 1260 nm, i.e., the wavelengths corresponding to R, G, and B when n=2; and 798 nm and 945 nm, i.e., the wavelengths of R and G when n=3 that are divided by two.

From the above, it is preferable that n-th light of which color is to be applied be determined as appropriate in accordance with the wavelength of the infrared light to be extracted.

In increasing the light extraction efficiency of the light-emitting device, the optical distance between a region of the light-emitting layer 193 where desired light is obtained (light-emitting region) and an electrode where reflection occurs is important, in addition to the optical distance between the pair of electrodes. Specifically, light can be efficiently extracted when the optical distance between the pixel electrode 191 and the light-emitting region is (2 m'+1)λ/4 or the neighborhood thereof and the optical distance between the common electrode 115 and the light-emitting region is (2M+1)λ/4 or the neighborhood thereof (where m' and M are each independently 0 or a natural number and n=m'+M+1). Here, the light-emitting region refers to a region where holes and electrons are recombined in the light-emitting layer.

Figure 5A:
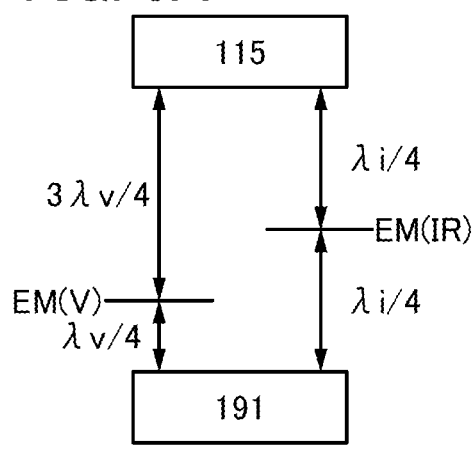
FIG. 5A to FIG. 5D are drawings illustrating positional relationship between light-emitting regions.
Figure 5B:
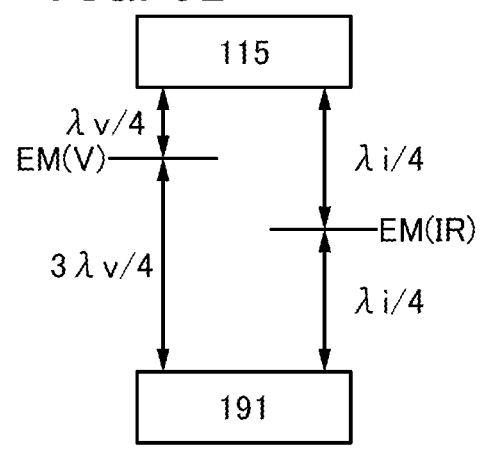

FIG. 5A and FIG. 5B show application examples of secondary light (n=2) of visible light. That is, the infrared light wavelength λi is twice the visible light wavelength λv. The optical distance between the pair of electrodes is λi/2=v. In the case where secondary light of visible light is applied as shown in FIG. 5A and FIG. 5B, there are two combinations of the preferred positions of the light-emitting region for visible light and the light-emitting region for infrared light.

FIG. 5A shows an example in which the optical distance between the pixel electrode 191 and a light-emitting region EM(V) for visible light is λv/4, the optical distance between the common electrode 115 and the light-emitting region EM(V) for visible light is 3λv/4, the optical distance between the pixel electrode 191 and a light-emitting region EM(IR) for infrared light is λi/4, and the optical distance between the common electrode 115 and the light-emitting region EM(IR) for infrared light is λi/4.

FIG. 5B shows an example in which the optical distance between the pixel electrode 191 and the light-emitting region EM(V) for visible light is 3λv/4, the optical distance between the common electrode 115 and the light-emitting region EM(V) for visible light is λv/4, the optical distance between the pixel electrode 191 and the light-emitting region EM(IR) for infrared light is λi/4, and the optical distance between the common electrode 115 and the light-emitting region EM(IR) for infrared light is λi/4.

Here, when a certain metal film (e.g., a metal film containing a noble metal such as silver) is used as the reflective electrode, light extraction efficiency might be decreased by the influence of surface plasmon resonance (SPR). This is because light resonates with specific plasmon oscillation of the metal on a surface of the metal film or its vicinity and light having a wavelength corresponding to the specific oscillation cannot be extracted. The shorter the optical distance between the reflective electrode and the light-emitting region of the light-emitting layer is, the more likely such a phenomenon is to occur. Furthermore, such a phenomenon is likely to occur in a light-emitting device emitting blue light.

It is thus preferable that in the top emission light-emitting device 47B emitting blue light, the optical distance from the pixel electrode 191 to the light-emitting region of the light-emitting layer 193B be adjusted to be (2 m'+1)λ/4 (m' is a natural number) or the neighborhood thereof.

That is, it is preferable that the top emission light-emitting device 47B(IR) emitting blue light and infrared light employ the structure shown in FIG. 5B. In the structure in FIG. 5B, the optical distance from the pixel electrode 191 (reflective electrode) to the light-emitting region of the blue-light-emitting layer 193B can be longer than that in the structure in FIG. 5A, which can suppress the influence of surface plasmon resonance and increase the light extraction efficiency.

In the light-emitting devices 47B(IR) shown in FIG. 3A, FIG. 3B, FIG. 4A, and FIG. 4B, the light-emitting layer 193B is provided over the pixel electrode 191 with the light-emitting layer 193N positioned therebetween. In this manner, the light-emitting layer 193B emitting blue light with a wavelength shorter than that of infrared light is further from the pixel electrode 191 (reflective electrode) than the light-emitting layer 193N emitting infrared light is, whereby extraction efficiency for blue light can be increased.

In contrast, when the light-emitting device has a bottom emission structure, a reflective electrode is used as the common electrode 115. It is thus preferable that in the bottom emission light-emitting device emitting blue light, the optical distance from the common electrode 115 to the light-emitting region of the light-emitting layer 193B be adjusted to be $(2M+1)\lambda/4$ (M is a natural number) or the neighborhood thereof.

That is, it is preferable that the bottom emission light-emitting device emitting blue light and infrared light employ the structure shown in FIG. 5A. In the structure in FIG. 5A, the optical distance from the common electrode 115 (reflective electrode) to the light-emitting region of the blue-light-emitting layer 193B can be longer than that in the structure in FIG. 5B, which can suppress the influence of surface plasmon resonance and increase the light extraction efficiency.

In the bottom emission light-emitting device emitting blue light and infrared light, for example, the light-emitting layer 193N is preferably positioned closer to the reflective electrode (the common electrode 115) than the light-emitting layer 193B is. Providing the light-emitting layer 193N between the reflective electrode and the light-emitting layer 193B and placing the light-emitting layer 193B away from the reflective electrode can increase the efficiency of extracting blue light.

Note that the light-emitting device 47R(IR) emitting red light and infrared light or the light-emitting device 47G(IR) emitting green light and infrared light may employ any of the structures in FIG. 5A and FIG. 5B. Note that for the above reason, a structure preferable for some wavelengths depends on the light extraction direction.

By such optical adjustment, the spectrum of specific monochromatic light obtained from the light-emitting layer 193 can be narrowed and light emission with high color purity can be obtained. In addition, a decrease in light extraction efficiency of the light-emitting device can be inhibited and power consumption of the light-emitting apparatus can be reduced.

Note that to be precise, the optical distance between the pixel electrode 191 and the common electrode 115 is represented by a value obtained by adding a phase shift resulting from reflection to a product of the distance from the reflection surface of the pixel electrode 191 to the reflection surface of the common electrode 115 and a refractive index. However, the reflection surfaces of the pixel electrode 191 and the common electrode 115 and the phase shift are hard to precisely determine. Thus, it is assumed that the above-described effects are sufficiently achievable when freely-selected positions of the pixel electrode 191 and the common electrode 115 are assumed to be the reflection surfaces and the phase shift is freely assumed.

Likewise, to be precise, the optical distance between the pixel electrode 191 and the light-emitting region is represented by a value obtained by adding a phase shift resulting from reflection to a product of the distance from the reflection surface of the pixel electrode 191 to the light-emitting region of the light-emitting layer and a refractive index. However, the reflection surface and the phase shift in the pixel electrode 191 and the light-emitting region of the light-emitting layer are hard to precisely determine. Thus, it is assumed that the above-described effects are sufficiently achievable when a freely-selected position of the pixel electrode 191 is assumed to be the reflection surface, the phase shift is freely assumed, and a freely-selected position of the light-emitting layer is assumed to be the light-emitting region.

For example, the light-emitting region of the light-emitting layer 193 can be assumed to be the surface on the pixel electrode 191 side, the surface on the common electrode 115 side, the center of the light-emitting layer 193, or the like.

In the light-emitting device 47B(IR), the optical distance between the pair of electrodes is preferably adjusted to be the wavelength of blue light emission from the light-emitting layer 193B and to be ½ of the wavelength of infrared light from the light-emitting layer 193N. In the light-emitting device 47R, the optical distance between the pair of electrodes is preferably adjusted to be ½ of the wavelength of red light emission from the light-emitting layer 193R. In the light-emitting device 47G, the optical distance between the pair of electrodes is preferably adjusted to be ½ of the wavelength of green light emission from the light-emitting layer 193G. Such a structure can increase extraction efficiency for light emission of each color.

To manufacture a light-emitting apparatus that includes light-emitting devices for three colors of R, G, and B such that the optical distances between pairs of electrodes for R and G are ½ of the wavelengths of the respective colors and the optical distance between a pair of electrodes for B is the wavelength of blue, layers other than a light-emitting layer also need to be formed separately for R, G, and B, which easily reduces productivity. In the case where layers other than a light-emitting layer are shared by R, G, and B, in terms of improvement of blue light emission efficiency, the layers shared by the three colors are thick and the optical distances between pairs of electrodes for the three colors are the wavelengths of the respective colors.

In contrast, in the structure of one embodiment of the present invention in which the light-emitting device emitting blue light emits infrared light, the thickness of the light-emitting layer or light-emitting unit emitting infrared light can be adjusted so that the optical distance between the pair of electrodes becomes the wavelength of blue. Thus, the layers shared with the light-emitting devices emitting red and green light do not need to be made thick. This enables highly productive manufacture in which the optical distances between the pairs of electrodes for R and G are ½ of the wavelengths of the respective colors and the optical distance between the pair of electrodes for B is the wavelength of blue.

Figure 5C:
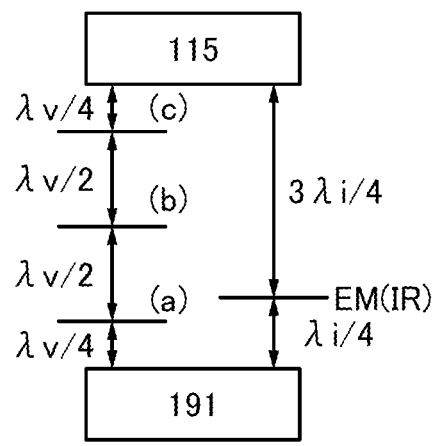
Figure 5D:
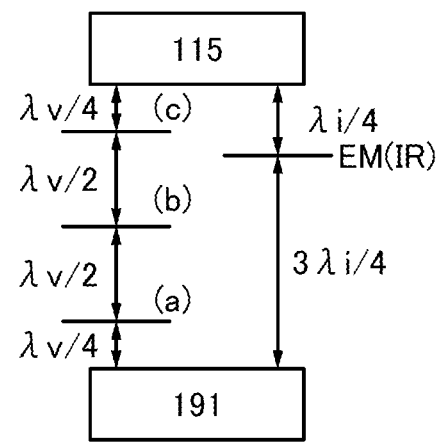

FIG. 5C and FIG. 5D show application examples of tertiary light (n=3) of visible light. The infrared light wavelength Xi is three times the visible light wavelength $\lambda v$ divided by two. The optical distance between the pair of electrodes is $\lambda i = 3\lambda v/2$. In the case where tertiary light of visible light is applied as shown in FIG. 5C and FIG. 5D, there are six combinations of the preferred positions of the light-emitting region for visible light and the light-emitting region for infrared light.

FIG. 5C shows an example in which the optical distance between the pixel electrode 191 and the light-emitting region EM(IR) for infrared light is $\lambda i/4$ and the optical distance between the common electrode 115 and the light-emitting region EM(IR) for infrared light is $3\lambda i/4$.

FIG. 5D shows an example in which the optical distance between the pixel electrode 191 and the light-emitting region EM(IR) for infrared light is $3\lambda i/4$ and the optical distance between the common electrode 115 and the light-emitting region EM(IR) for infrared light is $\lambda i/4$.

At a position (a) of the light-emitting region for visible light shown in FIG. 5C and FIG. 5D, the optical distance between the pixel electrode 191 and the light-emitting region EM(V) for visible light is $\lambda v/4$, and the optical distance between the common electrode 115 and the light-emitting region EM(V) for visible light is $5\lambda v/4$.

At a position (b) of the light-emitting region for visible light shown in FIG. 5C and FIG. 5D, the optical distance between the pixel electrode 191 and the light-emitting region EM(V) for visible light is $3\lambda v/4$, and the optical distance between the common electrode 115 and the light-emitting region EM(V) for visible light is $3\lambda v/4$.

At a position (c) of the light-emitting region for visible light shown in FIG. 5C and FIG. 5D, the optical distance between the pixel electrode 191 and the light-emitting region EM(V) for visible light is $5\lambda v/4$, and the optical distance between the common electrode 115 and the light-emitting region EM(V) for visible light is $\lambda v/4$.

In a tandem structure, the light-emitting layer emitting visible light is preferably distant from the light-emitting layer emitting infrared light; thus, the positions (b) and (c) of the light-emitting region for visible light are preferred in FIG. 5C and the positions (a) and (b) of the light-emitting region for visible light are preferred in FIG. 5D.

In a single structure, the light-emitting layer emitting visible light is preferably close to the light-emitting layer emitting infrared light; thus, the position (a) of the light-emitting region for visible light is preferred in FIG. 5C and the position (c) of the light-emitting region for visible light is preferred in FIG. 5D.

The refractive index of an organic film constituting the light-emitting device has wavelength dependence. The wavelength dependence of the refractive index can be utilized to extract infrared light with a desired wavelength.

The refractive index of the organic film tends to decrease from the visible light wavelength region to the infrared light wavelength region. Such a decreasing refractive index means that the optical path length is different between colors even when the thickness is the same, or specifically, the optical distance is shorter when the wavelength of light is longer. In particular, there is a significant difference between the refractive index for a wavelength of blue light and that for a wavelength of infrared light. For example, the wavelength of infrared light that can be extracted when the secondary light of blue light is applied is sometimes less than twice the wavelength of blue light. The wavelength of the infrared light to be extracted can be controlled by utilizing the wavelength dependence of the refractive index of the organic film. Note that when the film has refractive index anisotropy, the wavelength of the infrared light to be extracted is preferably controlled by utilizing a value of an ordinary ray refractive index.

For example, an ordinary ray refractive index of the hole-transport layer of the light-emitting device with respect to light with the visible light wavelength $\lambda v$ is preferably 0.1 or more, further preferably 0.2 or more higher than an ordinary ray refractive index thereof with respect to light with the infrared light wavelength $\lambda i$. In addition, an ordinary ray refractive index of the electron-transport layer of the light-emitting device with respect to light with the visible light wavelength $\lambda v$ is preferably 0.1 or more, further preferably 0.2 or more higher than an ordinary ray refractive index thereof with respect to light with the infrared light wavelength $\lambda i$. In this manner, the peak wavelength of the infrared light to be extracted can be shifted to the shorter wavelength side.

Modification Example

Figure 6A:
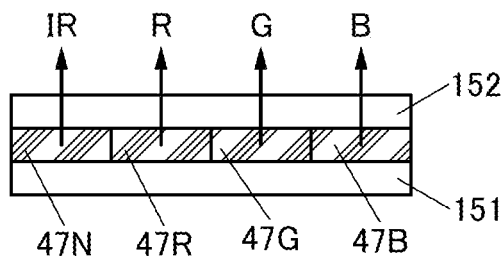
FIG. 6A and FIG. 6B are cross-sectional views showing light-emitting apparatus examples.
Figure 6B:
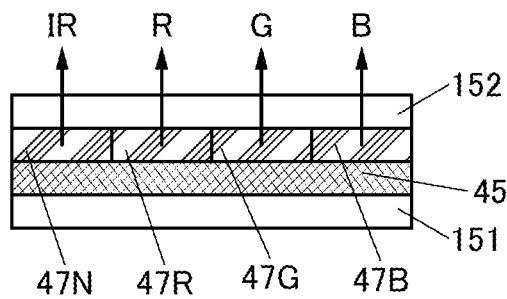

FIG. 6A and FIG. 6B show cross-sectional views of light-emitting apparatuses of embodiments of the present invention.

A light-emitting apparatus 40G and a light-emitting apparatus 40H shown in FIG. 6A and FIG. 6B each emit red (R) light, green (G) light, blue (B) light, and infrared light (IR).

The light-emitting apparatus 40G and the light-emitting apparatus 40H each include light-emitting devices from which red light, green light, and blue light are extracted and a separate light-emitting device from which infrared light is extracted.

The light-emitting apparatus 40G shown in FIG. 6A includes the light-emitting device 47R, the light-emitting device 47G, the light-emitting device 47B, and a light-emitting device 47N between the substrate 151 and the substrate 152.

The light-emitting apparatus 40H shown in FIG. 6B includes the layer 45 including transistors between the substrate 151 and the substrate 152, as well as the components of the light-emitting apparatus 40G.

In the light-emitting apparatus 40G and the light-emitting apparatus 40H, the light-emitting device 47R can emit red (R) light, the light-emitting device 47G can emit green (G) light, the light-emitting device 47B can emit blue (B) light, and the light-emitting device 47N can emit infrared light (IR).

Figure 6C:
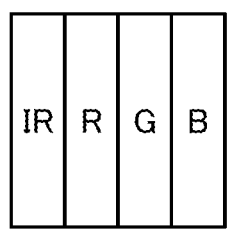
FIG. 6C and FIG. 6D are top views showing pixel examples.
Figure 6D:
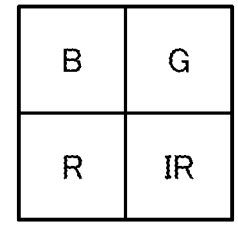

FIG. 6C and FIG. 6D show pixel structure examples. The pixels shown in FIG. 6C and FIG. 6D each include four subpixels (four light-emitting devices) for red (R), green (G), blue (B), and infrared light. FIG. 6C shows an example in which four subpixels are arranged in a row and FIG. 6D shows an example in which four subpixels are arranged in a matrix of 2×2.

Figure 6E:
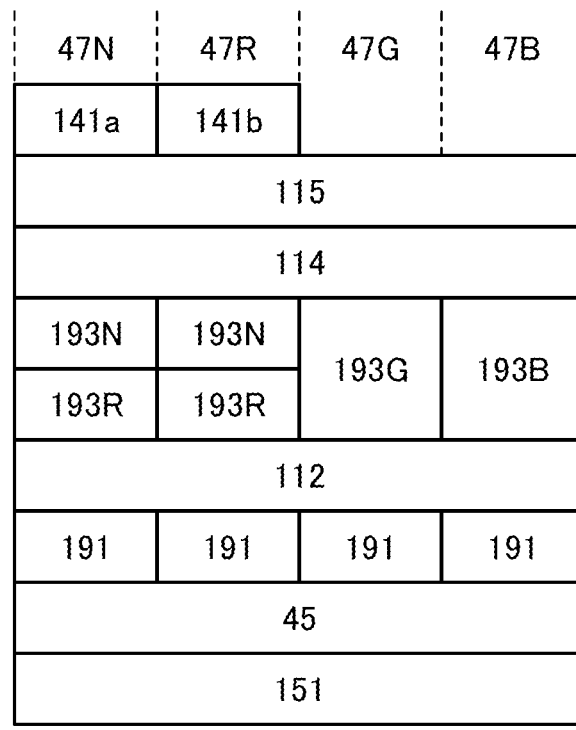
FIG. 6E is a drawing illustrating a stacked-layer structure of light-emitting devices.

FIG. 6E shows a structure example of light-emitting devices included in the light-emitting apparatus of one embodiment of the present invention.

The light-emitting apparatus shown in FIG. 6E includes, over the substrate 151, the light-emitting device 47R emitting red (R) light, the light-emitting device 47G emitting green (G) light, the light-emitting device 47B emitting blue (B) light, and the light-emitting device 47N emitting infrared light (IR), with the layer 45 including transistors being positioned between the substrate 151 and the light-emitting devices.

The light-emitting device 47R emitting red light and the light-emitting device 47N emitting infrared light in FIG. 6E can have the same structure between the pair of electrodes. Here, both the light-emitting device 47R and the light-emitting device 47N have a structure emitting red light and infrared light. In the light-emitting device 47N, a filter 141a provided over the common electrode 115 blocks red light, whereby only infrared light is extracted to the outside. In the light-emitting device 47R, a filter 141b provided over the common electrode 115 blocks infrared light, whereby only red light is extracted to the outside.

Note that in the light-emitting device 47R and the light-emitting device 47N both of which include the light-emitting layer 193R and the light-emitting layer 193N, the thicknesses of the light-emitting units may be adjusted such that only red or infrared light can be extracted.

When the light-emitting device emitting visible light and the light-emitting device emitting infrared light have a common structure as described above, a subpixel emitting infrared light can be provided without a considerable increase in the number of the manufacturing steps of the light-emitting apparatus.

A structure of the light-emitting apparatus of one embodiment of the present invention will be described below with reference to FIG. 7 and FIG. 8. The light-emitting devices emitting light of G and B out of the light-emitting devices for three colors of R, G, and B will be mainly described below. The structure of the light-emitting device emitting light of R can be similar to that of the light-emitting device emitting light of G.

[Light-Emitting Apparatus 30A]

Figure 7A:
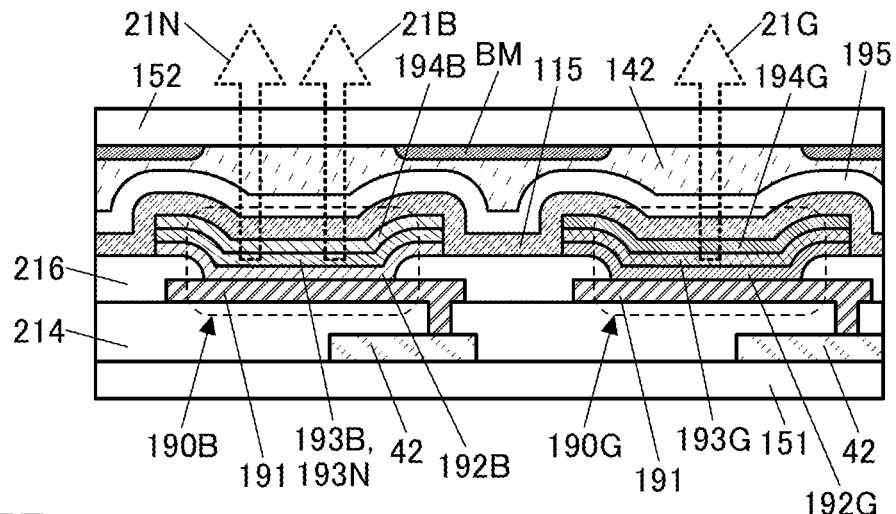
FIG. 7A to FIG. 7C are cross-sectional views showing light-emitting apparatus examples.

FIG. 7A shows a cross-sectional view of a light-emitting apparatus 30A.

The light-emitting apparatus 30A includes a light-emitting device 190B and a light-emitting device 190G. The light-emitting device 190B has a function of emitting blue light 21B and infrared light 21N. The light-emitting device 190G has a function of emitting green light 21G.

The light-emitting device 190B includes the pixel electrode 191, the buffer layer 192B, the light-emitting layer 193B, the light-emitting layer 193N, the buffer layer 194B, and the common electrode 115. Note that although the light-emitting layer 193B and the light-emitting layer 193N are described as one layer in FIG. 7A and the like, the light-emitting layer 193B and the light-emitting layer 193N are preferably separate layers. Since the light-emitting device 190B has a top emission structure, it is preferable that the light-emitting layer 193N be provided between the pixel electrode 191 and the light-emitting layer 193B as described above.

The light-emitting device 190G includes the pixel electrode 191, the buffer layer 192G, the light-emitting layer 193G, the buffer layer 194G, and the common electrode 115.

The pixel electrode 191, the buffer layer 192B, the buffer layer 192G, the light-emitting layer 193B, the light-emitting layer 193N, the light-emitting layer 193G, the buffer layer 194B, the buffer layer 194G, and the common electrode 115 may each have a single-layer structure or a stacked-layer structure.

The pixel electrode 191 is positioned over an insulating layer 214. The pixel electrodes 191 included in the light-emitting devices can be formed using the same material in the same step.

In the light-emitting apparatus 30A, layers other than the light-emitting layers in the light-emitting devices are separately formed for each color. Specifically, the light-emitting device 190B and the light-emitting device 190G do not share any layer between the pair of electrodes (the pixel electrode 191 and the common electrode 115) in this example.

The light-emitting device 190B and the light-emitting device 190G can be manufactured in the following manner: two pixel electrodes 191 are formed over the insulating layer 214 using the same material in the same step; the buffer layer 192B, the light-emitting layer 193N, the light-emitting layer 193B, and the buffer layer 194B are formed over one pixel electrode 191; the buffer layer 192G, the light-emitting layer 193G, and the buffer layer 194G are formed over the other pixel electrode 191; and then, the common electrode 115 is formed to cover the two pixel electrodes 191, the buffer layer 192B, the light-emitting layer 193N, the light-emitting layer 193B, the buffer layer 194B, the buffer layer 192G, the light-emitting layer 193G, and the buffer layer 194G. Note that the manufacturing order of the stacked-layer structure of the buffer layer 192B, the light-emitting layer 193N, the light-emitting layer 193B, and the buffer layer 194B and the stacked-layer structure of the buffer layer 192G, the light-emitting layer 193G, and the buffer layer 194G is not particularly limited. For example, deposition of the buffer layer 192B, the light-emitting layer 193N, the light-emitting layer 193B, and the buffer layer 194B may be followed by formation of the buffer layer 192G, the light-emitting layer 193G, and the buffer layer 194G. Conversely, formation of the buffer layer 192G, the light-emitting layer 193G, and the buffer layer 194G may be followed by deposition of the buffer layer 192B, the light-emitting layer 193N, the light-emitting layer 193B, and the buffer layer 194B. Alternatively, deposition may be performed alternately, in which case the buffer layer 192B, the buffer layer 192G, and the light-emitting layer 193N are deposited in this order, for example.

As each of the buffer layer 192B and the buffer layer 192G, one or both of a hole-injection layer and a hole-transport layer can be formed, for example.

The light-emitting layer 193B and the light-emitting layer 193N overlap with the pixel electrode 191 with the buffer layer 192B positioned therebetween. The light-emitting layer 193B and the light-emitting layer 193N overlap with the common electrode 115 with the buffer layer 194B positioned therebetween. The light-emitting layer 193B includes a light-emitting material emitting blue light. The light-emitting layer 193N includes a light-emitting material emitting infrared light.

The light-emitting layer 193G overlaps with the pixel electrode 191 with the buffer layer 192G positioned therebetween. The light-emitting layer 193G overlaps with the common electrode 115 with the buffer layer 194G positioned therebetween. The light-emitting layer 193G includes a light-emitting material emitting green light.

As each of the buffer layer 194B and the buffer layer 194G, one or both of an electron-injection layer and an electron-transport layer can be formed, for example.

The common electrode 115 includes a portion overlapping with the pixel electrode 191 with the buffer layer 192B, the light-emitting layer 193B, the light-emitting layer 193N, and the buffer layer 194B positioned therebetween. The common electrode 115 further includes a portion overlapping with the pixel electrode 191 with the buffer layer 192G, the light-emitting layer 193G, and the buffer layer 194G positioned therebetween. The common electrode 115 is a layer shared by the light-emitting device 190B and the light-emitting device 190G.

The light-emitting apparatus 30A includes the light-emitting device 190B, the light-emitting device 190G, a transistor 42, and the like between a pair of substrates (the substrate 151 and the substrate 152).

A light-blocking layer BM is preferably provided on a surface of the substrate 152 on the substrate 151 side. The light-blocking layer BM has openings at positions overlapping with the light-emitting devices.

Figure 7B:
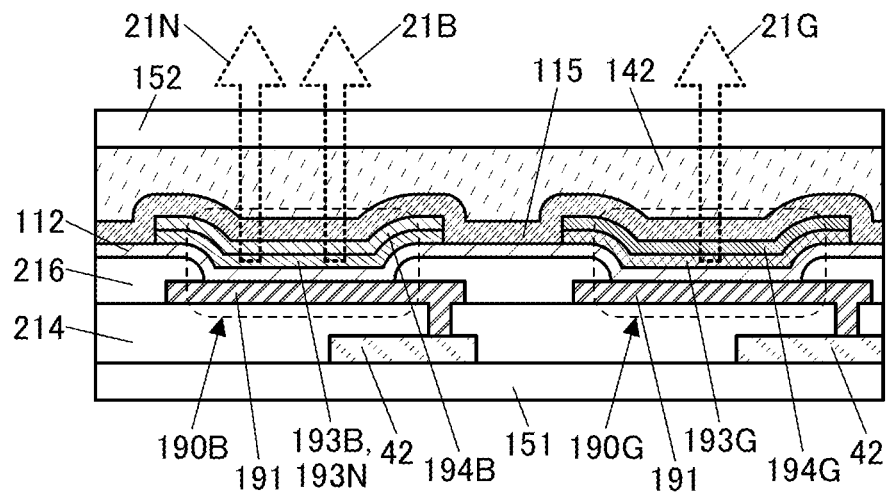

Note that the light-blocking layer BM may be absent as illustrated in FIG. 7B.

For the light-blocking layer BM, a material that blocks light emitted from the light-emitting device 190 can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a stacked-layer structure of a red color filter, a green color filter, and a blue color filter.

The buffer layer 192, the light-emitting layer 193, and the buffer layer 194, which are positioned between the pixel electrode 191 and the common electrode 115 in the light-emitting device 190 for each color, can each be referred to as an EL layer.

The pixel electrode 191 preferably has a function of reflecting visible light and infrared light. An end portion of the pixel electrode 191 is covered with a bank 216. The common electrode 115 has a function of transmitting visible light and infrared light. The light-emitting device 190 is an electroluminescent device that emits light toward the substrate 152 (see the light 21B, the light 21G, and the infrared light 21N) by voltage applied between the pixel electrode 191 and the common electrode 115.

The pixel electrode 191 is electrically connected to a source or a drain of the transistor 42 through an opening provided in the insulating layer 214. The end portion of the pixel electrode 191 is covered with the bank 216. The transistor 42 has a function of controlling the driving of the light-emitting device 190.

The light-emitting device 190 is preferably covered with a protective layer 195. In FIG. 7A, the protective layer 195 is provided on and in contact with the common electrode 115. With the protective layer 195, entry of impurities such as water into the light-emitting device 190 can be inhibited, leading to an increase in the reliability of the light-emitting device 190. The protective layer 195 and the substrate 152 are attached to each other with an adhesive layer 142. Note that the protective layer 195 may include the buffer layer 116 or may double as the buffer layer 116. Alternatively, the protective layer 195 may be provided over the common electrode 115 with the buffer layer 116 positioned therebetween.

Note that as shown in FIG. 7B, the protective layer is not necessarily provided over the light-emitting device 190. In FIG. 7B, the common electrode 115 and the substrate 152 are attached to each other with the adhesive layer 142.

[Light-Emitting Apparatus 30B]

FIG. 7B shows a cross-sectional view of a light-emitting apparatus 30B. Note that in the description of the light-emitting apparatus below, components similar to those of the above-described light-emitting apparatus are not described in some cases.

The light-emitting apparatus 30B is different from the light-emitting apparatus 30A in that the light-emitting apparatus 30B includes neither the buffer layer 192B nor the buffer layer 192G but includes the common layer 112.

The common layer 112 is positioned over the pixel electrode 191. The common layer 112 is a layer shared by the light-emitting device 190B and the light-emitting device 190G.

As the common layer 112, one or both of a hole-injection layer and a hole-transport layer can be formed, for example. The common layer 112 may have a single-layer structure or a stacked-layer structure.

At least one of the layers other than the light-emitting layers is preferably shared regardless of the color of the light-emitting device, in which case the number of steps of manufacturing the light-emitting apparatus can be reduced.

[Light-Emitting Apparatus 30C]

Figure 7C:
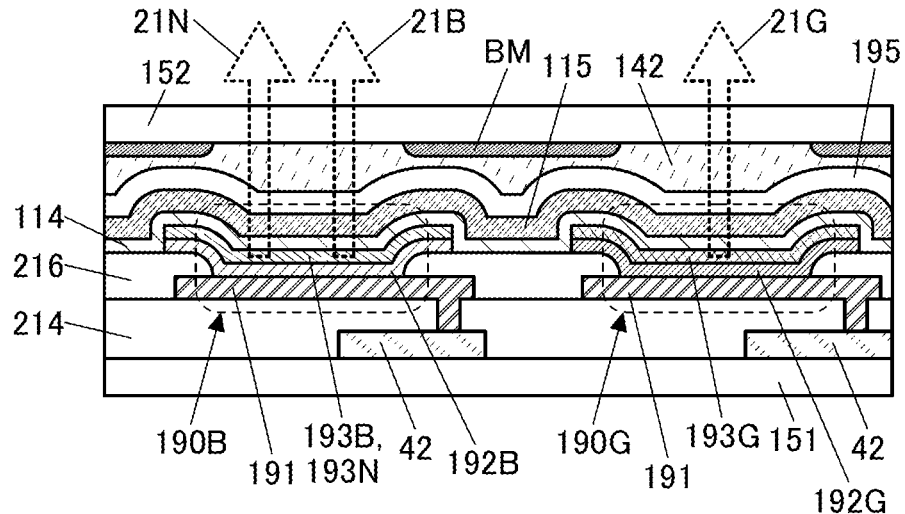

FIG. 7C shows a cross-sectional view of a light-emitting apparatus 30C.

The light-emitting apparatus 30C is different from the light-emitting apparatus 30A in that the light-emitting apparatus 30C includes neither the buffer layer 194B nor the buffer layer 194G but includes the common layer 114.

The common layer 114 is positioned over the bank 216, the light-emitting layer 193B, the light-emitting layer 193N, and the light-emitting layer 193G. The common layer 114 is a layer shared by the light-emitting device 190B and the light-emitting device 190G.

As the common layer 114, one or both of an electron-injection layer and an electron-transport layer can be formed, for example. The common layer 114 may have a single-layer structure or a stacked-layer structure.

At least one of the layers other than the light-emitting layers is preferably shared regardless of the color of the light-emitting device, in which case the number of steps of manufacturing the light-emitting apparatus can be reduced.

[Light-Emitting Apparatus 30D]

Figure 8A:
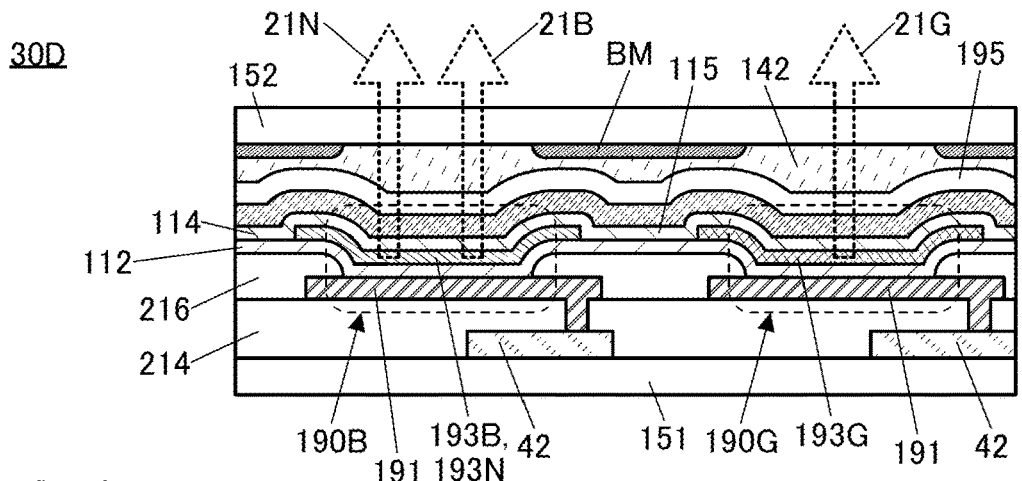
FIG. 8A to FIG. 8C are cross-sectional views showing light-emitting apparatus examples.

FIG. 8A shows a cross-sectional view of a light-emitting apparatus 30D.

The light-emitting apparatus 30D is different from the light-emitting apparatus 30A in that the light-emitting apparatus 30D does not include the buffer layer 192B, the buffer layer 192G, the buffer layer 194B, and the buffer layer 194G and includes the common layer 112 and the common layer 114.

All the layers other than the light-emitting layers are preferably shared regardless of the color of the light-emitting device, in which case the number of steps of manufacturing the light-emitting apparatus can be further reduced.

[Light-Emitting Apparatus 30E]

Figure 8B:
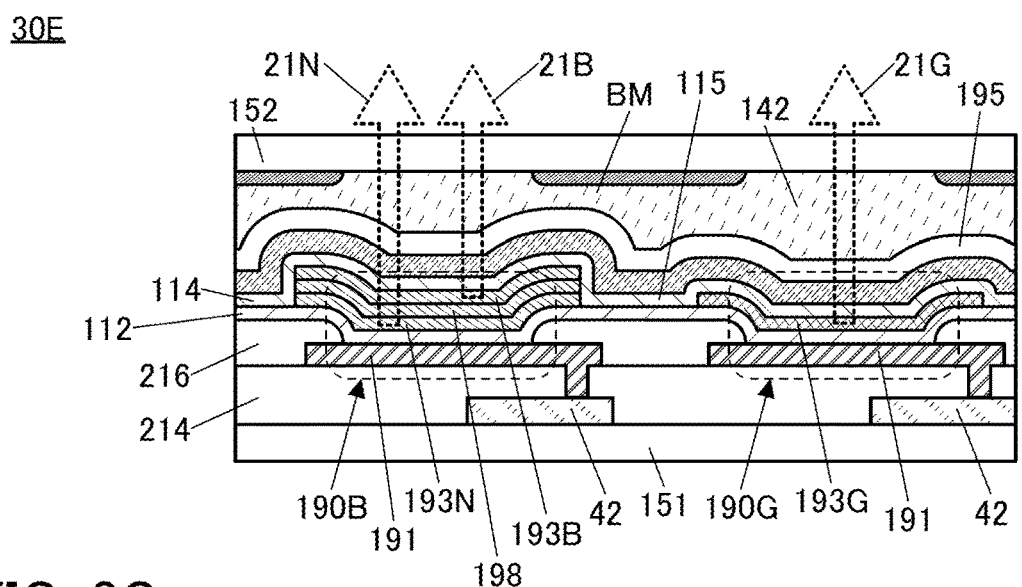

FIG. 8B shows a cross-sectional view of a light-emitting apparatus 30E.

The light-emitting apparatus 30E is different from the light-emitting apparatus 30D in that the intermediate layer 198 is provided between the light-emitting layer 193N and the light-emitting layer 193B. That is, the light-emitting device 190B of the light-emitting apparatus 30E has a tandem structure while the light-emitting device 190B of the light-emitting apparatus 30D has a single structure. Furthermore, the light-emitting device 190G, which does not emit infrared light, preferably has a single structure.

The light-emitting device emitting visible light and infrared light preferably has a single structure to improve the productivity of the light-emitting apparatus. The light-emitting device emitting visible light and infrared light preferably has a tandem structure to bring advantages such as facilitated optimization of the optical distance and increased emission intensity.

[Light-Emitting Apparatus 30F]

Figure 8C:
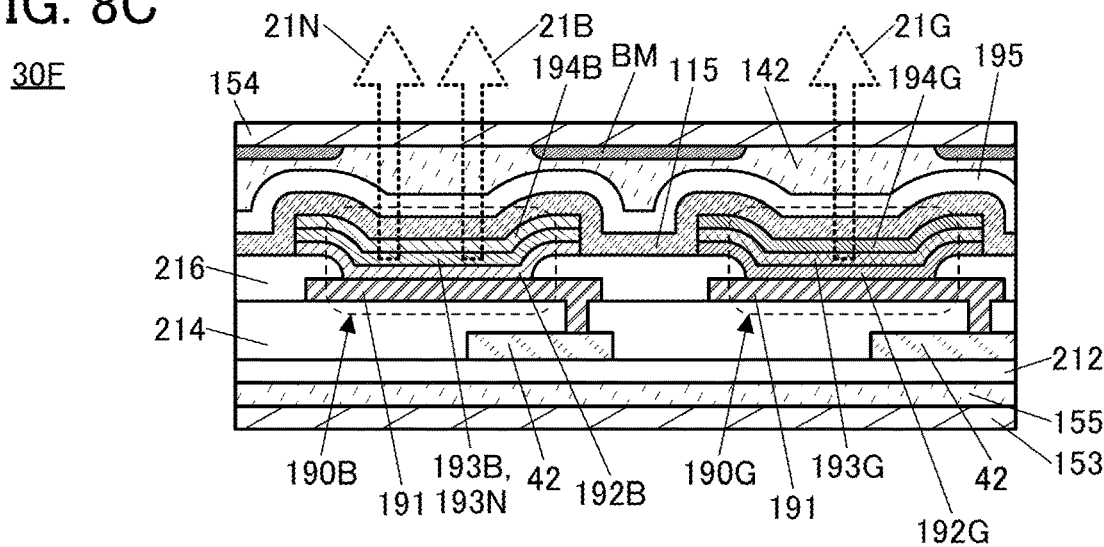

FIG. 8C shows a cross-sectional view of a light-emitting apparatus 30F.

The light-emitting apparatus 30F illustrated in FIG. 8C differs from the light-emitting apparatus 30A in that the substrate 151 and the substrate 152 are not included but a substrate 153, a substrate 154, an adhesive layer 155, and an insulating layer 212 are included.

The substrate 153 and the insulating layer 212 are attached to each other with the adhesive layer 155. The substrate 154 and the protective layer 195 are attached to each other with the adhesive layer 142.

The light-emitting apparatus 30F is formed in such a manner that the insulating layer 212, the transistor 42, the light-emitting device 190, and the like which are formed over a formation substrate are transferred onto the substrate 153. The substrate 153 and the substrate 154 are preferably flexible. Accordingly, the flexibility of the light-emitting apparatus 30F can be increased. For example, a resin is preferably used for each of the substrate 153 and the substrate 154.

For each of the substrate 153 and the substrate 154, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 153 and the substrate 154.

As the substrate included in the light-emitting apparatus of this embodiment, a film having high optical isotropy may be used. Examples of a highly optically isotropic film include a triacetyl cellulose (TAC, also referred to as cellulose triacetate) film, a cycloolefin polymer (COP) film, a cycloolefin copolymer (COC) film, and an acrylic film.

More detailed structures of the light-emitting apparatus of one embodiment of the present invention will be described below with reference to FIG. 9 to FIG. 11.

[Light-Emitting Apparatus 200A]

Figure 9:
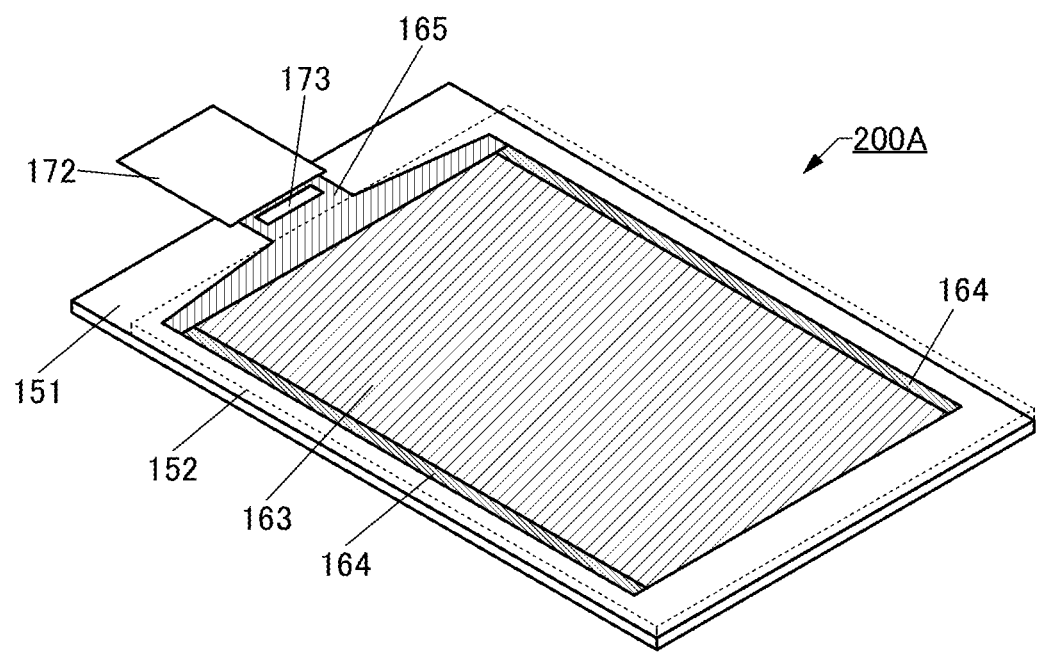
FIG. 9 is a perspective view showing a light-emitting apparatus example.

FIG. 9 shows a perspective view of a light-emitting apparatus 200A, and FIG. 10A shows a cross-sectional view of the light-emitting apparatus 200A.

The light-emitting apparatus 200A has a structure in which the substrate 152 and the substrate 151 are attached to each other. In FIG. 9, the substrate 152 is denoted by a dashed line.

The light-emitting apparatus 200A includes a light-emitting portion 163, a circuit 164, a wiring 165, and the like. FIG. 9 illustrates an example in which the light-emitting apparatus 200A is provided with an IC (integrated circuit) 173 and an FPC 172. Thus, the structure illustrated in FIG. 9 can be regarded as a light-emitting module including the light-emitting apparatus 200A, the IC, and the FPC.

As the circuit 164, for example, a scan line driver circuit can be used.

The wiring 165 has a function of supplying a signal and power to the light-emitting portion 163 and the circuit 164. The signal and power are input to the wiring 165 from the outside through the FPC 172 or from the IC 173.

FIG. 9 illustrates an example in which the IC 173 is provided over the substrate 151 by a COG (Chip On Glass) method, a COF (Chip on Film) method, or the like. An IC including a scan line driver circuit, a signal line driver circuit, or the like can be used as the IC 173, for example. Note that the light-emitting apparatus 200A and the light-emitting module may have a structure that is not provided with an IC. The IC may be implemented on the FPC by a COF method or the like.

FIG. 10A illustrates an example of a cross section including part of a region including the FPC 172, part of a region including the circuit 164, part of a region including the light-emitting portion 163, and part of a region including an end portion of the light-emitting apparatus 200A illustrated in FIG. 9.

The light-emitting apparatus 200A in FIG. 10A includes a transistor 201, a transistor 206, a transistor 207, the light-emitting device 190B, the light-emitting device 190G, the protective layer 195, and the like between the substrate 151 and the substrate 152.

The substrate 151 and the substrate 152 are bonded to each other with the adhesive layer 142. A solid sealing structure, a hollow sealing structure, or the like can be employed to seal the light-emitting device 190B and the light-emitting device 190G. In FIG. 10A, a hollow sealing structure is employed in which a space 143 surrounded by the substrate 151, the adhesive layer 142, and the substrate 152 is filled with an inert gas (e.g., nitrogen or argon). The adhesive layer 142 may overlap with the light-emitting device 190. The space 143 surrounded by the substrate 151, the adhesive layer 142, and the substrate 152 may be filled with a resin different from that of the adhesive layer 142.

The light-emitting device 190B has a stacked-layer structure in which a pixel electrode 191B, the common layer 112, the light-emitting layer 193N, the light-emitting layer 193B, the common layer 114, and the common electrode 115 are stacked in this order from the insulating layer 214 side. The pixel electrode 191B is connected to a conductive layer 222b included in the transistor 206 through an opening provided in the insulating layer 214. The transistor 206 has a function of controlling the driving of the light-emitting device 190B.

The light-emitting device 190G has a stacked-layer structure in which a pixel electrode 191G, the common layer 112, the light-emitting layer 193G, the common layer 114, and the common electrode 115 are stacked in this order from the insulating layer 214 side. The pixel electrode 191G is connected to the conductive layer 222b included in the transistor 207 through an opening provided in the insulating layer 214. The transistor 207 has a function of controlling the driving of the light-emitting device 190G.

An end portion of the pixel electrode 191B and an end portion of the pixel electrode 191G are covered with the bank 216. The pixel electrode 191B and the pixel electrode 191G include a material that reflects visible light and infrared light, and the common electrode 115 includes a material that transmits visible light and infrared light.

Light emitted from the light-emitting device 190 is emitted toward the substrate 152. For the substrate 152, a material having high visible-light- and infrared-light-transmitting properties is preferably used.

The pixel electrode 191B and the pixel electrode 191G can be formed using the same material in the same step. The common layer 112, the common layer 114, and the common electrode 115 are used in both the light-emitting device 190B and the light-emitting device 190G. The light-emitting device 190B and the light-emitting device 190G can share at least one of the components other than the light-emitting layers. Thus, a function of emitting infrared light can be added to the light-emitting apparatus 200A, without a significant increase in the number of manufacturing steps.

The light-emitting device 190 is covered with the protective layer 195. With the protective layer 195, entry of impurities such as water into the light-emitting device 190 can be inhibited, leading to an increase in the reliability of the light-emitting device 190.

In a region 228 in the vicinity of an end portion of the light-emitting apparatus 200A, an insulating layer 215 and the protective layer 195 are preferably in contact with each other through an opening in the insulating layer 214. In particular, an inorganic insulating film included in the insulating layer 215 and an inorganic insulating film included in the protective layer 195 are preferably in contact with each other. Thus, entry of impurities from the outside into the light-emitting portion 163 through the organic insulating film can be inhibited. Thus, the reliability of the light-emitting apparatus 200A can be increased.

FIG. 10B illustrates an example in which the protective layer 195 has a three-layer structure. In FIG. 10B, the protective layer 195 includes an inorganic insulating layer 195a over the common electrode 115, an organic insulating layer 195b over the inorganic insulating layer 195a, and an inorganic insulating layer 195c over the organic insulating layer 195b.

An end portion of the inorganic insulating layer 195a and an end portion of the inorganic insulating layer 195c extend beyond an end portion of the organic insulating layer 195b and are in contact with each other. The inorganic insulating layer 195a is in contact with the insulating layer 215 (inorganic insulating layer) through the opening in the insulating layer 214 (organic insulating layer). Accordingly, the light-emitting device 190 can be surrounded by the insulating layer 215 and the protective layer 195, whereby the reliability of the light-emitting device 190 can be increased.

As described above, the protective layer 195 may have a stacked-layer structure of an organic insulating film and an inorganic insulating film. In that case, an end portion of the inorganic insulating film preferably extends beyond an end portion of the organic insulating film.

The light-blocking layer BM is provided on the surface of the substrate 152 on the substrate 151 side. The light-blocking layer BM has an opening at a position overlapping with the light-emitting device 190.

The transistor 201, the transistor 206, and the transistor 207 are formed over the substrate 151. These transistors can be fabricated using the same material in the same step.

An insulating layer 211, an insulating layer 213, the insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that the number of gate insulating layers and the number of insulating layers covering the transistor are not limited and either a single layer or two or more layers may be employed.

A material through which impurities such as water and hydrogen do not easily diffuse is preferably used for at least one of the insulating layers that cover the transistors. Thus, such an insulating layer can serve as a barrier layer. Such a structure can effectively inhibit diffusion of impurities into the transistors from the outside and increase the reliability of the light-emitting apparatus.

An inorganic insulating film is preferably used as each of the insulating layer 211, the insulating layer 213, and the insulating layer 215. As the inorganic insulating film, for example, an inorganic insulating film such as a silicon nitride film, a silicon oxynitride film, a silicon oxide film, a silicon nitride oxide film, an aluminum oxide film, or an aluminum nitride film can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Here, an organic insulating film often has a lower barrier property than an inorganic insulating film. Therefore, the organic insulating film preferably has an opening in the vicinity of an end portion of the light-emitting apparatus 200A. This can inhibit entry of impurities from the end portion of the light-emitting apparatus 200A through the organic insulating film. Alternatively, the organic insulating film may be formed so that its end portion is positioned on the inner side compared to the end portion of the light-emitting apparatus 200A, to prevent the organic insulating film from being exposed at the end portion of the light-emitting apparatus 200A.

An organic insulating film is suitable for the insulating layer 214 functioning as a planarization layer. Examples of materials which can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In the region 228 illustrated in FIG. 10A, an opening is formed in the insulating layer 214. This can inhibit entry of impurities into the light-emitting portion 163 from the outside through the insulating layer 214 even when an organic insulating film is used as the insulating layer 214. Consequently, the light-emitting apparatus 200A can have higher reliability.

Each of the transistor 201, the transistor 206, and the transistor 207 includes a conductive layer 221 functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the light-emitting apparatus of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 201, the transistor 206, and the transistor 207. The two gates may be connected to each other and supplied with the same signal to operate the transistor. Alternatively, by supplying a potential for controlling the threshold voltage to one of the two gates and a potential for driving to the other, the threshold voltage of the transistor may be controlled.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. A semiconductor having crystallinity is preferably used, in which case deterioration of the transistor characteristics can be suppressed.

It is preferable that a semiconductor layer of a transistor contain a metal oxide (also referred to as an oxide semiconductor). Alternatively, the semiconductor layer of the transistor may contain silicon. Examples of silicon include amorphous silicon and crystalline silicon (e.g., low-temperature polysilicon or single crystal silicon).

The semiconductor layer preferably contains indium, M(M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In-M-Zn oxide, a sputtering target used for depositing the In-M-Zn oxide preferably has the atomic proportion of In higher than or equal to the atomic proportion of M. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, and In:M:Zn=5:2:5.

A target containing a polycrystalline oxide is preferably used as the sputtering target, in which case the semiconductor layer having crystallinity is easily formed. Note that the atomic ratio in the deposited semiconductor layer may vary from the above atomic ratio between metal elements in the sputtering target in a range of ±40%. For example, in the case where the composition of a sputtering target used for the semiconductor layer is In:Ga:Zn=4:2:4.1 [atomic ratio], the composition of the semiconductor layer to be deposited is in some cases in the neighborhood of In:Ga:Zn=4:2:3 [atomic ratio].

Note that when the atomic ratio is described as In:Ga:Zn=4:2:3 or as being in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. When the atomic ratio is described as In:Ga:Zn=5:1:6 or as being in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. When the atomic ratio is described as In:Ga:Zn=1:1:1 or as being in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The transistor included in the circuit 164 and the transistor included in the light-emitting portion 163 may have the same structure or different structures. One structure or two or more kinds of structures may be employed for a plurality of transistors included in the circuit 164. Similarly, one structure or two or more kinds of structures may be employed for a plurality of transistors included in the light-emitting portion 163.

A connection portion 204 is provided in a region of the substrate 151 not overlapping with the substrate 152. In the connection portion 204, the wiring 165 is electrically connected to the FPC 172 via a conductive layer 166 and a connection layer 242. On the top surface of the connection portion 204, the conductive layer 166 obtained by processing the same conductive film as the pixel electrode 191B and the pixel electrode 191G is exposed. Thus, the connection portion 204 and the FPC 172 can be electrically connected to each other through the connection layer 242.

Any of a variety of optical members can be arranged on the outer side of the substrate 152. Examples of the optical members include a polarizing plate, a retardation plate, a light diffusion layer (a diffusion film or the like), an anti-reflective layer, and a light-condensing film. Furthermore, an antistatic film preventing the attachment of dust, a water repellent film suppressing the attachment of stain, a hard coat film inhibiting generation of a scratch caused by the use, a shock absorbing layer or the like may be arranged on the outside of the substrate 152.

For each of the substrate 151 and the substrate 152, glass, quartz, ceramic, sapphire, a resin, or the like can be used. When a flexible material is used for the substrate 151 and the substrate 152, the flexibility of the light-emitting apparatus can be increased.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer 242, an anisotropic conductive film (ACF), an anisotropic conductive paste (ACP), or the like can be used.

The light-emitting device 190 may have a top emission, bottom emission, or dual emission structure, for example. A conductive film that transmits visible light and infrared light is used as the electrode through which light is extracted. A conductive film that reflects visible light and infrared light is preferably used as the electrode through which no light is extracted.

The light-emitting device 190B emits infrared light (IR) and blue (B) light. The light-emitting device 190B includes at least the light-emitting layer 193B and the light-emitting layer 193N. The light-emitting device 190G emits green (G) light. The light-emitting device 190G includes at least the light-emitting layer 193G. In addition to the light-emitting layer 193, the light-emitting device 190 may further include a layer containing a substance with a high hole-injection property, a substance with a high hole-transport property, a hole-blocking material, a substance with a high electron-transport property, a substance with a high electron-injection property, a substance with a bipolar property, or the like. For example, the common layer 112 preferably includes one or both of a hole-injection layer and a hole-transport layer. For example, the common layer 114 preferably includes one or both of an electron-transport layer and an electron-injection layer.

Either a low molecular compound or a high molecular compound can be used for the common layer 112, the light-emitting layer 193, and the common layer 114 and an inorganic compound may also be contained. The layers that constitute the common layer 112, the light-emitting layer 193, and the common layer 114 can each be formed by a method such as an evaporation method (including a vacuum evaporation method), a transfer method, a printing method, an inkjet method, or a coating method.

The light-emitting layer 193 may contain an inorganic compound such as quantum dots as a light-emitting material.

Examples of materials that can be used for conductive layers of a variety of wirings and electrodes and the like constituting the light-emitting apparatus in addition to a gate, a source, and a drain of a transistor include metals such as aluminum, titanium, chromium, nickel, copper, yttrium, zirconium, molybdenum, silver, tantalum, and tungsten and an alloy containing any of these metals as its main component. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to allow light transmission. A stacked-layer film of any of the above materials can be used for the conductive layers. For example, when a stacked film of indium tin oxide and an alloy of silver and magnesium, or the like is used, the conductivity can be increased, which is preferable. They can also be used for conductive layers of a variety of wirings and electrodes and the like that constitute a light-emitting apparatus, and conductive layers (conductive layers functioning as a pixel electrode or a common electrode) included in a light-emitting device.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

[Light-Emitting Apparatus 200B]

FIG. 11A shows a cross-sectional view of a light-emitting apparatus 200B.

The light-emitting apparatus 200B is different from the light-emitting apparatus 200A in the transistor structure.

The light-emitting apparatus 200B includes a transistor 202, a transistor 208, and a transistor 210.

Each of the transistor 202, the transistor 208, and the transistor 210 includes the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the low-resistance regions 231n through openings provided in the insulating layer 225 and the insulating layer 215. One of the conductive layer 222a and the conductive layer 222b serves as a source, and the other serves as a drain.

The pixel electrode 191B of the light-emitting device 190B is electrically connected to one of the pair of low-resistance regions 231n of the transistor 210 through the conductive layer 222b.

The pixel electrode 191G of the light-emitting device 190G is electrically connected to one of the pair of low-resistance regions 231n of the transistor 208 through the conductive layer 222b.

FIG. 11A illustrates an example in which the insulating layer 225 covers a top surface and a side surface of the semiconductor layer. Meanwhile, in FIG. 11B, the insulating layer 225 overlaps with the channel formation region 231i of the semiconductor layer 231 and does not overlap with the low-resistance regions 231n. The structure illustrated in FIG. 11B can be obtained by processing the insulating layer 225 with the conductive layer 223 as a mask, for example. In FIG. 11B, the insulating layer 215 is provided to cover the insulating layer 225 and the conductive layer 223, and the conductive layer 222a and the conductive layer 222b are connected to the low-resistance regions 231n through openings in the insulating layer 215. Furthermore, an insulating layer 218 covering the transistor may be provided.

In addition, the light-emitting apparatus 200B differs from the light-emitting apparatus 200A in that the substrate 151 and the substrate 152 are not included but the substrate 153, the substrate 154, the adhesive layer 155, and the insulating layer 212 are included.

The substrate 153 and the insulating layer 212 are attached to each other with the adhesive layer 155. The substrate 154 and the protective layer 195 are attached to each other with the adhesive layer 142.

The light-emitting apparatus 200B is formed in such a manner that the insulating layer 212, the transistor 202, the transistor 208, the transistor 210, the light-emitting device 190, and the like which are formed over a formation substrate are transferred onto the substrate 153. The substrate 153 and the substrate 154 are preferably flexible. Accordingly, the flexibility of the light-emitting apparatus 200B can be increased.

The inorganic insulating film that can be used as the insulating layer 211, the insulating layer 213, and the insulating layer 215 can be used as the insulating layer 212.

In the light-emitting apparatus 200B, the protective layer 195 and the substrate 154 are attached to each other with the adhesive layer 142. The adhesive layer 142 is provided to overlap with the light-emitting device 190, and the light-emitting apparatus employs a solid sealing structure in FIG. 11A.

[Metal Oxide]

A metal oxide that can be used for the semiconductor layer will be described below.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Note that in this specification and the like, "CAAC (c-axis aligned crystal)" and "CAC (Cloud-Aligned Composite)" might be stated. CAAC refers to an example of a crystal structure, and CAC refers to an example of a function or a material composition.

For example, a CAC (Cloud-Aligned Composite)-OS (Oxide Semiconductor) can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

Oxide semiconductors (metal oxides) are classified into a single crystal oxide semiconductor and a non-single crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary cannot be observed in the CAAC-OS; thus, it can be said that a reduction in electron mobility due to the crystal grain boundary is less likely to occur. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures that show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be deposited using either or both of an inert gas and an oxygen gas. Note that there is no particular limitation on the flow rate ratio of oxygen (the partial pressure of oxygen) at the time of depositing the metal oxide film. However, to obtain a transistor having high field-effect mobility, the flow rate ratio of oxygen (the partial pressure of oxygen) at the time of depositing the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably 2 eV or more, further preferably 2.5 eV or more, still further preferably 3 eV or more. With use of a metal oxide having such a wide energy gap, the off-state current of the transistor can be reduced.

The substrate temperature during the deposition of the metal oxide film is preferably lower than or equal to 350° C., further preferably higher than or equal to room temperature and lower than or equal to 200° C., still further preferably higher than or equal to room temperature and lower than or equal to 130° C. The substrate temperature during the deposition of the metal oxide film is preferably room temperature because productivity can be increased.

The metal oxide film can be formed by a sputtering method. Alternatively, a PLD method, a PECVD method, a thermal CVD method, an ALD method, or a vacuum evaporation method, for example, may be used.

As described above, the light-emitting apparatus of this embodiment includes a light-emitting device emitting visible light and infrared light and a light-emitting device emitting visible light. The light-emitting apparatus of this embodiment can emit both visible light and infrared light and thus can be used as a light source of any of a sensor using visible light for a light source, a sensor using infrared light for a light source, and a sensor using both visible light and infrared light for a light source, which is highly convenient.

In the light-emitting apparatus of this embodiment, one subpixel can be configured to emit both visible light and infrared light. Accordingly, the light-emitting apparatus can be configured to emit both visible light and infrared light without increasing the number of subpixels included in one pixel. In addition, the light-emitting device emitting visible light and infrared light and the light-emitting device emitting visible light can share a layer. Thus, a function of emitting infrared light can be added to the light-emitting apparatus, without considerably changing the pixel layout of the light-emitting apparatus or considerably increasing the number of the manufacturing steps.

This embodiment can be combined with the other embodiments as appropriate. In this specification, in the case where a plurality of structure examples are shown in one embodiment, the structure examples can be combined as appropriate.

Embodiment 2

In this embodiment, a display apparatus of one embodiment of the present invention will be described with reference to FIG. 12 to FIG. 19.

The display apparatus of one embodiment of the present invention includes, in a display portion, a light-emitting device emitting visible light and infrared light, a light-emitting device emitting visible light, and a light-receiving device detecting at least part of visible light and infrared light. Examples of visible light include light with wavelengths of greater than or equal to 400 nm and less than 750 nm such as red, green, or blue light. Examples of infrared light include near-infrared light, and specifically, light with wavelengths of greater than or equal to 750 nm and less than or equal to 1300 nm can be given as an example.

The display apparatus of one embodiment of the present invention includes, in a display portion, a first light-emitting device, a second light-emitting device, and a light-receiving device. The first light-emitting device has a function of emitting both visible light and infrared light. The second light-emitting device has a function of emitting visible light. The light-receiving device has a function of absorbing at least part of visible light and infrared light. The first light-emitting device includes a first pixel electrode, a first light-emitting layer, a second light-emitting layer, and a common electrode. The first light-emitting layer and the second light-emitting layer are each positioned between the first pixel electrode and the common electrode. The second light-emitting device includes a second pixel electrode, a third light-emitting layer, and the common electrode. The third light-emitting layer is positioned between the second pixel electrode and the common electrode. The light-receiving device includes a third pixel electrode, an active layer, and the common electrode. The active layer is positioned between the third pixel electrode and the common electrode. The first light-emitting layer includes a light-emitting material emitting infrared light. The second light-emitting layer and the third light-emitting layer include light-emitting materials emitting visible light with different wavelengths. The active layer contains an organic compound.

The display apparatus of one embodiment of the present invention can display an image using the visible light emitted by the light-emitting devices. Specifically, the light-emitting devices are arranged in a matrix in the display portion, and an image can be displayed on the display portion.

Furthermore, in the display apparatus of one embodiment of the present invention, the light-emitting device can be used as a light source of a sensor (e.g., an image sensor or an optical touch sensor). The display apparatus of one embodiment of the present invention can emit both visible light and infrared light and thus can be combined with any of a sensor using visible light for a light source and a sensor using infrared light for a light source, which is highly convenient. The display apparatus of one embodiment of the present invention can also be used as a light source of a sensor using both visible light and infrared light for the light source, which can increase the functionality of the sensor.

In the display apparatus of one embodiment of the present invention, one subpixel can be configured to emit both visible light and infrared light. For example, any of three subpixels respectively exhibiting red, green, and blue can be configured to emit infrared light. When the subpixel emitting visible light doubles as a subpixel emitting infrared light, the necessity of providing a separate subpixel emitting infrared light is eliminated. Accordingly, the display apparatus can be configured to emit visible light and infrared light without increasing the number of subpixels included in one pixel. This can inhibit a decrease in the aperture ratio of the pixel and can increase the light extraction efficiency of the display apparatus.

Moreover, the light-receiving devices are arranged in a matrix in the display portion, so that the display portion also has a function of a light-receiving portion. The light-receiving device can detect one or both of visible light and infrared light. The light-receiving portion can be used as an image sensor or a touch sensor. That is, by detecting light with the light-receiving portion, an image can be taken and the approach or contact of an object (e.g., a finger or a stylus) can be detected.

The display apparatus of one embodiment of the present invention can function as a sensor when the light-emitting device emits light with a wavelength to be detected by the light-receiving device. This eliminates the necessity of providing a light-receiving portion and a light source separately from the display apparatus, leading to an electronic device with a reduced number of components.

In the display apparatus of one embodiment of the present invention, when an object reflects light emitted from the light-emitting device included in the display portion, the light-receiving device can detect the reflected light; thus, imaging and touch (including approach) detection are possible even in a dark place.

In the display apparatus of one embodiment of the present invention, the three devices, i.e., the light-emitting device emitting visible light and infrared light, the light-emitting device emitting visible light, and the light-receiving device, can share a layer. Thus, a function of emitting infrared light can be added to the display apparatus and the display apparatus can incorporate the light-receiving device, without considerably increasing the number of the manufacturing steps. For example, at least one of a hole-injection layer, a hole-transport layer, an electron-transport layer, and an electron-injection layer can be shared by the three devices.

Note that the function of the layer shared by the light-receiving device and the light-emitting devices sometimes differs between the light-receiving device and the light-emitting devices. In this specification, the name of a component is based on its function in the light-emitting devices. For example, a hole-injection layer functions as a hole-injection layer in the light-emitting devices and functions as a hole-transport layer in the light-receiving device. Similarly, an electron-injection layer functions as an electron-injection layer in the light-emitting devices and functions as an electron-transport layer in the light-receiving device. Note that a hole-transport layer functions as a hole-transport layer in both the light-emitting devices and the light-receiving device. Similarly, an electron-transport layer functions as an electron-transport layer in both the light-emitting devices and the light-receiving device.

In the display apparatus of one embodiment of the present invention, the light-emitting device described in Embodiment 1 can be used. Embodiment 1 can be referred to for the structure and features of the light-emitting device included the display apparatus of this embodiment, and detailed description thereof is omitted in some cases.

When the light-receiving device is used as an image sensor, the display apparatus of this embodiment can capture an image using the light-receiving device.

For example, data on a fingerprint, a palm print, an iris, or the like can be acquired with the image sensor. That is, a biological authentication sensor can be incorporated into the display apparatus of this embodiment. When the display apparatus incorporates a biological authentication sensor, the number of components of an electronic device can be reduced as compared to the case where a biological authentication sensor is provided separately from the display apparatus; thus, the size and weight of the electronic device can be reduced.

In addition, data on facial expression, eye movement, change of the pupil diameter, or the like of a user can be acquired with the image sensor. By analysis of the data, data on the user's physical and mental state can be acquired. Changing the output contents of one or both of display and sound on the basis of the data allows the user to safely use a device for VR (Virtual Reality), AR (Augmented Reality), or MR (Mixed Reality), for example.

When the light-receiving device is used as a touch sensor, the display apparatus of this embodiment can detect the approach or contact of an object with use of the light-receiving device.

As the light-receiving device, a PN photodiode or a PIN photodiode can be used, for example. The light-receiving device functions as a photoelectric conversion device that detects light incident on the light-receiving device and generates charge. The amount of generated electric charge depends on the amount of the incident light.

It is particularly preferable to use an organic photodiode including a layer containing an organic compound as the light-receiving device. An organic photodiode, which is easily made thin, lightweight, and large in area and has a high degree of freedom for shape and design, can be used in a variety of display apparatuses.

In one embodiment of the present invention, an organic EL device is used as the light-emitting device, and an organic photodiode is used as the light-receiving device. The structure of the organic photodiode can have many layers shared with the organic EL device. Accordingly, the light-receiving device can be incorporated in the display apparatus without a significant increase in the number of manufacturing steps. For example, an active layer of the light-receiving device and a light-emitting layer of the light-emitting device are separately formed, and the other layers can be shared by the light-emitting device and the light-receiving device.

FIG. 12A to FIG. 12D are cross-sectional views of display apparatuses of embodiments of the present invention.

Figure 12A:
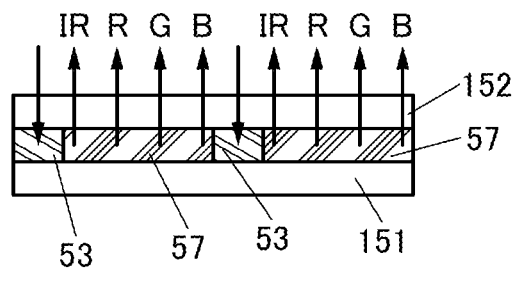
FIG. 12A to FIG. 12D are cross-sectional views showing display apparatus examples.

A display apparatus 50A illustrated in FIG. 12A includes a layer 53 including a light-receiving device and a layer 57 including a light-emitting device between the substrate 151 and the substrate 152.

Figure 12B:
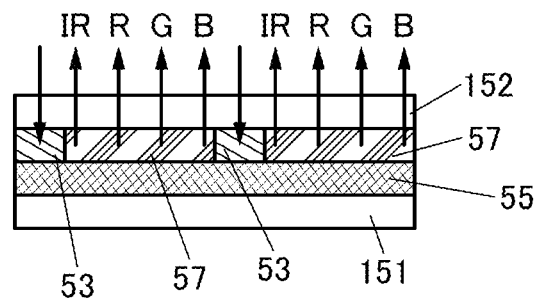

A display apparatus 50B illustrated in FIG. 12B includes the layer 53 including a light-receiving device, a layer 55 including transistors, and the layer 57 including a light-emitting device between the substrate 151 and the substrate 152.

In the display apparatus 50A and the display apparatus 50B, red (R) light, green (G) light, blue (B) light, and infrared light (IR) are emitted from the layer 57 including a light-emitting device.

For the layer 57 including a light-emitting device, the structure of the light-emitting apparatus in Embodiment 1 can be referred to. That is, the light-emitting device included in the light-emitting apparatus in Embodiment 1 can be used in the layer 57 including a light-emitting device.

The layer 55 including transistors preferably includes a first transistor and a second transistor. The first transistor is electrically connected to the light-receiving device. The second transistor is electrically connected to the light-emitting device.

The layer 53 including a light-receiving device can be configured to detect visible light, detect infrared light, or detect both visible light and infrared light. The wavelength of light that the light-receiving device detects can be determined depending on the application of the sensor.

Figure 12C:
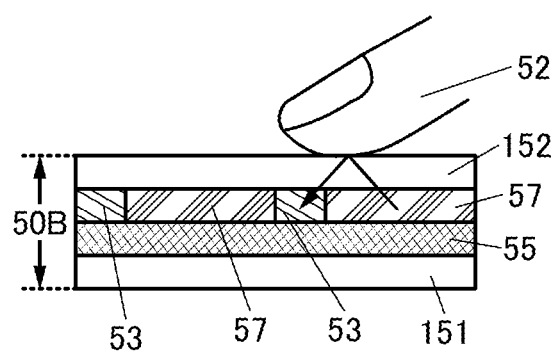

The display apparatus of one embodiment of the present invention may have a function of detecting an object such as a finger that is touching the display apparatus. For example, after light emitted from the light-emitting device in the layer 57 including a light-emitting device is reflected by a finger 52 that touches the display apparatus 50B as illustrated in FIG. 12C, the light-receiving device in the layer 53 including a light-receiving device detects the reflected light. Thus, the touch of the finger 52 on the display apparatus 50B can be detected.

Figure 12D:
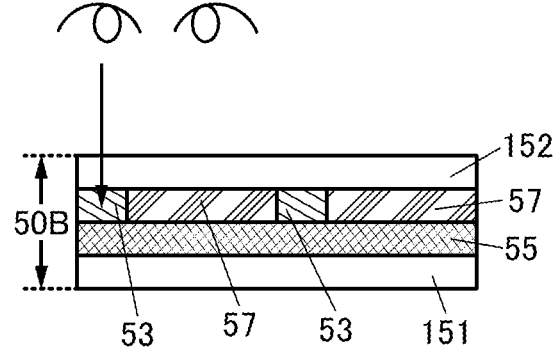

The display apparatus of one embodiment of the present invention may have a function of detecting an object that is close to (but is not touching) the display apparatus 50B as illustrated in FIG. 12D or capturing an image of such an object.

[Pixel]

FIG. 13A to FIG. 13E illustrate pixel examples.

Each of the display apparatuses of embodiments of the present invention includes a plurality of pixels arranged in a matrix. One pixel includes at least one subpixel. One subpixel includes one light-emitting device. For example, the pixel can include three subpixels (e.g., three colors of R, G, and B or three colors of yellow (Y), cyan (C), and magenta (M)) or four subpixels (e.g., four colors of R, G, B, and white (W) or four colors of R, G, B, and Y).

In the display apparatus of one embodiment of the present invention, at least one of these subpixels constituting the pixel emits infrared light as well as visible light.

The pixel further includes a light-receiving device. The light-receiving device may be provided in all of the pixels or in some of the pixels. In addition, one pixel may include a plurality of light-receiving devices.

Figure 13A:
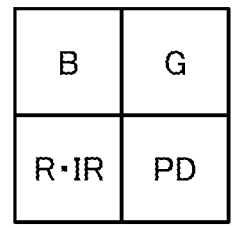
FIG. 13A to FIG. 13E are top views showing pixel examples.
Figure 13B:
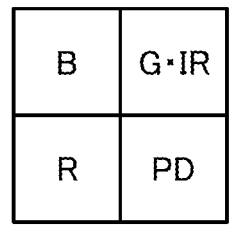
Figure 13C:
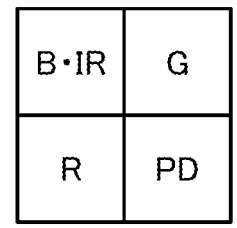
Figure 13D:
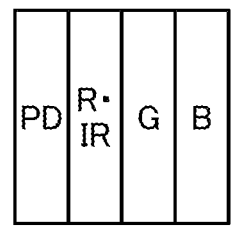

The pixel illustrated in each of FIG. 13A to FIG. 13D includes three subpixels (three light-emitting devices) of R, G, and B and a light-receiving device PD. FIG. 13A and FIG. 13D show structures in which the red (R) subpixel emits infrared light (IR); FIG. 13B, a structure in which the green (G) subpixel emits infrared light (IR); and FIG. 13C, a structure in which the blue (B) subpixel emits infrared light (IR).

FIG. 13A to FIG. 13C illustrate examples in which the three subpixels and the light-receiving device PD are arranged in a 2×2 matrix, and FIG. 13D illustrates an example in which the three subpixels and the light-receiving device PD are arranged in a row.

Figure 13E:
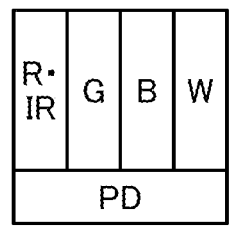

The pixel illustrated in FIG. 13E includes four subpixels (four light-emitting devices) of R, G, B, and W and the light-receiving device PD.

Although FIG. 13D and FIG. 13E show a structure in which the red (R) subpixel emits infrared light (IR), one embodiment of the present invention is not limited thereto and the subpixel of any of the other colors may emit infrared light.

The structure of the display apparatus of one embodiment of the present invention will be described below with reference to FIG. 14 to FIG. 19. The light-emitting devices emitting light of G and B out of the light-emitting devices for three colors of R, G, and B will be mainly described below. The structure of the light-emitting device emitting light of R can be similar to that of the light-emitting device emitting light of G.

[Display Apparatus 10A]

Figure 14A:
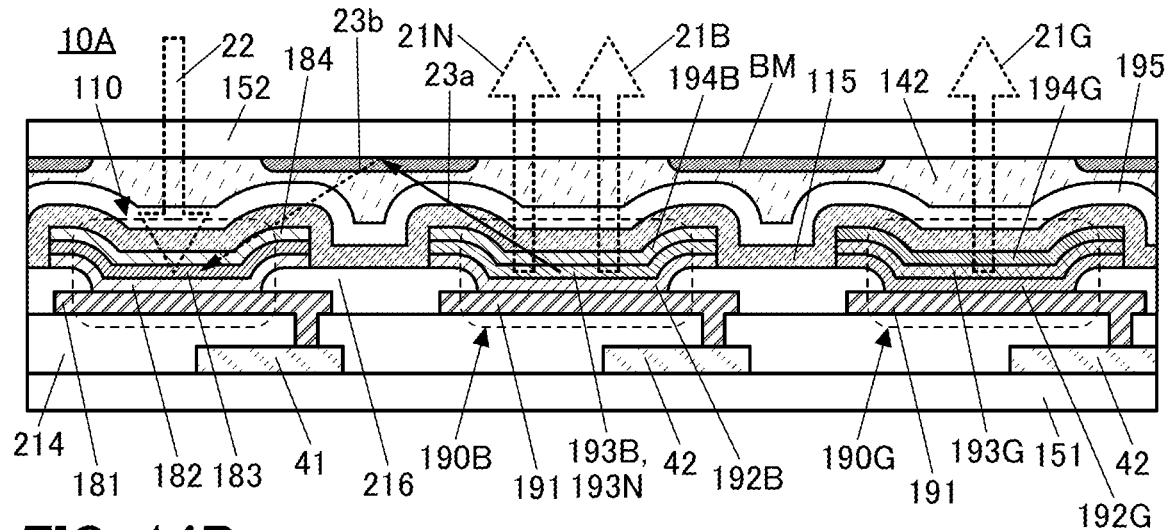
FIG. 14A to FIG. 14C are cross-sectional views illustrating display apparatus examples.

FIG. 14A shows a cross-sectional view of a display apparatus 10A.

The display apparatus 10A includes a light-receiving device 110, the light-emitting device 190B, and the light-emitting device 190G. The light-receiving device 110 has a function of detecting the infrared light 21N. The light-emitting device 190B has a function of emitting the blue light 21B and the infrared light 21N. The light-emitting device 190G has a function of emitting the green light 21G.

Note that the light-receiving device 110 may have a function of detecting visible light as well as infrared light. Furthermore, the light-emitting device that emits the infrared light 21N is not limited to the light-emitting device 190B. A structure can be employed in which at least one of light-emitting devices emitting visible light (e.g., red, green, and blue) has a function of emitting the infrared light 21N.

The light-emitting device 190B includes the pixel electrode 191, the buffer layer 192B, the light-emitting layer 193B, the light-emitting layer 193N, the buffer layer 194B, and the common electrode 115. Note that although the light-emitting layer 193B and the light-emitting layer 193N are described as one layer in FIG. 14A and the like, the light-emitting layer 193B and the light-emitting layer 193N are separate layers. Since the light-emitting device 190B has a top emission structure, it is preferable that the light-emitting layer 193N be provided between the pixel electrode 191 and the light-emitting layer 193B as described in Embodiment 1.

The light-emitting device 190G includes the pixel electrode 191, the buffer layer 192G, the light-emitting layer 193G, the buffer layer 194G, and the common electrode 115.

The light-receiving device 110 includes a pixel electrode 181, a buffer layer 182, an active layer 183, a buffer layer 184, and the common electrode 115.

The pixel electrode 181, the buffer layer 182, the buffer layer 192B, the buffer layer 192G, the active layer 183, the light-emitting layer 193B, the light-emitting layer 193N, the light-emitting layer 193G, the buffer layer 184, the buffer layer 194B, the buffer layer 194G, and the common electrode 115 may each have a single-layer structure or a stacked-layer structure.

The pixel electrode 181 and the pixel electrode 191 are positioned over the insulating layer 214. The pixel electrode 181 and the pixel electrode 191 can be formed using the same material in the same step.

In the display apparatus 10A, not only the active layer 183 of the light-receiving device 110 and the light-emitting layer 193 of the light-emitting device 190 but also other layers (buffer layers) are separately formed. Specifically, the light-receiving device 110, the light-emitting device 190B, and the light-emitting device 190G do not share any layer between the pair of electrodes (the pixel electrode 181 or the pixel electrode 191 and the common electrode 115) in this example.

The light-receiving device 110 and the light-emitting device 190 can be manufactured in the following manner: the pixel electrode 181 and the pixel electrode 191 are formed over the insulating layer 214 using the same material in the same step; the buffer layer 182, the active layer 183, and the buffer layer 184 are formed over the pixel electrode 181; the buffer layer 192, the light-emitting layer 193, and the buffer layer 194 are formed over the pixel electrode 191; and then, the common electrode 115 is formed to cover the pixel electrode 181, the pixel electrode 191, the buffer layer 182, the buffer layer 192, the active layer 183, the light-emitting layer 193, the buffer layer 184, and the buffer layer 194. Note that the manufacturing order of the stacked-layer structure of the buffer layer 182, the active layer 183, and the buffer layer 184 and the stacked-layer structure of the buffer layer 192, the light-emitting layer 193, and the buffer layer 194 is not particularly limited. For example, deposition of the buffer layer 182, the active layer 183, and the buffer layer 184 may be followed by formation of the buffer layer 192, the light-emitting layer 193, and the buffer layer 194. Conversely, formation of the buffer layer 192, the light-emitting layer 193, and the buffer layer 194 may be followed by deposition of the buffer layer 182, the active layer 183, and the buffer layer 184. Alternatively, deposition may be performed alternately, in which case the buffer layer 182, the buffer layer 192B, the buffer layer 192G, the active layer 183, and the light-emitting layer 193N are deposited in this order, for example.

As the buffer layer 182, for example, a hole-transport layer can be formed. As each of the buffer layer 192B and the buffer layer 192G, one or both of a hole-injection layer and a hole-transport layer can be formed, for example.

The active layer 183 overlaps with the pixel electrode 181 with the buffer layer 182 positioned therebetween. The active layer 183 overlaps with the common electrode 115 with the buffer layer 184 positioned therebetween. The active layer 183 contains an organic compound. Specifically, the active layer 183 contains an organic compound different from the organic compound contained in the light-emitting layer 193 of the light-emitting device 190.

The light-emitting layer 193B and the light-emitting layer 193N overlap with the pixel electrode 191 with the buffer layer 192B positioned therebetween. The light-emitting layer 193B and the light-emitting layer 193N overlap with the common electrode 115 with the buffer layer 194B positioned therebetween. The light-emitting layer 193B includes a light-emitting material emitting blue light. The light-emitting layer 193N includes a light-emitting material emitting infrared light.

The light-emitting layer 193G overlaps with the pixel electrode 191 with the buffer layer 192G positioned therebetween. The light-emitting layer 193G overlaps with the common electrode 115 with the buffer layer 194G positioned therebetween. The light-emitting layer 193G includes a light-emitting material emitting green light.

As the buffer layer 184, for example, an electron-transport layer can be formed. As each of the buffer layer 194B and the buffer layer 194G, one or both of an electron-injection layer and an electron-transport layer can be formed, for example.

The common electrode 115 includes a portion overlapping with the pixel electrode 181 with the buffer layer 182, the active layer 183, and the buffer layer 184 positioned therebetween. The common electrode 115 includes a portion overlapping with the pixel electrode 181 with the buffer layer 192B, the light-emitting layer 193B, the light-emitting layer 193N, and the buffer layer 194B positioned therebetween. The common electrode 115 further includes a portion overlapping with the pixel electrode 191 with the buffer layer 192G, the light-emitting layer 193G, and the buffer layer 194G positioned therebetween. The common electrode 115 is a layer shared by the light-receiving device 110, the light-emitting device 190B, and the light-emitting device 190G.

In the display apparatus of this embodiment, an organic compound is used for the active layer 183 of the light-receiving device 110. The light-receiving device 110 can be fabricated only by changing at least one of the components of the light-emitting device 190 (EL device) between the pair of electrodes. This allows the light-receiving device 110 to be incorporated in the display portion of the display apparatus.

The display apparatus 10A includes the light-receiving device 110, the light-emitting device 190B, the light-emitting device 190G, a transistor 41, the transistor 42, and the like between the pair of substrates (the substrate 151 and the substrate 152).

The buffer layer 182, the active layer 183, and the buffer layer 184, which are positioned between the pixel electrode 181 and the common electrode 115 in the light-receiving device 110, can each be referred to as an organic layer (a layer containing an organic compound). The pixel electrode 181 preferably has a function of reflecting visible light and infrared light. An end portion of the pixel electrode 181 is covered with the bank 216. The common electrode 115 has a function of transmitting visible light and infrared light.

The light-receiving device 110 has a function of sensing light. Specifically, the light-receiving device 110 is a photoelectric conversion device that receives light 22 incident from the outside of the display apparatus 10A and converts the light 22 into an electric signal. The light 22 can also be expressed as light that is emitted by the light-emitting device 190 and then reflected by an object. The light 22 may enter the light-receiving device 110 through a lens described later.

The light-blocking layer BM is preferably provided on the surface of the substrate 152 on the substrate 151 side. The light-blocking layer BM has openings at a position overlapping with the light-receiving device 110 and at a position overlapping with the light-emitting device 190. Providing the light-blocking layer BM can control the range where the light-receiving device 110 detects light.

Here, the light-receiving device 110 detects light that is emitted by the light-emitting device 190 and then reflected by an object. However, in some cases, light emitted from the light-emitting device 190 is reflected inside the display apparatus 10A and enters the light-receiving device 110 without via an object, in some cases. The light-blocking layer BM can reduce the influence of such stray light. For example, in the case where the light-blocking layer BM is not provided, light 23a emitted from the light-emitting device 190 is reflected by the substrate 152 and reflected light 23b is incident on the light-receiving device 110 in some cases. Providing the light-blocking layer BM can inhibit entry of the reflected light 23b into the light-receiving device 110. Consequently, noise can be reduced, and the sensitivity of a sensor using the light-receiving device 110 can be increased.

The buffer layer 192, the light-emitting layer 193, and the buffer layer 194, which are positioned between the pixel electrode 191 and the common electrode 115 in the light-emitting device 190, can each be referred to as an EL layer. The pixel electrode 191 preferably has a function of reflecting visible light and infrared light. The end portion of the pixel electrode 191 is covered with the bank 216. The pixel electrode 181 and the pixel electrode 191 are electrically insulated from each other by the bank 216. The common electrode 115 has a function of transmitting visible light and infrared light.

The light-emitting device 190B has a function of emitting visible light and infrared light. Specifically, the light-emitting device 190B is an electroluminescent device that emits visible light (the blue light 21B) and infrared light (the infrared light 21N) toward the substrate 152 when voltage is applied between the pixel electrode 191 and the common electrode 115.

The light-emitting device 190G has a function of emitting visible light. Specifically, the light-emitting device 190G is an electroluminescent device that emits visible light (the green light 21G) toward the substrate 152 when voltage is applied between the pixel electrode 191 and the common electrode 115.

It is preferable that the light-emitting layer 193 be formed not to overlap with a light-receiving region of the light-receiving device 110. This makes it possible to inhibit the light-emitting layer 193 from absorbing the light 22, so that the amount of light with which the light-receiving device 110 is irradiated can be increased.

The pixel electrode 181 is electrically connected to a source or a drain of the transistor 41 through an opening provided in the insulating layer 214. The end portion of the pixel electrode 181 is covered with the bank 216.

The pixel electrode 191 is electrically connected to a source or a drain of the transistor 42 through an opening provided in the insulating layer 214. The end portion of the pixel electrode 191 is covered with the bank 216. The transistor 42 has a function of controlling the driving of the light-emitting device 190.

The transistor 41 and the transistor 42 are on and in contact with the same layer (the substrate 151 in FIG. 14A).

At least part of a circuit electrically connected to the light-receiving device 110 is preferably formed using the same material in the same step as a circuit electrically connected to the light-emitting device 190. Thus, the thickness of the display apparatus can be reduced and the manufacturing process can be simplified, compared to the case where the two circuits are separately formed.

The light-receiving device 110 and the light-emitting device 190 are preferably covered with the protective layer 195. In FIG. 14A, the protective layer 195 is provided on and in contact with the common electrode 115. Providing the protective layer 195 can inhibit entry of impurities such as water into the light-receiving device 110 and the light-emitting device 190, so that the reliability of the light-receiving device 110 and the light-emitting device 190 can be increased. The protective layer 195 and the substrate 152 are attached to each other with the adhesive layer 142.

Figure 14B:
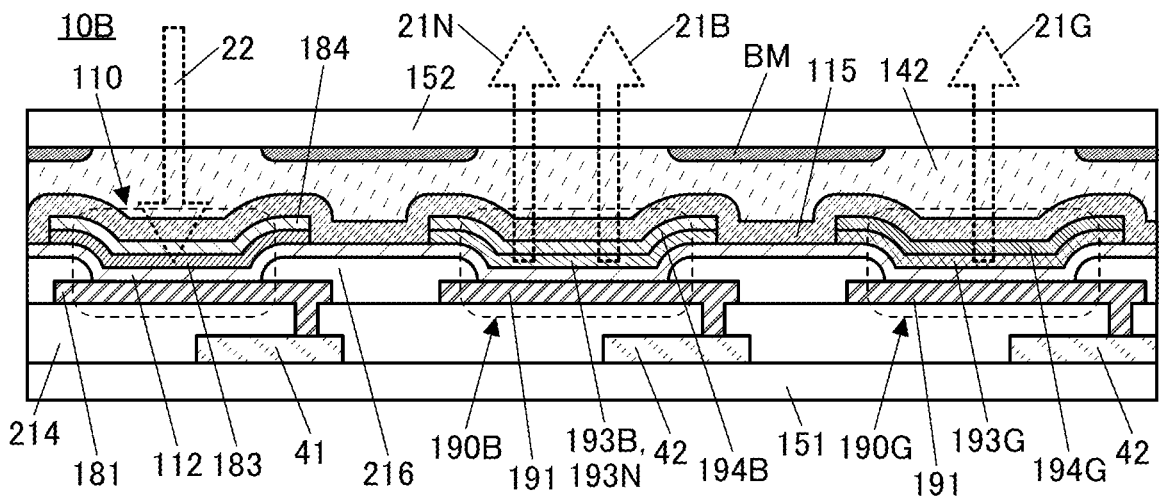

Note that as shown in FIG. 14B, the protective layer is not necessarily provided over the light-receiving device 110 and the light-emitting device 190. In FIG. 14B, the common electrode 115 and the substrate 152 are attached to each other with the adhesive layer 142.

[Display Apparatus 10B]

FIG. 14B shows a cross-sectional view of a display apparatus 10B. Note that in the description of the display apparatus below, components similar to those of the above-mentioned display apparatus are not described in some cases.

The display apparatus 10B is different from the display apparatus 10A in that the display apparatus 10B includes none of the buffer layer 182, the buffer layer 192B, and the buffer layer 192G but includes the common layer 112.

The common layer 112 is positioned over the pixel electrode 181 and the pixel electrode 191. The common layer 112 is a layer shared by the light-receiving device 110, the light-emitting device 190B, and the light-emitting device 190G.

As the common layer 112, one or both of a hole-injection layer and a hole-transport layer can be formed, for example. The common layer 112 may have a single-layer structure or a stacked-layer structure.

At least one of the layers other than the active layer and the light-emitting layer is preferably shared by the light-receiving device and the light-emitting device, in which case the number of steps of manufacturing the display apparatus can be reduced.

[Display Apparatus 10C]

Figure 14C:
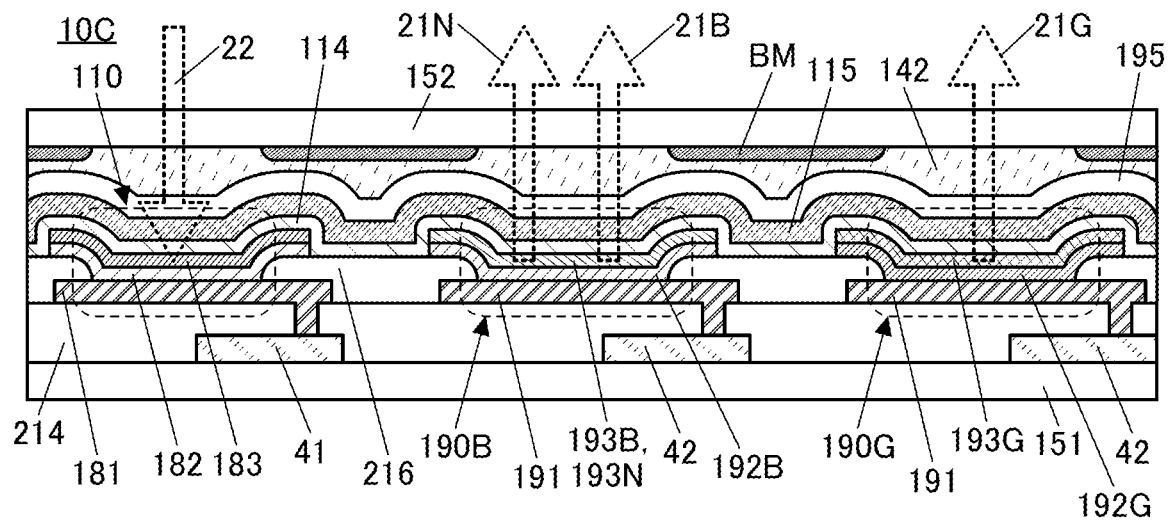

FIG. 14C shows a cross-sectional view of a display apparatus 10C.

The display apparatus 10C is different from the display apparatus 10A in that the display apparatus 10C includes none of the buffer layer 184, the buffer layer 194B, and the buffer layer 194G but includes the common layer 114.

The common layer 114 is positioned over the bank 216, the active layer 183, the light-emitting layer 193B, the light-emitting layer 193N, and the light-emitting layer 193G. The common layer 114 is a layer shared by the light-receiving device 110, the light-emitting device 190B, and the light-emitting device 190G.

As the common layer 114, one or both of an electron-injection layer and an electron-transport layer can be formed, for example. The common layer 114 may have a single-layer structure or a stacked-layer structure.

At least one of the layers other than the active layer and the light-emitting layer is preferably shared by the light-receiving device and the light-emitting device, in which case the number of steps of manufacturing the display apparatus can be reduced.

[Display Apparatus 10D]

Figure 15A:
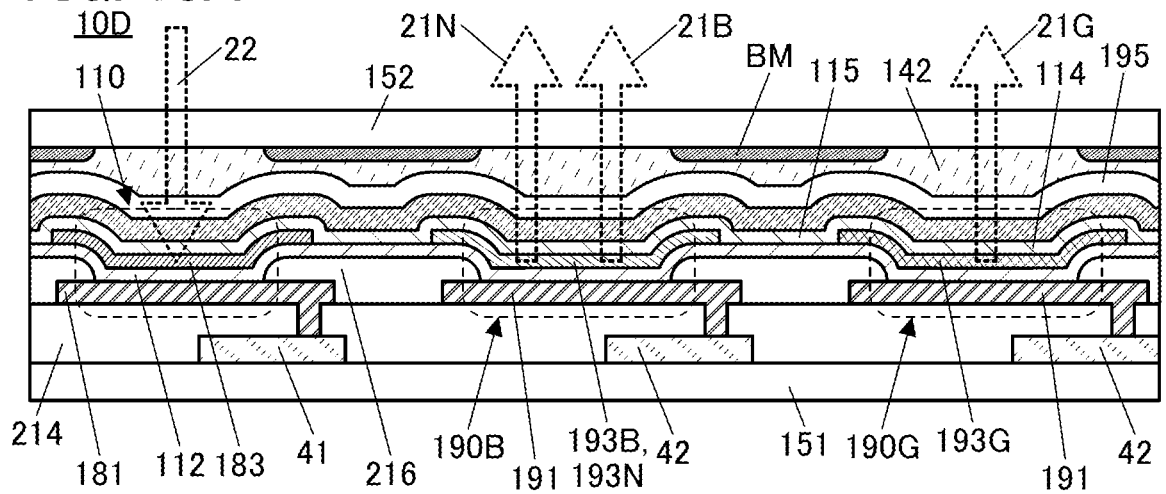
FIG. 15A to FIG. 15C are cross-sectional views illustrating display apparatus examples.

FIG. 15A shows a cross-sectional view of a display apparatus 10D.

The display apparatus 10D is different from the display apparatus 10A in that the display apparatus 10D includes none of the buffer layer 182, the buffer layer 192B, the buffer layer 192G, the buffer layer 184, the buffer layer 194B, and the buffer layer 194G but includes the common layer 112 and the common layer 114.

In the display apparatus of this embodiment, an organic compound is used for the active layer 183 of the light-receiving device 110. The light-receiving device 110 can share the layers other than the active layer 183 with the light-emitting device 190 (EL device). Therefore, the light-receiving device 110 can be formed concurrently with the formation of the light-emitting device 190 only by adding a step of depositing the active layer 183 to the manufacturing process of the light-emitting device 190. The light-emitting device 190 and the light-receiving device 110 can be formed over one substrate. Accordingly, the light-receiving device 110 can be incorporated into the display apparatus without a significant increase in the number of manufacturing steps.

The display apparatus 10D shows an example in which the light-receiving device 110 and the light-emitting device 190 have a common structure except that the active layer 183 of the light-receiving device 110 and the light-emitting layer 193 of the light-emitting device 190 are separately formed. Note that the structures of the light-receiving device 110 and the light-emitting device 190 are not limited thereto. The light-receiving device 110 and the light-emitting device 190 may include a separately formed layer other than the active layer 183 and the light-emitting layer 193 (see the aforementioned display apparatuses 10A, 10B, and 10C). The light-receiving device 110 and the light-emitting device 190 preferably include at least one shared layer (common layer). Thus, the light-receiving device 110 can be incorporated into the display apparatus without a significant increase in the number of manufacturing steps.

[Display Apparatus 10E]

Figure 15B:
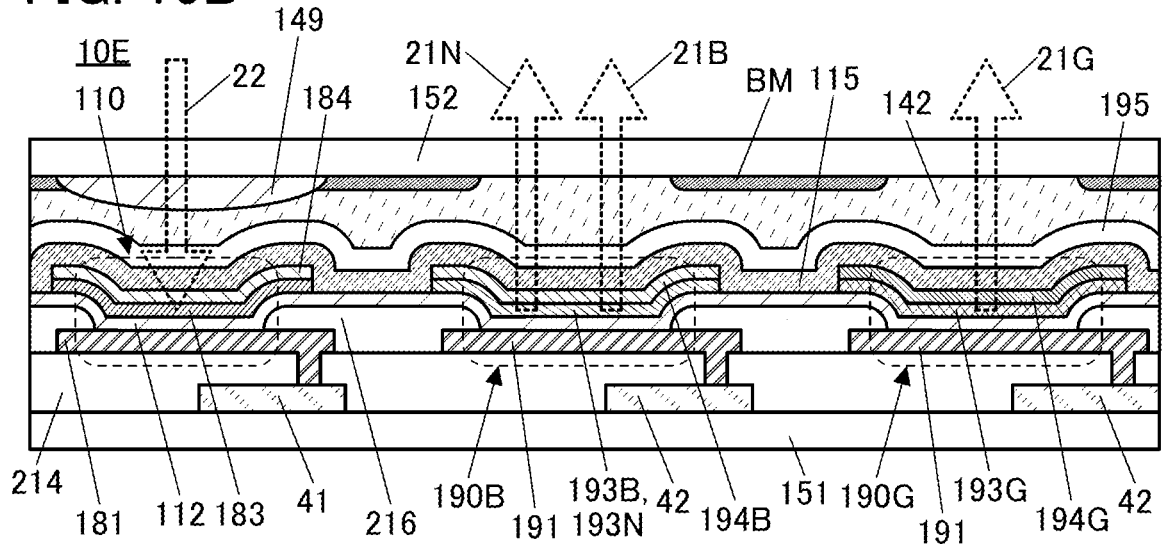

FIG. 15B shows a cross-sectional view of a display apparatus 10E.

The display apparatus 10E illustrated in FIG. 15B includes a lens 149 in addition to the components of the display apparatus 10A.

The display apparatus of this embodiment may include the lens 149. The lens 149 is provided at a position overlapping with the light-receiving device 110. In the display apparatus 10E, the lens 149 is provided in contact with the substrate 152. The lens 149 included in the display apparatus 10E has a convex surface on the substrate 151 side. Alternatively, the lens 149 may have a convex surface on the substrate 152 side.

In the case where the light-blocking layer BM and the lens 149 are formed on the same plane of the substrate 152, their formation order is not limited. FIG. 15B shows an example in which the lens 149 is formed first; alternatively, the light-blocking layer BM may be formed first. In FIG. 15B, an end portion of the lens 149 is covered with the light-blocking layer BM.

In the display apparatus 10E, the light 22 is incident on the light-receiving device 110 through the lens 149. With the lens 149, the imaging range of the light-receiving device 110 can be narrowed as compared to the case where the lens 149 is not provided, thereby inhibiting overlap of the imaging ranges between the adjacent light-receiving devices 110. Thus, a clear image with little blurring can be captured. Given that the imaging range of the light-receiving device 110 does not change, the lens 149 allows the size of a pinhole (corresponding to the size of an opening in the light-blocking layer BM that overlaps with the light-receiving device 110 in FIG. 15B) to be increased, compared to the case where the lens 149 is not provided. Hence, providing the lens 149 can increase the amount of light entering the light-receiving device 110.

The lens 149 having a convex surface on the substrate 152 side may be provided in contact with a top surface of the protective layer 195. A lens array may be provided on a display surface side of the substrate 152 (a surface opposite to a surface on the substrate 151 side). A lens included in the lens array is provided at the position overlapping with the light-receiving device 110. The light-blocking layer BM is preferably provided on the surface of the substrate 152 on the substrate 151 side.

As a method for forming the lens used in the display apparatus of this embodiment, a lens such as a microlens may be formed directly over the substrate or the light-receiving device, or a lens array formed separately, such as a microlens array, may be attached to the substrate.

[Display Apparatus 10F]

Figure 15C:
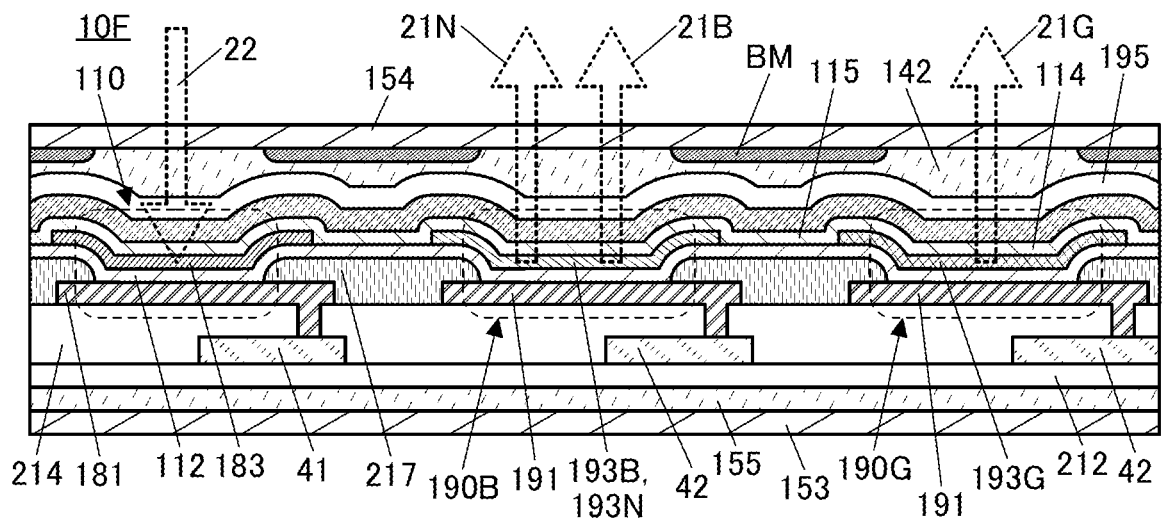

FIG. 15C shows a cross-sectional view of a display apparatus 10F.

The display apparatus 10F illustrated in FIG. 15C differs from the display apparatus 10D in that the substrate 151, the substrate 152, and the bank 216 are not included but the substrate 153, the substrate 154, the adhesive layer 155, the insulating layer 212, and a bank 217 are included.

The substrate 153 and the insulating layer 212 are attached to each other with the adhesive layer 155. The substrate 154 and the protective layer 195 are attached to each other with the adhesive layer 142.

The display apparatus 10F is formed in such a manner that the insulating layer 212, the transistor 41, the transistor 42, the light-receiving device 110, the light-emitting device 190, and the like which are formed over a formation substrate are transferred onto the substrate 153. The substrate 153 and the substrate 154 are preferably flexible. Accordingly, the flexibility of the display apparatus 10F can be increased. For example, a resin is preferably used for each of the substrate 153 and the substrate 154. As the substrate included in the display apparatus of this embodiment, a film having high optical isotropy may be used.

The bank 217 preferably absorbs light emitted by the light-emitting device. As the bank 217, a black matrix can be formed using a resin material containing a pigment or dye, for example. Moreover, the bank 217 can be formed of a colored insulating layer by using a brown resist material.

In some cases, light emitted from the light-emitting device 190 is reflected by the substrate 152 and the bank 217 and reflected light enters the light-receiving device 110, in some cases. In other cases, light emitted from the light-emitting device 190 passes through the bank 217 and is reflected by a transistor, a wiring, or the like, and thus reflected light enters the light-receiving device 110. When the bank 217 absorbs light, such reflected light can be inhibited from entering the light-receiving device 110. Consequently, noise can be reduced, and the sensitivity of a sensor using the light-receiving device 110 can be increased.

The bank 217 preferably absorbs at least light having a wavelength that is sensed by the light-receiving device 110. For example, in the case where the light-receiving device 110 senses the green light 21G emitted from the light-emitting device 190G, the bank 217 preferably absorbs at least green light. For example, when the bank 217 includes a red color filter, the bank 217 can absorb green light and thus, reflected light can be inhibited from entering the light-receiving device 110.

Note that a colored layer which absorbs light may be provided in contact with one or both of a top surface and a side surface of the bank 216 which transmits light. The colored layer preferably absorbs light emitted by the light-emitting device. As the colored layer, a black matrix can be formed using a resin material containing a pigment or dye, for example. Moreover, the colored layer can be formed of a colored insulating layer by using a brown resist material.

The colored layer preferably absorbs at least light having a wavelength that is sensed by the light-receiving device 110. For example, in the case where the light-receiving device 110 senses the green light 21G emitted from the light-emitting device 190G, the colored layer preferably absorbs at least green light. For example, when including a red color filter, the colored layer can absorb green light and thus, reflected light can be inhibited from entering the light-receiving device 110.

When the colored layer absorbs stray light generated in the display apparatus 10F, the amount of stray light entering the light-receiving device 110 can be reduced. Consequently, noise can be reduced, and the sensitivity of a sensor using the light-receiving device 110 can be increased.

In the display apparatus of this embodiment, the colored layer is provided between the light-receiving device 110 and the light-emitting device 190. This can inhibit stray light from entering the light-receiving device 110 from the light-emitting device 190.

More detailed structures of the display apparatus of one embodiment of the present invention will be described below with reference to FIG. 16 to FIG. 19.

[Display Apparatus 100A]

Figure 16:
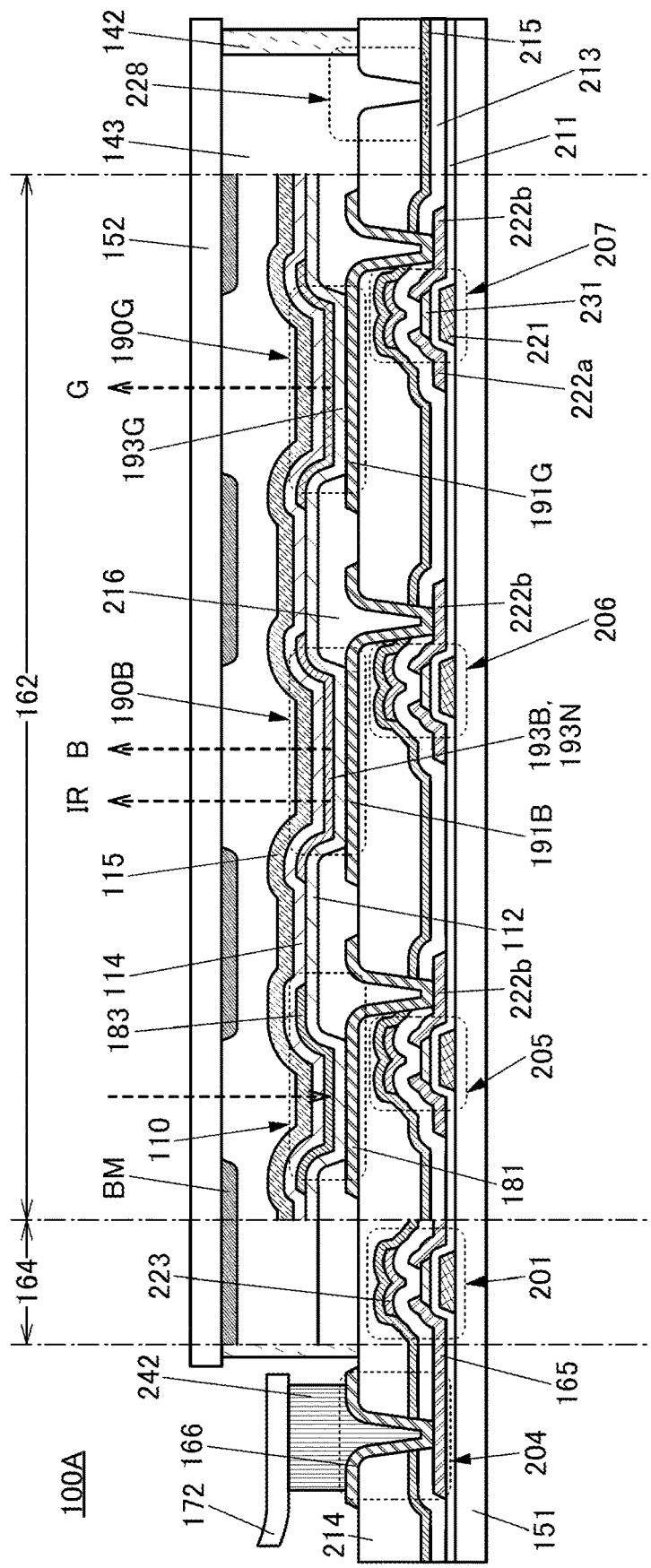
FIG. 16 is a cross-sectional view showing a display apparatus example.

FIG. 16 is a cross-sectional view of a display apparatus 100A. Note that the display apparatus 100A has the structure of the light-emitting apparatus 200A shown in FIG. 9 in which the light-emitting portion 163 is replaced with a display portion 162. In this case, the structure illustrated in FIG. 16 can be regarded as a display module including the display apparatus 100A, the IC, and the FPC.

FIG. 16 illustrates an example of a cross section including part of a region including the FPC 172, part of a region including the circuit 164, part of a region including the display portion 162, and part of a region including an end portion of the display apparatus 100A.

The display apparatus 100A in FIG. 16 includes the transistor 201, a transistor 205, the transistor 206, the transistor 207, the light-emitting device 190B, the light-emitting device 190G, the light-receiving device 110, and the like between the substrate 151 and the substrate 152.

The substrate 152 and the insulating layer 214 are bonded to each other with the adhesive layer 142. A solid sealing structure, a hollow sealing structure, or the like can be employed to seal the light-emitting device 190B, the light-emitting device 190G, and the light-receiving device 110. In FIG. 16, a hollow sealing structure is employed in which a space 143 surrounded by the substrate 152, the adhesive layer 142, and the insulating layer 214 is filled with an inert gas (e.g., nitrogen or argon). The adhesive layer 142 may overlap with the light-emitting device 190B, the light-emitting device 190G, and the light-receiving device 110. The space 143 surrounded by the substrate 152, the adhesive layer 142, and the insulating layer 214 may be filled with a resin different from that of the adhesive layer 142.

The light-emitting device 190B has a stacked-layer structure in which the pixel electrode 191B, the common layer 112, the light-emitting layer 193N, the light-emitting layer 193B, the common layer 114, and the common electrode 115 are stacked in this order from the insulating layer 214 side. The pixel electrode 191B is connected to the conductive layer 222b included in the transistor 206 through an opening provided in the insulating layer 214. The transistor 206 has a function of controlling the driving of the light-emitting device 190B.

The light-emitting device 190G has a stacked-layer structure in which the pixel electrode 191G, the common layer 112, the light-emitting layer 193G, the common layer 114, and the common electrode 115 are stacked in this order from the insulating layer 214 side. The pixel electrode 191G is connected to the conductive layer 222b included in the transistor 207 through an opening provided in the insulating layer 214. The transistor 207 has a function of controlling the driving of the light-emitting device 190G.

The end portion of the pixel electrode 191B and the end portion of the pixel electrode 191G are covered with the bank 216. The pixel electrode 191B and the pixel electrode 191G include a material that reflects visible light and infrared light, and the common electrode 115 includes a material that transmits visible light and infrared light.

The light-receiving device 110 has a stacked-layer structure in which the pixel electrode 181, the common layer 112, the active layer 183, the common layer 114, and the common electrode 115 are stacked in that order from the insulating layer 214 side. The pixel electrode 181 is electrically connected to the conductive layer 222b included in the transistor 205 through an opening provided in the insulating layer 214. The end portion of the pixel electrode 181 is covered with the bank 216. The pixel electrode 181 includes a material that reflects visible light and infrared light, and the common electrode 115 includes a material that transmits visible light and infrared light.

Light emitted from the light-emitting device 190 is emitted toward the substrate 152. Light enters the light-receiving device 110 through the substrate 152 and the space 143. For the substrate 152, a material having high visible-light- and infrared-light-transmitting properties is preferably used.

The pixel electrode 181 and the pixel electrode 191 can be formed using the same material in the same step. The common layer 112, the common layer 114, and the common electrode 115 are used in both the light-receiving device 110 and the light-emitting device 190. The light-receiving device 110 and the light-emitting device 190 can have a common structure except for the active layer 183 and the light-emitting layer 193. Thus, the light-receiving device 110 can be incorporated into the display apparatus 100A without a significant increase in the number of manufacturing steps.

The light-blocking layer BM is provided on the surface of the substrate 152 on the substrate 151 side. The light-blocking layer BM has an opening at a position overlapping with the light-receiving device 110 and an opening at a position overlapping with the light-emitting device 190. Providing the light-blocking layer BM can control the range where the light-receiving device 110 detects light. Furthermore, with the light-blocking layer BM, light can be prevented from directly entering the light-receiving device 110 from the light-emitting device 190 without passing through any object. Hence, a sensor with less noise and high sensitivity can be obtained.

The transistor 201, the transistor 205, the transistor 206, and the transistor 207 are formed over the substrate 151. These transistors can be fabricated using the same material in the same step.

The insulating layer 211, the insulating layer 213, the insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that the number of gate insulating layers and the number of insulating layers covering the transistor are not limited and either a single layer or two or more layers may be employed.

A material through which impurities such as water and hydrogen do not easily diffuse is preferably used for at least one of the insulating layers that cover the transistors. Thus, such an insulating layer can serve as a barrier layer. Such a structure can effectively inhibit diffusion of impurities into the transistors from the outside and increase the reliability of the display apparatus.

An inorganic insulating film is preferably used as each of the insulating layer 211, the insulating layer 213, and the insulating layer 215.

Here, an organic insulating film often has a lower barrier property than an inorganic insulating film. Therefore, the organic insulating film preferably has an opening in the vicinity of an end portion of the display apparatus 100A. This can inhibit entry of impurities from the end portion of the display apparatus 100A through the organic insulating film. Alternatively, the organic insulating film may be formed so that its end portion is positioned on the inner side compared to the end portion of the display apparatus 100A, to prevent the organic insulating film from being exposed at the end portion of the display apparatus 100A.

An organic insulating film is suitable for the insulating layer 214 functioning as a planarization layer. In the region 228 illustrated in FIG. 16, an opening is formed in the insulating layer 214. This can inhibit entry of impurities into the display portion 162 from the outside through the insulating layer 214 even when an organic insulating film is used as the insulating layer 214. Consequently, the display apparatus 100A can have higher reliability.

The transistor included in the display apparatus 100A has a structure similar to that of the transistor included in the light-emitting apparatus 200A (FIG. 10A) and thus, detailed description thereof is omitted.

There is no particular limitation on the structure of the transistors included in the display apparatus of this embodiment. To the display apparatus of this embodiment, for example, the transistor that is described in Embodiment 1 and that can be used for the light-emitting apparatus can be applied.

A connection portion 204 is provided in a region of the substrate 151 not overlapping with the substrate 152. In the connection portion 204, the wiring 165 is electrically connected to the FPC 172 via the conductive layer 166 and the connection layer 242. On the top surface of the connection portion 204, the conductive layer 166 obtained by processing the same conductive film as the pixel electrode 191 is exposed. Thus, the connection portion 204 and the FPC 172 can be electrically connected to each other through the connection layer 242.

Any of a variety of optical members can be arranged on the outer side of the substrate 152. Examples of the optical members include a polarizing plate, a retardation plate, a light diffusion layer (a diffusion film or the like), an anti-reflective layer, and a light-condensing film. Furthermore, an antistatic film preventing the attachment of dust, a water repellent film suppressing the attachment of stain, a hard coat film inhibiting generation of a scratch caused by the use, a shock absorbing layer or the like may be arranged on the outside of the substrate 152.

To the material that can be used for each component of the display apparatus, the material that is described in Embodiment 1 and that can be used for each component that can be used for the light-emitting apparatus can be applied.

The light-emitting device 190 may have a top emission, bottom emission, or dual emission structure, for example. A conductive film that transmits visible light and infrared light is used as the electrode through which light is extracted. A conductive film that reflects visible light and infrared light is preferably used as the electrode through which no light is extracted.

The light-emitting device 190B emits infrared light (IR) and blue (B) light. The light-emitting device 190B includes at least the light-emitting layer 193B and the light-emitting layer 193N. The light-emitting device 190G emits green (G) light. The light-emitting device 190G includes at least the light-emitting layer 193G. In addition to the light-emitting layer 193, the light-emitting device 190 may further include a layer containing a substance with a high hole-injection property, a substance with a high hole-transport property, a hole-blocking material, a substance with a high electron-transport property, a substance with a high electron-injection property, a substance with a bipolar property, or the like. For example, the common layer 112 preferably includes one or both of a hole-injection layer and a hole-transport layer. For example, the common layer 114 preferably includes one or both of an electron-transport layer and an electron-injection layer.

Either a low molecular compound or a high molecular compound can be used for the common layer 112, the light-emitting layer 193, and the common layer 114 and an inorganic compound may also be contained. The layers that constitute the common layer 112, the light-emitting layer 193, and the common layer 114 can each be formed by a method such as an evaporation method (including a vacuum evaporation method), a transfer method, a printing method, an inkjet method, or a coating method.

The light-emitting layer 193 may contain an inorganic compound such as quantum dots as a light-emitting material.

The active layer 183 of the light-receiving device 110 contains a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer 193 of the light-emitting device 190 and the active layer 183 of the light-receiving device 110 can be formed by the same method (e.g., a vacuum evaporation method) and thus the same manufacturing apparatus can be used.

Examples of an n-type semiconductor material included in the active layer 183 are electron-accepting organic semiconductor materials such as fullerene (e.g., $C_{60}$ and $C_{70}$) and derivatives thereof. As an example of a p-type semiconductor material included in the active layer 183, an electron-donating organic semiconductor material such as copper(II) phthalocyanine (CuPc) or tetraphenyldibenzoperiflanthene (DBP) can be given.

For example, the active layer 183 is preferably formed by co-evaporation of an n-type semiconductor and a p-type semiconductor.

[Display Apparatus 100B]

FIG. 17A shows a cross-sectional view of a display apparatus 100B.

The display apparatus 100B is different from the display apparatus 100A mainly in that the lens 149 and the protective layer 195 are included.

Providing the protective layer 195 covering the light-receiving device 110 and the light-emitting device 190 can inhibit entry of impurities such as water into the light-receiving device 110 and the light-emitting device 190, so that the reliability of the light-receiving device 110 and the light-emitting device 190 can be increased.

In the region 228 in the vicinity of an end portion of the display apparatus 100B, the insulating layer 215 and the protective layer 195 are preferably in contact with each other through an opening in the insulating layer 214. In particular, the inorganic insulating film included in the insulating layer 215 and the inorganic insulating film included in the protective layer 195 are preferably in contact with each other. Thus, entry of impurities from the outside into the display portion 162 through the organic insulating film can be inhibited. Consequently, the display apparatus 100B can have higher reliability.

FIG. 17B illustrates an example in which the protective layer 195 has a three-layer structure. In FIG. 17B, the protective layer 195 includes an inorganic insulating layer 195a over the common electrode 115, an organic insulating layer 195b over the inorganic insulating layer 195a, and an inorganic insulating layer 195c over the organic insulating layer 195b.

An end portion of the inorganic insulating layer 195a and an end portion of the inorganic insulating layer 195c extend beyond an end portion of the organic insulating layer 195b and are in contact with each other. The inorganic insulating layer 195a is in contact with the insulating layer 215 (inorganic insulating layer) through the opening in the insulating layer 214 (organic insulating layer). Accordingly, the light-receiving device 110 and the light-emitting device 190 can be surrounded by the insulating layer 215 and the protective layer 195, whereby the reliability of the light-receiving device 110 and the light-emitting device 190 can be increased.

As described above, the protective layer 195 may have a stacked-layer structure of an organic insulating film and an inorganic insulating film. In that case, an end portion of the inorganic insulating film preferably extends beyond an end portion of the organic insulating film.

The lens 149 is provided on the surface of the substrate 152 on the substrate 151 side. The lens 149 has the convex surface on the substrate 151 side. It is preferable that the light-receiving region of the light-receiving device 110 overlap with the lens 149 and not overlap with the light-emitting layer 193. Thus, the sensitivity and accuracy of a sensor using the light-receiving device 110 can be increased.

The lens 149 preferably has a refractive index greater than or equal to 1.3 and less than or equal to 2.5. The lens 149 can be formed using at least one of an inorganic material and an organic material. For example, a material containing a resin can be used for the lens 149. Moreover, a material containing at least one of an oxide and a sulfide can be used for the lens 149.

Specifically, a resin containing chlorine, bromine, or iodine, a resin containing a heavy metal atom, a resin having an aromatic ring, a resin containing sulfur, and the like can be used for the lens 149. Alternatively, a material containing a resin and nanoparticles of a material having a higher refractive index than the resin can be used for the lens 149. Titanium oxide, zirconium oxide, or the like can be used for the nanoparticles.

In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, and the like can be used for the lens 149. Alternatively, zinc sulfide or the like can be used for the lens 149.

In the display apparatus 100B, the protective layer 195 and the substrate 152 are attached to each other with the adhesive layer 142. The adhesive layer 142 is provided to overlap with the light-receiving device 110 and the light-emitting device 190; that is, the display apparatus 100B employs a solid sealing structure.

[Display Apparatus 100C]

FIG. 18A shows a cross-sectional view of a display apparatus 100C.

The display apparatus 100C differs from the display apparatus 100B in transistor structures.

The display apparatus 100C includes the transistor 202, a transistor 209, and the transistor 210 over the substrate 151.

The transistor included in the display apparatus 100C has a structure similar to that of the transistor included in the light-emitting apparatus 200B (FIG. 11A) and thus, detailed description thereof is omitted.

FIG. 18A illustrates an example in which the insulating layer 225 covers a top surface and a side surface of the semiconductor layer. Meanwhile, in FIG. 18B, the insulating layer 225 overlaps with the channel formation region 231$i$ of the semiconductor layer 231 and does not overlap with the low-resistance regions 231$n$. The structure illustrated in FIG. 18B can be obtained by processing the insulating layer 225 with the conductive layer 223 as a mask, for example. In FIG. 18B, the insulating layer 215 is provided to cover the insulating layer 225 and the conductive layer 223, and the conductive layer 222$a$ and the conductive layer 222$b$ are connected to the low-resistance regions 231$n$ through the openings in the insulating layer 215. Furthermore, the insulating layer 218 covering the transistor may be provided.

[Display Apparatus 100D]

Figure 19:
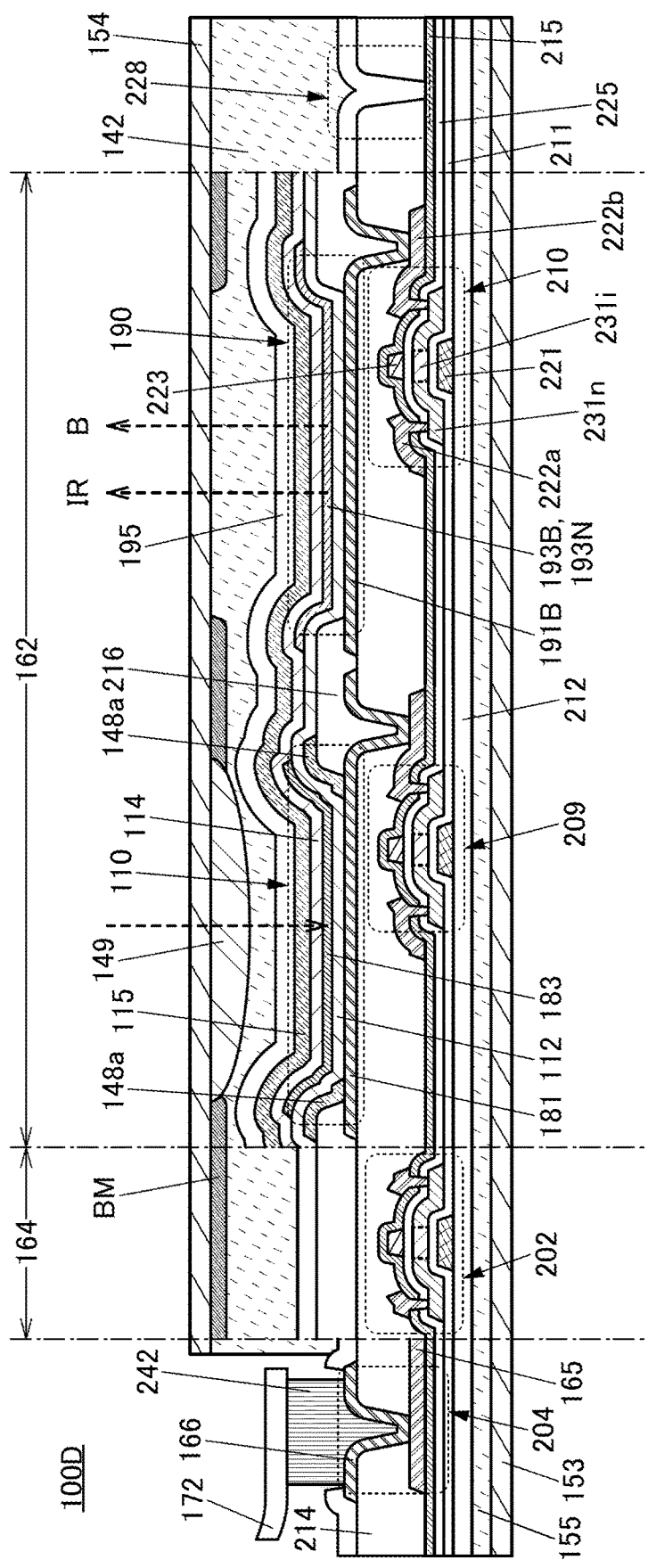
FIG. 19 is a cross-sectional view showing a display apparatus example.

FIG. 19 shows a cross-sectional view of a display apparatus 100D.

The display apparatus 100D is different from the display apparatus 100C in that a colored layer 148$a$ is included.

The colored layer 148$a$ includes a portion in contact with a top surface of the pixel electrode 181 in the light-receiving device 110 and a portion in contact with a side surface of the bank 216.

When the colored layer 148$a$ absorbs stray light generated in the display apparatus 100D, the amount of stray light entering the light-receiving device 110 can be reduced. Consequently, noise can be reduced, and the sensitivity of a sensor using the light-receiving device 110 can be increased.

In addition, the display apparatus 100D differs from the display apparatus 100C in that neither the substrate 151 nor the substrate 152 is included and that the substrate 153, the substrate 154, the adhesive layer 155, and the insulating layer 212 are included.

The substrate 153 and the insulating layer 212 are attached to each other with the adhesive layer 155. The substrate 154 and the protective layer 195 are attached to each other with the adhesive layer 142.

The display apparatus 100D is formed in such a manner that the insulating layer 212, the transistor 202, the transistor 209, the transistor 210, the light-receiving device 110, the light-emitting device 190, and the like which are formed over a formation substrate are transferred onto the substrate 153. The substrate 153 and the substrate 154 are preferably flexible. Accordingly, the flexibility of the display apparatus 100D can be increased.

The inorganic insulating film that can be used as the insulating layer 211, the insulating layer 213, and the insulating layer 215 can be used as the insulating layer 212.

The display apparatus 100C shows an example in which the lens 149 is not provided, and the display apparatus 100D shows an example in which the lens 149 is provided. The lens 149 can be provided as appropriate in accordance with usage of a sensor or the like.

As described above, the display apparatus of this embodiment includes, in a display portion, a light-emitting device emitting visible light and infrared light, a light-emitting device emitting visible light, and a light-receiving device detecting at least part of visible light and infrared light. The display portion has both a function of displaying an image and a function of detecting light. Thus, the size and weight of an electronic device can be reduced as compared to the case where a sensor is provided outside a display portion or outside a display apparatus. Moreover, an electronic device having more functions can be obtained by a combination of the display apparatus of this embodiment and a sensor provided outside the display portion or outside the display apparatus.

The light-receiving device can share at least one of the layers other than the active layer with the light-emitting device (EL device). The light-receiving device can also share all of the layers other than the active layer with the light-emitting device (EL device). For example, with only the addition of the step of depositing the active layer to the manufacturing process of the light-emitting device, the light-emitting device and the light-receiving device can be formed over one substrate. In the light-receiving device and the light-emitting device, their pixel electrodes can be formed using the same material in the same step, and their common electrodes can be formed using the same material in the same step. When a circuit electrically connected to the light-receiving device and a circuit electrically connected to the light-emitting device are formed using the same material in the same step, the manufacturing process of the display apparatus can be simplified. In such a manner, a display apparatus that incorporates a light-receiving device and is highly convenient can be manufactured without complicated steps.

This embodiment can be combined with the other embodiments as appropriate.

Embodiment 3

In this embodiment, materials that can be used in a light-emitting device of one embodiment of the present invention will be described.

<Electrode>

For the pair of electrodes of the light-emitting device, a metal, an alloy, an electrically conductive compound, a mixture thereof, and the like can be used as appropriate. Specific examples include In—Sn oxide (also referred to as ITO), In—Si—Sn oxide (also referred to as ITSO), In—Zn oxide, and In—W—Zn oxide. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these, graphene, or the like.

To fabricate a light-emitting device having a microcavity structure, a reflective electrode and a semi-transmissive and semi-reflective electrode are used. Thus, a single layer or stacked layers can be formed using one or more desired conductive materials. For fabrication of the electrodes, a sputtering method or a vacuum evaporation method can be used.

<Hole-Injection Layer and Hole-Transport Layer>

The hole-injection layer is a layer injecting holes from an anode to the light-emitting unit, and is a layer including a material with a high hole-injection property.

As the material with a high hole-injection property, a transition metal oxide such as molybdenum oxide, vanadium oxide, ruthenium oxide, tungsten oxide, or manganese oxide or a phthalocyanine-based compound such as phthalocyanine (abbreviation: H$_2$Pc) or copper phthalocyanine (abbreviation: CuPc) can be used, for example.

As the material with a high hole-injection property, it is possible to use, for example, an aromatic amine compound such as 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N-(3-methylphenyl)-N-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), or 3-[N-(1-naphthyl)-N-(9-phenylcarbazol-3-yl)amino]-9-phenylcarbazole (abbreviation: PCzPCN1).

As the material with a high hole-injection property, it is possible to use, for example, poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl)methacrylamide](abbreviation: PTPDMA), or poly[N,N-bis(4-butylphenyl)-N,N-bis(phenyl)benzidine](abbreviation: Poly-TPD); or it is also possible to use, for example, a high molecular compound to which acid is added, such as poly(3,4-ethylenedioxythiophene)/poly(styrenesulfonic acid) (abbreviation: PEDOT/PSS) or polyaniline/poly(styrenesulfonic acid) (PAni/PSS).

As the material with a high hole-injection property, a composite material containing a hole-transport material and an acceptor material (an electron-accepting material) can also be used. In this case, the acceptor material extracts electrons from the hole-transport material, so that holes are generated in the hole-injection layer and the holes are injected into the light-emitting layer through the hole-transport layer. Note that the hole-injection layer may be formed using a single layer of a composite material containing a hole-transport material and an acceptor material, or may be formed using a stack including a layer of a hole-transport material and a layer of an acceptor material.

The hole-transport layer is a layer transporting holes, which are injected from the anode by the hole-injection layer, to the light-emitting layer. The hole-transport layer is a layer including a hole-transport material. It is particularly preferable that the HOMO level of the hole-transport material used in the hole-transport layer be the same as or close to the HOMO level of the hole-injection layer.

As the acceptor material used for the hole-injection layer, an oxide of a metal belonging to any of Group 4 to Group 8 of the periodic table can be used. Specific examples include molybdenum oxide, vanadium oxide, niobium oxide, tantalum oxide, chromium oxide, tungsten oxide, manganese oxide, and rhenium oxide. Among these, molybdenum oxide is particularly preferable since it is stable in the air, has a low hygroscopic property, and is easy to handle. Alternatively, organic acceptors such as a quinodimethane derivative, a chloranil derivative, and a hexaazatriphenylene derivative can be used. Examples of compounds having an electron-withdrawing group (halogen group or cyano group) include 7,7,8,8-tetracyano-2,3,5,6-tetrafluoroquinodimethane (abbreviation: F$_4$-TCNQ), chloranil, 2,3,6,7,10,11-hexacyano-1,4,5,8,9,12-hexaazatriphenylene (abbreviation: HAT-CN), and 1,3,4,5,7,8-hexafluorotetracyano-naphthoquinodimethane (abbreviation: F6-TCNNQ). A compound in which electron-withdrawing groups are bonded to a fused aromatic ring having a plurality of hetero atoms, such as HAT-CN, is particularly preferable because it is thermally stable. A [3]radialene derivative including an electron-withdrawing group (in particular, a cyano group or a halogen group such as a fluoro group) has a very high electron-accepting property and thus is preferred; specific examples include α,α',α,''-1,2,3-cyclopropanetriylidenetris[4-cyano-2,3,5,6-tetrafluorobenzeneacetonitrile], α,α',σ''-1,2,3-cyclopropanetriylidenetris[2,6-dichloro-3,5-difluoro-4-(trifluoromethyl)benzeneacetonitrile], and α,α',α''-1,2,3-cyclopropanetriylidenetris[2,3,4,5,6-pentafluorobenzeneacetonitrile].

The hole-transport materials used for the hole-injection layer and the hole-transport layer are preferably substances with a hole mobility greater than or equal to $10^{-6}$ cm$^2$/Vs. Note that other substances can also be used as long as they have a hole-transport property higher than an electron-transport property.

As the hole-transport material, materials having a high hole-transport property, such as a π-electron-rich heteroaromatic compound (e.g., a carbazole derivative, a thiophene derivative, and a furan derivative) and an aromatic amine (a compound having an aromatic amine skeleton), are preferable.

Examples of the carbazole derivative (a compound having a carbazole skeleton) include a bicarbazole derivative (e.g., a 3,3'-bicarbazole derivative) and an aromatic amine having a carbazolyl group.

Specific examples of the bicarbazole derivative (e.g., a 3,3'-bicarbazole derivative) include 3,3'-bis(9-phenyl-9H-carbazole) (abbreviation: PCCP), 9,9'-bis(1,1'-biphenyl-4-yl)-3,3'-bi-9H-carbazole, 9,9'-bis(1,1'-biphenyl-3-yl)-3,3'-bi-9H-carbazole, 9-(1,1'-biphenyl-3-yl)-9'-(1,1'-biphenyl-4-yl)-9H,9'H-3,3'-bicarbazole (abbreviation: mBPCCBP), and 9-(2-naphthyl)-9'-phenyl-9H,9'H-3,3'-bicarbazole (abbreviation: βNCCP).

Specific examples of the aromatic amine having a carbazolyl group include 4-phenyl-4'-(9-phenyl-9H-carbazol-3-yl)triphenylamine (abbreviation: PCBA1BP), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N-bis(9-phenylcarbazol-3-yl)-N,N-diphenylbenzene-1,3-diamine (abbreviation: PCA2B), N,N,N'-triphenyl-N,N,N'-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), PCzPCA1, PCzPCA2, PCzPCN1, 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl)phenylaniline (abbreviation: YGA1BP), N,N-bis[4-(carbazol-9-yl)phenyl]-N,N-diphenyl-9,9-dimethylfluorene-2,7-diamine (abbreviation: YGA2F), and 4,4',4''-tris(carbazol-9-yl)triphenylamine (abbreviation: TCTA).

In addition to the above, other examples of the carbazole derivative include 3-[4-(9-phenanthryl)-phenyl]-9-phenyl-9H-carbazole (abbreviation: PCPPn), 3-[4-(1-naphthyl)-phenyl]-9-phenyl-9H-carbazole (abbreviation: PCPN), 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA).

Specific examples of the thiophene derivative (a compound having a thiophene skeleton) and the furan derivative (a compound having a furan skeleton) include compounds having a thiophene skeleton, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV), 4,4',4''-(benzene-1,3,5-triyl)tri(dibenzofuran) (abbreviation: DBF3P-II), and 4-{3-[3-(9-phenyl-9H-fluoren-9-yl)phenyl]phenyl}dibenzofuran (abbreviation: mmDBFFLBi-II).

Specific examples of the aromatic amine include 4,4'-bis[N-(1-naphthyl)-N-phenylamino]biphenyl (abbreviation: NPB or α-NPD), N,N-bis(3-methylphenyl)-N,N-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 2,7-bis[N-(4-diphenylaminophenyl)-N-phenylamino]spiro-9,9'-bifluorene (abbreviation: DPA2SF), 4,4',4''-tris[N-(1-naphthyl)-N-phenylamino]triphenylamine (abbreviation: 1-TNATA), TDATA, m-MTDATA, N,N-di(p-tolyl)-N,N-diphenyl-p-phenylenediamine (abbreviation: DTDPPA), DPAB, DNTPD, and DPA3B.

As the hole-transport material, a high molecular compound such as PVK, PVTPA, PTPDMA, or Poly-TPD can also be used.

The hole-transport material is not limited to the above examples, and one of or a combination of various known materials can be used as the hole-transport material in the hole-injection layer and the hole-transport layer.

<Light-Emitting Layer>

The light-emitting layer is a layer including a light-emitting substance. The light-emitting layer can include one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

The light-emitting layer may contain one or more kinds of organic compounds (e.g., a host material and an assist material) in addition to the light-emitting substance (guest material). As the one or more kinds of organic compounds, one or both of the hole-transport material and the electron-transport material described in this embodiment can be used. As the one or more kinds of organic compounds, a bipolar material may be used.

There is no particular limitation on the light-emitting substance that can be used for the light-emitting layer, and it is possible to use a light-emitting substance that converts singlet excitation energy into light emission in the visible light region or the near-infrared light region or a light-emitting substance that converts triplet excitation energy into light emission in the visible light region or the near-infrared light region.

As an example of the light-emitting substance that converts singlet excitation energy into light emission, a substance that exhibits fluorescence (a fluorescent material) can be given; examples include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N-bis(3-methylphenyl)-N,N-bis[3-(9-phenyl-9H-fluoren-9-yl)phenyl]pyrene-1,6-diamine (abbreviation: 1,6mMemFLPAPrn), N,N-diphenyl-N,N-bis[4-(9-phenyl-9H-fluoren-9-yl)phenyl]pyrene-1,6-diamine (abbreviation: 1,6FLPAPrn), N,N-bis(dibenzofuran-2-yl)-N,N-diphenylpyrene-1,6-diamine (abbreviation: 1,6FrAPrn), N,N-bis(dibenzothiophen-2-yl)-N,N-diphenylpyrene-1,6-diamine (abbreviation: 1,6ThAPrn), N,N-(pyrene-1,6-diyl)bis[(N-phenylbenzo[b]naphtho[1,2-d]furan)-6-amine] (abbreviation: 1,6BnfAPrn), N,N-(pyrene-1,6-diyl)bis[(N-phenylbenzo[b]naphtho[1,2-d]furan)-8-amine](abbreviation: 1,6BnfAPrn-02), and N,N-(pyrene-1,6-diyl)bis[(6,N-diphenylbenzo[b]naphtho[1,2-d]furan)-8-amine] (abbreviation: 1,6BnfAPrn-03).

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), or the like.

Examples of the light-emitting substance that converts triplet excitation energy into light emission include a substance that exhibits phosphorescence (a phosphorescent material) and a thermally activated delayed fluorescence (TADF) material that exhibits thermally activated delayed fluorescence.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine skeleton including an electron-withdrawing group as a ligand; a platinum complex; and a rare earth metal complex.

As examples of a phosphorescent material that exhibits blue or green and whose emission spectrum has a peak wavelength of greater than or equal to 450 nm and less than or equal to 570 nm, the following substances can be given.

The examples include organometallic complexes including a 4H-triazole skeleton, such as tris{2-[5-(2-methylphenyl)-4-(2,6-dimethylphenyl)-4H-1,2,4-triazol-3-yl-κN$^2$]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr5btz)$_3$]); organometallic complexes including a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes including an imidazole skeleton, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); organometallic complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)); and the like.

As examples of a phosphorescent material that exhibits green or yellow and whose emission spectrum has a peak wavelength of greater than or equal to 495 nm and less than or equal to 590 nm, the following substances can be given.

The examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato)bis{4,6-dimethyl-2-[6-(2,6-dimethylphenyl)-4-pyrimidinyl-κN$^3$]phenyl-κC}iridium(III) (abbreviation: [Ir(dmppm-dmp)$_2$(acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), bis(2-phenylquinolinato-N,C$^{2'}$)iridium(III) acetylacetonate (abbreviation: [Ir(pq)$_2$(acac)]), [2-(4-phenyl-2-pyridinyl-κN)phenyl-κC]bis[2-(2-pyridinyl-κN)phenyl-κC]iridium(III) (abbreviation: [Ir(ppy)$_2$(4dppy)]), and bis[2-(2-pyridinyl-κN)phenyl-κC][2-(4-methyl-5-phenyl-2-pyridinyl-κN)phenyl-κC]; organometallic complexes such as bis(2,4-diphenyl-1,3-oxazolato-N,C$^{2'}$)iridium(III) acetylacetonate (abbreviation: [Ir(dpo)$_2$(acac)]), bis{2-[4'-(perfluorophenyl)phenyl]pyridinato-N,C$^{2'}$}iridium(III) acetylacetonate (abbreviation: [Ir(p-PF-ph)$_2$(acac)]), and bis(2-phenylbenzothiazolato-N,C$^{2'}$)iridium(III) acetylacetonate (abbreviation: [Ir(bt)$_2$(acac)]); and rare earth metal complexes such as tris(acetylacetonato)(monophenanthroline)terbium(III) (abbreviation: [Tb(acac)$_3$(Phen)]).

As examples of a phosphorescent material that exhibits yellow or red and whose emission spectrum has a peak wavelength of greater than or equal to 570 nm and less than or equal to 750 nm, the following substances can be given.

The examples include organometallic complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), bis[4,6-di(naphthalen-1-yl)pyrimidinato](dipivaloylmethanato)iridium(III) (abbreviation: [Ir(d1npm)$_2$(dpm)]), and tris(4-t-butyl-6-phenylpyrimidinato)iridium(III) (abbreviation: [Ir(tBuppm)$_3$]); organometallic complexes having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), bis{4,6-dimethyl-2-[3-(3,5-dimethylphenyl)-5-phenyl-2-pyrazinyl-N]phenyl-κC}(2,6-dimethyl-3,5-heptanedionato-κ$^2$O,O')iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl)-2-pyrazinyl-N]phenyl-κC}(2,2,6,6-tetramethyl-3,5-heptanedionato-κ$^2$O,O')iridium(III) (abbreviation: [Ir(dmdppr-dmCP)$_2$(dpm)]), (acetylacetonato)bis[2-methyl-3-phenylquinoxalinato-N,C$^{2'}$]iridium(III) (abbreviation: [Ir(mpq)$_2$(acac)]), (acetylacetonato)bis(2,3-diphenylquinoxalinato-N,C$^{2'}$)iridium(III) (abbreviation: [Ir(dpq)$_2$(acac)]), (acetylacetonato)bis[2,3-bis(4-fluorophenyl)quinoxalinato]iridium(III) (abbreviation: [Ir(Fdpq)$_2$(acac)]), and bis{4,6-dimethyl-2-[5-(5-cyano-2-methylphenyl)-3-(3,5-dimethylphenyl)-2-pyrazinyl-N]phenyl-κC}(2,2,6,6-tetramethyl-3,5-heptanedionato-κ$^2$O,O')iridium(III) (abbreviation: [Ir(dmdppr-m5CP)$_2$(dpm)]); organometallic complexes having a pyridine skeleton, such as tris(1-phenylisoquinolinato-N,C$^{2'}$)iridium(III) (abbreviation: [Ir(piq)$_3$]), bis(1-phenylisoquinolinato-N,C$^{2'}$)iridium(III) acetylacetonate (abbreviation: [Ir(piq)$_2$(acac)]), and bis[4,6-dimethyl-2-(2-quinolinyl-κN)phenyl-κC](2,4-pentanedionato-κ$^2$O,O')iridium(III); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-propanedionato)(monophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]).

As the organic compounds (e.g., the host material and the assist material) used in the light-emitting layer, one or more kinds of substances having a larger energy gap than the light-emitting substance can be used.

In the case where the light-emitting substance used in the light-emitting layer is a fluorescent material, an organic compound used in combination with the light-emitting substance is preferably an organic compound that has a high energy level in a singlet excited state and has a low energy level in a triplet excited state.

In terms of a preferable combination with the light-emitting substance (the fluorescent material or the phosphorescent material), specific examples of the organic compounds are shown below though some of them overlap the specific examples shown above.

In the case where the light-emitting substance is a fluorescent material, examples of the organic compound that can be used in combination with the light-emitting substance include fused polycyclic aromatic compounds, such as an anthracene derivative, a tetracene derivative, a phenanthrene derivative, a pyrene derivative, a chrysene derivative, and a dibenzo[g,p]chrysene derivative.

Specific examples of the organic compound (the host material) used in combination with the fluorescent material include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), PCPN, 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenylchrysene, N,N,N,N,N',N',N'',N''-octaphenyldibenzo[g,p]chrysene-2,7,10,15-tetraamine (abbreviation: DBC1), CzPA, 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)-biphenyl-4'-yl}anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, and 5,12-bis(biphenyl-2-yl)tetracene.

In the case where the light-emitting substance is a phosphorescent material, as the organic compound used in combination with the light-emitting substance, an organic compound that has higher triplet excitation energy (energy difference between a ground state and a triplet excited state) than the light-emitting substance is selected.

In the case where a plurality of organic compounds (e.g., a first host material and a second host material (or an assist material)) are used in combination with the light-emitting substance in order to form an exciplex, the plurality of organic compounds are preferably mixed with a phosphorescent material (particularly an organometallic complex).

Such a structure makes it possible to efficiently obtain light emission utilizing ExTET (Exciplex-Triplet Energy Transfer), which is energy transfer from an exciplex to a light-emitting substance. Note that a combination of a plurality of organic compounds that easily forms an exciplex is preferable, and it is particularly preferable to combine a compound that easily accepts holes (a hole-transport material) and a compound that easily accepts electrons (an electron-transport material). As the hole-transport material and the electron-transport material, specifically, any of the materials described in this embodiment can be used. With this structure, high efficiency, low voltage, and a long lifetime of the light-emitting device can be achieved at the same time.

In the case where the light-emitting substance is a phosphorescent material, examples of the organic compounds that can be used in combination with the light-emitting substance include an aromatic amine, a carbazole derivative, a dibenzothiophene derivative, a dibenzofuran derivative, a zinc- or aluminum-based metal complex, an oxadiazole derivative, a triazole derivative, a benzimidazole derivative, a quinoxaline derivative, a dibenzoquinoxaline derivative, a pyrimidine derivative, a triazine derivative, a pyridine derivative, a bipyridine derivative, and a phenanthroline derivative.

Specific examples of the aromatic amine (a compound having an aromatic amine skeleton), the carbazole derivative, the dibenzothiophene derivative (thiophene derivative), and the dibenzofuran derivative (furan derivative), which are organic compounds having a high hole-transport property, include the compounds given above as the specific examples of a hole-transport material.

Specific examples of the zinc- and aluminum-based metal complexes, which are organic compounds having a high electron-transport property, include metal complexes having a quinoline skeleton or a benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq2), bis(2-methyl-8-quinolinolato)(4-phenylphenolato)aluminum(III) (abbreviation: BAlq), and bis(8-quinolinolato)zinc(II) (abbreviation: Znq).

A metal complex having an oxazole-based or thiazole-based ligand such as bis[2-(2-benzoxazolyl)phenolato]zinc(II) (abbreviation: ZnPBO) or bis[2-(2-benzothiazolyl)phenolato]zinc(II) (abbreviation: ZnBTZ), or the like can also be used.

Specific examples of the oxadiazole derivative, the triazole derivative, the benzimidazole derivative, the quinoxaline derivative, the dibenzoquinoxaline derivative, and the phenanthroline derivative, which are organic compounds having a high electron-transport property, include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), 4,4'-bis(5-methylbenzoxazol- 2-yl)stilbene (abbreviation: BzOs, bathophenanthroline (abbreviation: Bphen), bathocuproine (abbreviation: BCP), 2,9-bis(naphthalen-2-yl)-4,7-diphenyl-1,10-phenanthroline (abbreviation: NBphen), 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Specific examples of a heterocyclic compound having a diazine skeleton, a heterocyclic compound having a triazine skeleton, and a heterocyclic compound having a pyridine skeleton, which are organic compounds having a high electron-transport property, include 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 3,5-bis[3-(9H-carbazol-9-yl)phenyl]pyridine (abbreviation: 35DCzPPy), and 1,3,5-tri[3-(3-pyridyl)phenyl]benzene (abbreviation: TmPyPB).

As the organic compound having a high electron-transport property, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can also be used.

The TADF material is a material that can up-convert a triplet excited state into a singlet excited state (reverse intersystem crossing) using a little thermal energy and efficiently exhibits light emission (fluorescence) from the singlet excited state. Thermally activated delayed fluorescence is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV. Delayed fluorescence by the TADF material refers to light emission having a spectrum similar to that of normal fluorescence and an extremely long lifetime. The lifetime is $10^{-6}$ seconds or longer, preferably $10^{-3}$ seconds or longer.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2OEP$).

It is possible to use a heterocyclic compound having a π-electron-rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), PCCzPTzn, 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-кanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA). Note that a substance in which a π-electron-rich heteroaromatic ring is directly bonded to a π-electron deficient heteroaromatic ring is particularly preferable because both the donor property of the π-electron-rich heteroaromatic ring and the acceptor property of the π-electron deficient heteroaromatic ring are improved and the energy difference between the singlet excited state and the triplet excited state becomes small.

Note that the TADF material can also be used in combination with another organic compound. In particular, the TADF material can be used in combination with the host material, the hole-transport material, and the electron-transport material which are described above.

Furthermore, when used in combination with a low molecular material or a high molecular material, the above materials can be used to form the light-emitting layer. For the deposition, a known method (e.g., an evaporation method, a coating method, or a printing method) can be used as appropriate.

<Electron-Transport Layer>

The electron-transport layer is a layer that transports electrons, which are injected from a cathode by the electron-injection layer, to the light-emitting layer. Note that the electron-transport layer is a layer including an electron-transport material. As the electron-transport material used in the electron-transport layer, a substance having an electron mobility greater than or equal to $1 \times 10^{-6}$ cm$^2$/Vs is preferable. Note that other substances can also be used as long as they have an electron-transport property higher than a hole-transport property.

As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

As specific examples of the electron-transport material, the above-described materials can be used.

<Electron-Injection Layer>

The electron-injection layer is a layer that contains a substance having a high electron-injection property. For the electron-injection layer, an alkali metal, an alkaline earth metal, or a compound thereof such as lithium fluoride (LiF), cesium fluoride (CsF), calcium fluoride (CaF$_2$), or lithium oxide (LiO$_x$) can be used. A rare earth metal compound like erbium fluoride (ErF$_3$) can also be used. In addition, an electride may be used for the electron-injection layer. An example of the electride is a substance in which electrons are added at high concentration to calcium oxide-aluminum oxide. Any of the above-described substances for forming the electron-transport layer can also be used.

For the electron-injection layer, a composite material containing an electron-transport material and a donor material (an electron-donating material) may be used. Such a composite material is excellent in an electron-injection property and an electron-transport property because electrons are generated in the organic compound by the electron donor. The organic compound here is preferably a material excellent in transporting the generated electrons; specifically, for example, the above-described electron-transport materials used in the electron-transport layer (e.g., a metal complex or a heteroaromatic compound) can be used. As the electron donor, a substance showing an electron-donating property with respect to an organic compound is used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. A Lewis base such as magnesium oxide can be used. An organic compound such as tetrathiafulvalene (abbreviation: TTF) can be used.

<Charge Generation Layer>

The charge generation layer is provided between two light-emitting units. The charge generation layer has a function of injecting electrons into one of the light-emitting units adjacent to each other and injecting holes into the other of the light-emitting units when a voltage is applied between the anode and the cathode.

The charge generation layer may contain a hole-transport material and an acceptor material (an electron-accepting material) or may contain an electron-transport material and a donor material. Forming the charge generation layer with such a structure can suppress an increase in the driving voltage that would be caused by stacking EL layers.

As the hole-transport material, the acceptor material, the electron-transport material, and the donor material, the above-described materials can be used.

For fabrication of the light-emitting device of one embodiment of the present invention, a vacuum process such as an evaporation method or a solution process such as a spin coating method or an ink-jet method can be used. In the case of using an evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layer, the hole-transport layer, the light-emitting layer, the electron-transport layer, and the electron-injection layer) included in the EL layer and the charge generation layer can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

Materials of the functional layers and the charge generation layer included in the light-emitting device are not limited to the above-described corresponding materials. For example, as the materials of the functional layers, a high molecular compound (e.g., an oligomer, a dendrimer, and a polymer), a middle molecular compound (a compound between a low molecular compound and a high molecular compound with a molecular weight of 400 to 4000), or an inorganic compound (e.g., a quantum dot material) may be used. As the quantum dot material, a colloidal quantum dot material, an alloyed quantum dot material, a core-shell quantum dot material, a core quantum dot material, or the like can be used.

This embodiment can be combined with the other embodiments and the examples as appropriate.

Embodiment 4

In this embodiment, a display apparatus of one embodiment of the present invention will be described with reference to FIG. 20.

A display apparatus of one embodiment of the present invention includes first pixel circuits including a light-receiving device and second pixel circuits including a light-emitting device. The first pixel circuits and the second pixel circuits are arranged in a matrix.

Figure 20A:
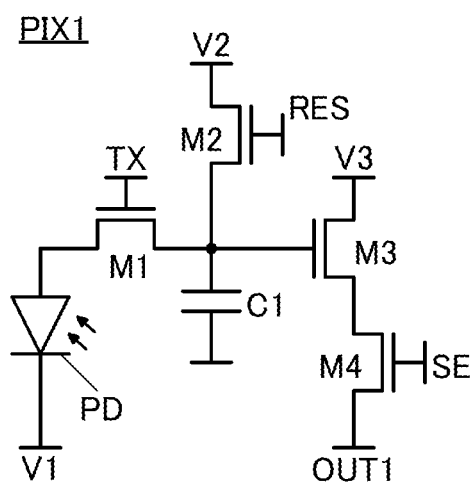
FIG. 20A and FIG. 20B are circuit diagrams showing pixel circuit examples.
Figure 20B:
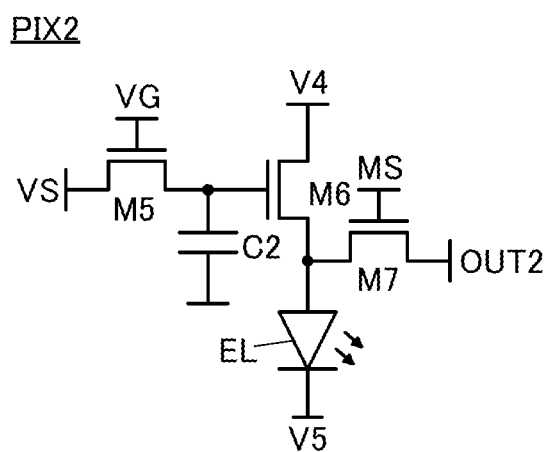

FIG. 20A illustrates an example of the first pixel circuit including a light-receiving device. FIG. 20B illustrates an example of the second pixel circuit including a light-emitting device.

A pixel circuit PIX1 illustrated in FIG. 20A includes a light-receiving device PD, a transistor M1, a transistor M2, a transistor M3, a transistor M4, and a capacitor C1. Here, an example of the case where a photodiode is used as the light-receiving device PD is illustrated.

A cathode of the light-receiving device PD is electrically connected to a wiring V1, and an anode is electrically connected to one of a source and a drain of the transistor M1. A gate of the transistor M1 is electrically connected to a wiring TX, and the other of the source and the drain is electrically connected to one electrode of the capacitor C1, one of a source and a drain of the transistor M2, and a gate of the transistor M3. A gate of the transistor M2 is electrically connected to a wiring RES, and the other of the source and the drain is electrically connected to a wiring V2. One of a source and a drain of the transistor M3 is electrically connected to a wiring V3, and the other of the source and the drain is electrically connected to one of a source and a drain of the transistor M4. A gate of the transistor M4 is electrically connected to a wiring SE, and the other of the source and the drain is electrically connected to a wiring OUT1.

A constant potential is supplied to the wiring V1, the wiring V2, and the wiring V3. When the light-receiving device PD is driven with a reverse bias, the wiring V2 is supplied with a potential lower than the potential of the wiring V1. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node changes, in accordance with a current flowing through the light-receiving device PD. The transistor M3 functions as an amplifier transistor for performing output corresponding to the potential of the node. The transistor M4 is controlled by a signal supplied to the wiring SE and functions as a selection transistor for reading an output corresponding to the potential of the node by an external circuit connected to the wiring OUT1.

A pixel circuit PIX2 illustrated in FIG. 20B includes a light-emitting device EL, a transistor M5, a transistor M6, a transistor M7, and a capacitor C2. Here, an example in which a light-emitting diode is used as the light-emitting device EL is illustrated. In particular, an organic EL device is preferably used as the light-emitting device EL.

A gate of the transistor M5 is electrically connected to a wiring VG, one of a source and a drain of the transistor M5 is electrically connected to a wiring VS, and the other of the source and the drain is electrically connected to one electrode of the capacitor C2 and a gate of the transistor M6. One of a source and a drain of the transistor M6 is electrically connected to a wiring V4, and the other of the source and the drain is electrically connected to an anode of the light-emitting device EL and one of a source and a drain of the transistor M7. A gate of the transistor M7 is electrically connected to a wiring MS, and the other of the source and the drain is electrically connected to a wiring OUT2. A cathode of the light-emitting device EL is electrically connected to a wiring V5.

A constant potential is supplied to the wiring V4 and the wiring V5. In the light-emitting device EL, the anode side can have a high potential and the cathode side can have a lower potential than the anode side. The transistor M5 is controlled by a signal supplied to the wiring VG and functions as a selection transistor for controlling a selection state of the pixel circuit PIX2. The transistor M6 functions as a driving transistor that controls a current flowing through the light-emitting device EL in accordance with a potential supplied to the gate. When the transistor M5 is in an on state, a potential supplied to the wiring VS is supplied to the gate of the transistor M6, and the emission luminance of the light-emitting device EL can be controlled in accordance with the potential. The transistor M7 is controlled by a signal supplied to the wiring MS and has a function of outputting a potential between the transistor M6 and the light-emitting device EL to the outside through the wiring OUT2.

Note that in the display apparatus of this embodiment, the light-emitting device may be made to emit light in a pulsed manner so as to achieve image display. A reduction in the driving time of the light-emitting device can reduce power consumption of the display apparatus and suppress heat generation of the display apparatus. An organic EL device is particularly preferable because of its favorable frequency characteristics. The frequency can be higher than or equal to 1 kHz and lower than or equal to 100 MHz, for example.

Here, a transistor in which a metal oxide (an oxide semiconductor) is used in a semiconductor layer where a channel is formed is preferably used as the transistor M1, the transistor M2, the transistor M3, and the transistor M4 included in the pixel circuit PIX1 and the transistor M5, the transistor M6, and the transistor M7 included in the pixel circuit PIX2.

A transistor using a metal oxide having a wider band gap and a lower carrier density than silicon can achieve an extremely low off-state current. Thus, such a low off-state current enables retention of charges accumulated in a capacitor that is connected in series with the transistor for a longtime. Therefore, it is particularly preferable to use a transistor using an oxide semiconductor as the transistor M1, the transistor M2, and the transistor M5 each of which is connected in series with the capacitor C1 or the capacitor C2. Moreover, the use of transistors using an oxide semiconductor as the other transistors can reduce the manufacturing cost.

Alternatively, transistors using silicon as a semiconductor in which a channel is formed can be used as the transistor M1 to the transistor M7. In particular, the use of silicon with high crystallinity, such as single crystal silicon or polycrystalline silicon, is preferable because high field-effect mobility is achieved and higher-speed operation is possible.

Alternatively, a transistor using an oxide semiconductor may be used as one or more of the transistor M1 to the transistor M7, and transistors using silicon may be used as the other transistors.

Although n-channel transistors are shown as the transistors in FIG. 20A and FIG. 20B, p-channel transistors can also be used.

The transistors included in the pixel circuit PIX1 and the transistors included in the pixel circuit PIX2 are preferably formed side by side over the same substrate. It is particularly preferable that the transistors included in the pixel circuit PIX1 and the transistors included in the pixel circuit PIX2 be periodically arranged in one region.

One or more layers including the transistor and/or the capacitor are preferably provided to overlap with the light-receiving device PD or the light-emitting device EL. Thus, the effective area of each pixel circuit can be reduced, and a high-resolution light-receiving portion or display portion can be achieved.

This embodiment can be combined with the other embodiments as appropriate.

Embodiment 5

In this embodiment, electronic devices of embodiments of the present invention will be described with reference to FIG. 21 to FIG. 23.

An electronic device of this embodiment includes the light-emitting apparatus of one embodiment of the present invention. The light-emitting apparatus of one embodiment of the present invention can be used in a display portion of the electronic device. At this time, the electronic device preferably includes an optical sensor as well as the light-emitting apparatus. The light-emitting apparatus of one embodiment of the present invention has a function of emitting both visible light and infrared light and is thus capable of not only displaying an image on the display portion but also emitting light (one or both of visible light and infrared light) to be used as alight source of the optical sensor. Combining the light-emitting apparatus and the optical sensor makes it possible to perform biometric authentication or to detect touch (and proximity). Accordingly, the electronic device can have improved functionality and convenience, for example.

Alternatively, an electronic device of this embodiment includes the display apparatus of one embodiment of the present invention. For example, the display apparatus of one embodiment of the present invention can be used in a display portion of the electronic device. The display apparatus of one embodiment of the present invention has a function of emitting both visible light and infrared light and a function of detecting light, and is thus capable of not only displaying an image on the display portion but also performing biological authentication with the display portion or detecting touch (and proximity) on the display portion. Thus, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device of this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 21A:
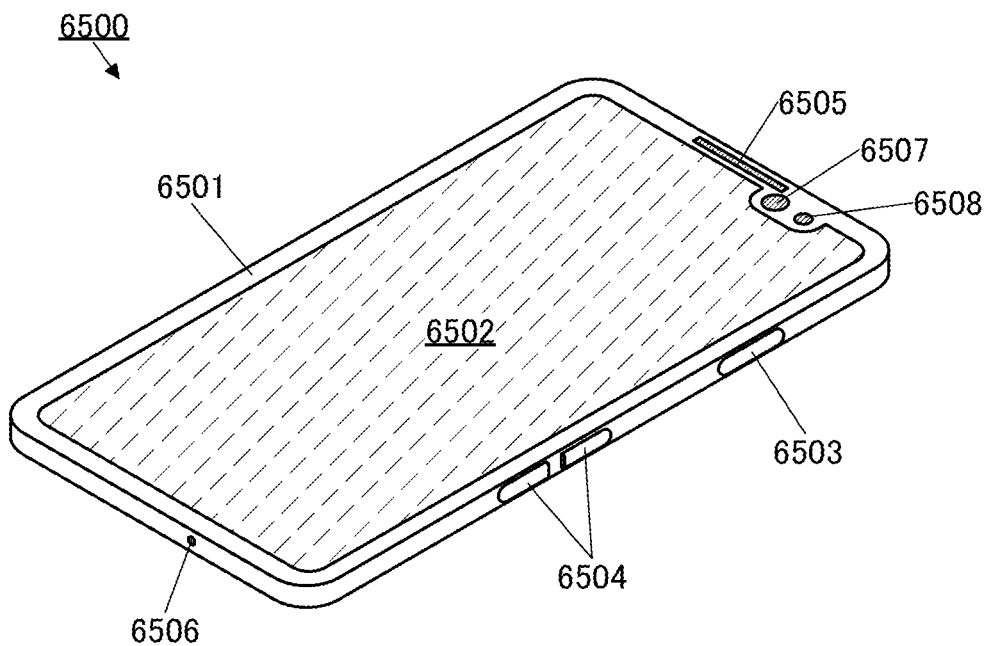
FIG. 21A and FIG. 21B are drawings showing an electronic device example.

An electronic device 6500 illustrated in FIG. 21A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The light-emitting apparatus or display apparatus of one embodiment of the present invention can be used in the display portion 6502.

Figure 21B:
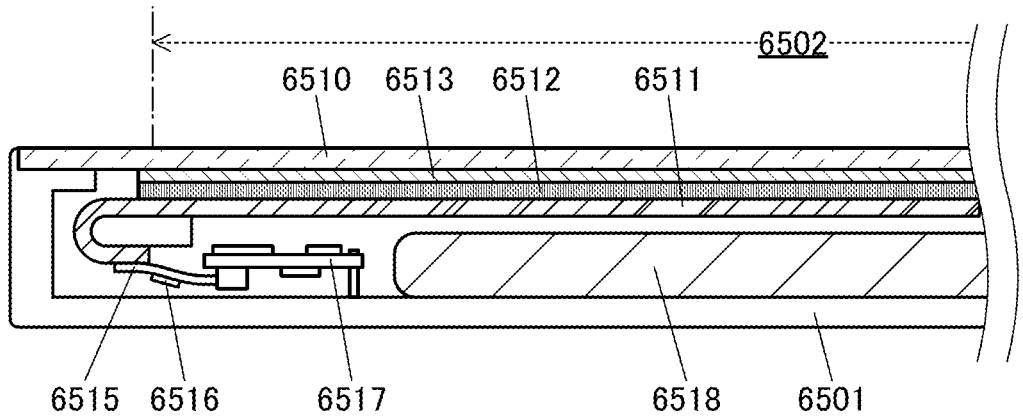

FIG. 21B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not shown).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible light-emitting apparatus or flexible display apparatus of one embodiment of the present invention can be used as the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Figure 22A:
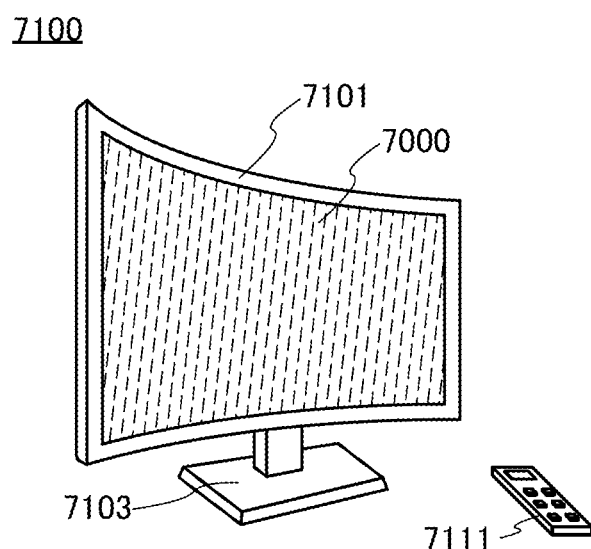
FIG. 22A to FIG. 22D are drawings showing electronic device examples.

FIG. 22A illustrates an example of a television device. In a television device 7100, a display portion 7000 is incorporated in a housing 7101. Here, a structure in which the housing 7101 is supported by a stand 7103 is illustrated.

The light-emitting apparatus or display apparatus of one embodiment of the present invention can be used in the display portion 7000.

Operation of the television device 7100 illustrated in FIG. 22A can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 22B:
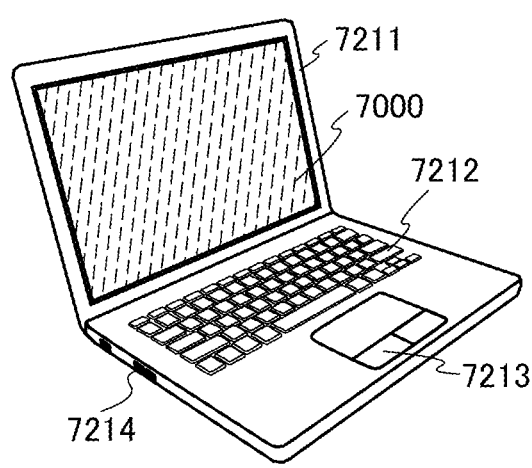

FIG. 22B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The light-emitting apparatus or display apparatus of one embodiment of the present invention can be used in the display portion 7000.

Figure 22C:
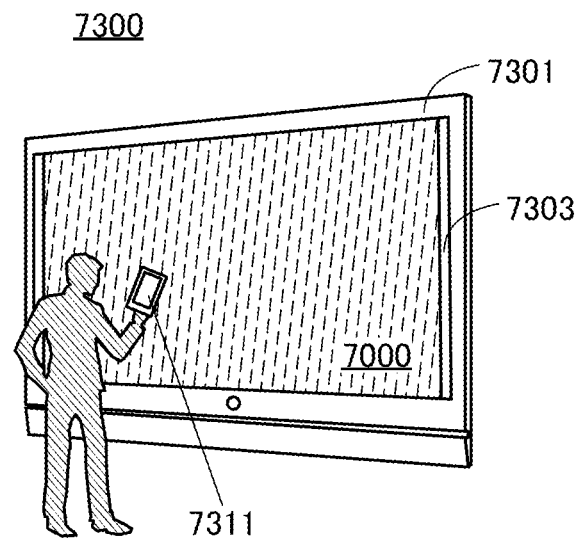
Figure 22D:
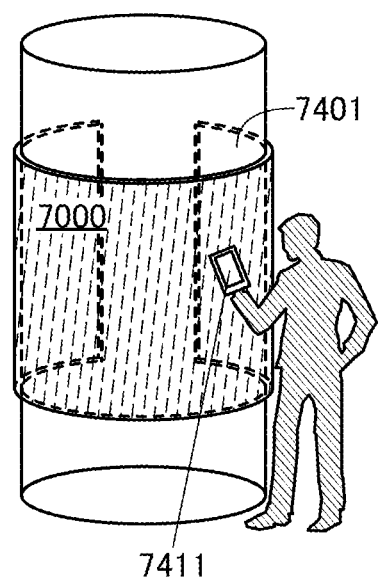

FIG. 22C and FIG. 22D illustrate examples of digital signage.

Digital signage 7300 illustrated in FIG. 22C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 22D is digital signage 7400 attached to a cylindrical pillar 7401. The digital signage 7400 includes the display portion 7000 provided along a curved surface of the pillar 7401.

The light-emitting apparatus or display apparatus of one embodiment of the present invention can be used for the display portion 7000 in FIG. 22C and FIG. 22D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 22C and FIG. 22D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices shown in FIG. 23A to FIG. 23F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices shown in FIG. 23A to FIG. 23F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 23A to FIG. 23F are described below.

Figure 23A:
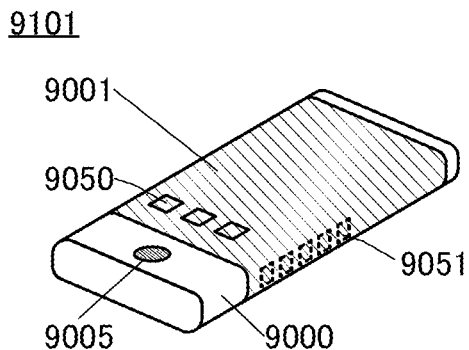
FIG. 23A to FIG. 23F are drawings showing electronic device examples.

FIG. 23A is a perspective view showing a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 23A shows an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 23B:
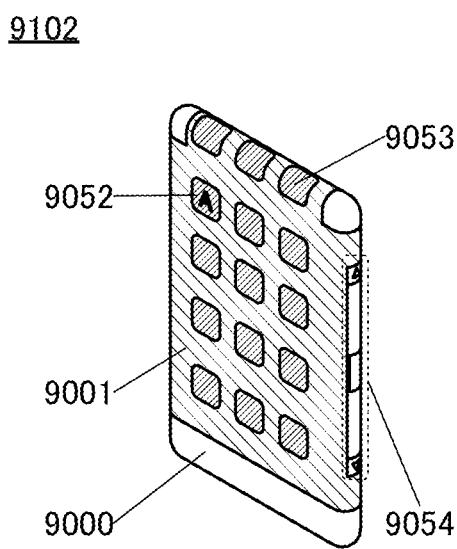

FIG. 23B is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can seethe display without taking out the portable information terminal 9102 from the pocket and decide whether to answer the call, for example.

Figure 23C:
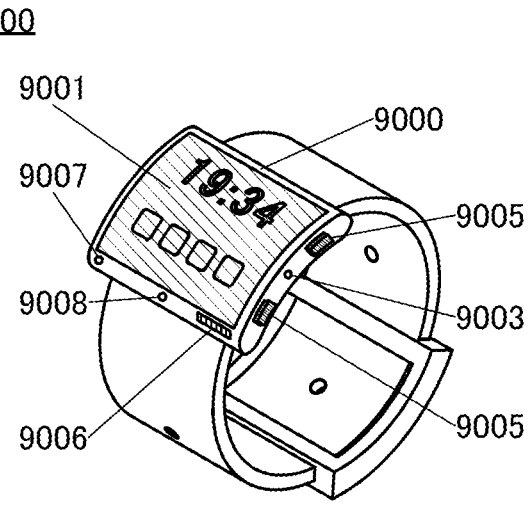

FIG. 23C is a perspective view showing a watch-type portable information terminal 9200. For example, the portable information terminal 9200 can be used as a smart watch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 23D:
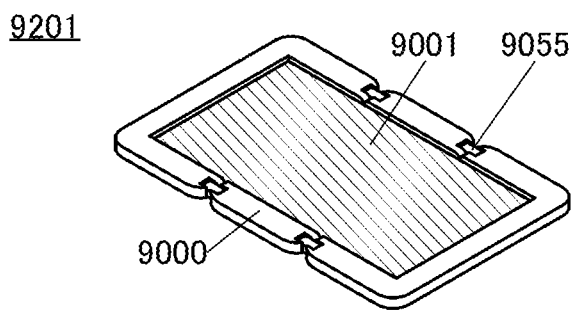
Figure 23E:
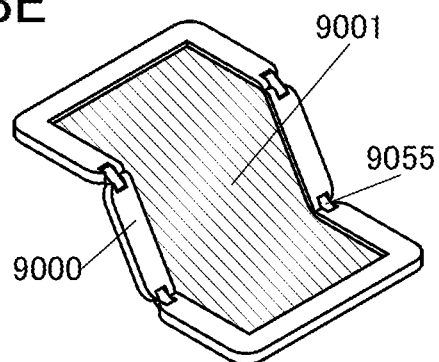
Figure 23F:
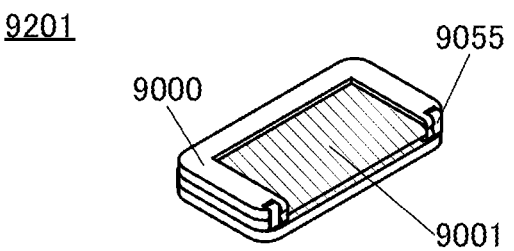

FIG. 23D to FIG. 23F are perspective views showing a foldable portable information terminal 9201. FIG. 23D is a perspective view of an opened state of the portable information terminal 9201, FIG. 23F is a perspective view of a folded state thereof, and FIG. 23E is a perspective view of a state in the middle of change from one of FIG. 23D and FIG. 23F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature greater than or equal to 0.1 mm and less than or equal to 150 mm.

This embodiment can be combined with the other embodiments and the examples as appropriate.

Example 1

In this example, results of studying, with the use of software, a device structure of a light-emitting device that emits visible light and infrared light and that can be used in the light-emitting apparatus or the display apparatus of one embodiment of the present invention will be described.

Figure 24A:
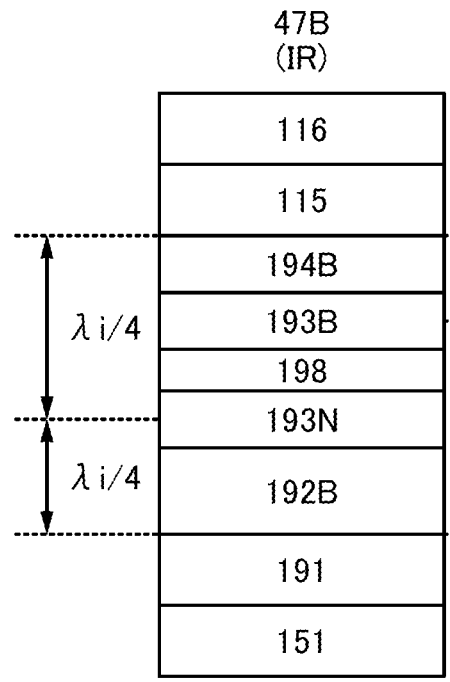
FIG. 24A to FIG. 24D are drawings showing light-emitting devices of Examples.

Specifically, results of studying a device structure of the light-emitting device 47B(IR) that emits blue light and infrared light and is shown in FIG. 24A will be described in this example.

First, the structural formulae of the organic compounds whose measured values (a refractive index n, an extinction coefficient k, an emission spectrum, and the like) were used for the calculation in this example are shown below.

[Chemical 1]

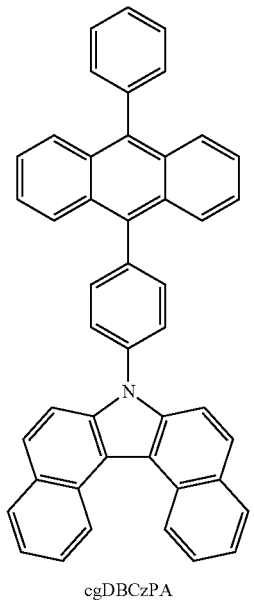

cgDBCzPA

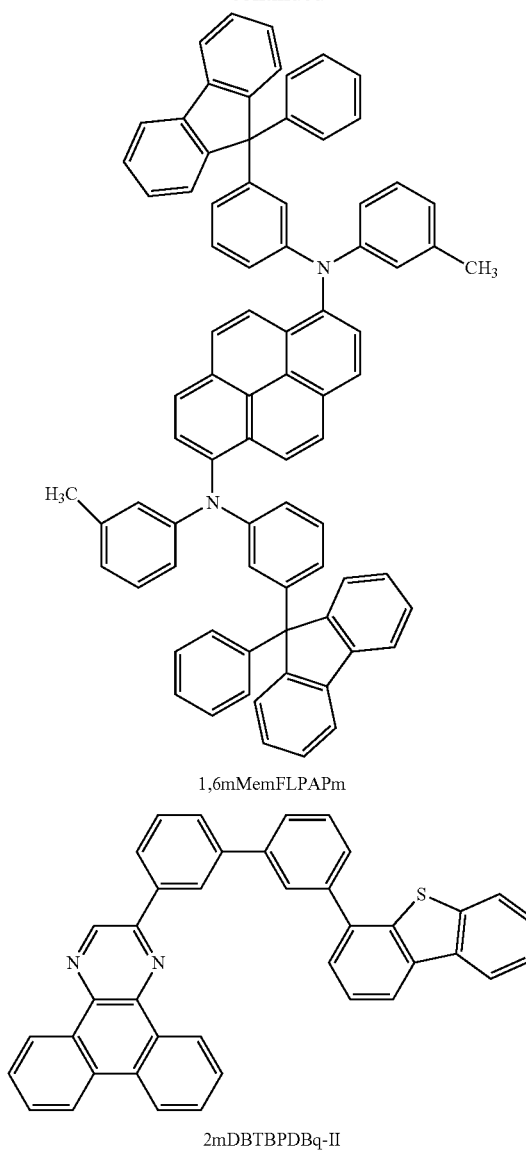
1,6mMemFLPAPm
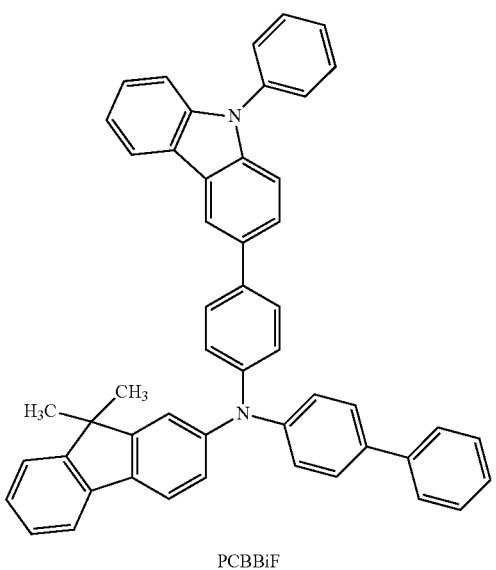
2mDBTBPDBq-II
PCBBiF
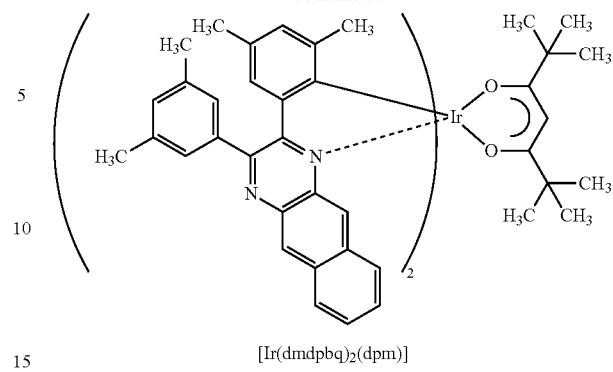
[Ir(dmdpbq)$_2$(dpm)]
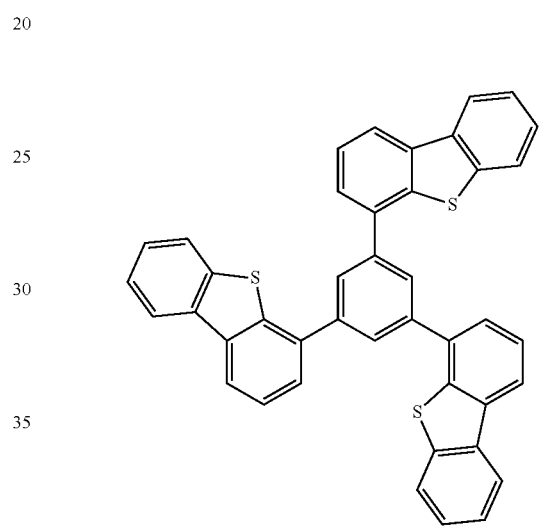
DBT3P-II
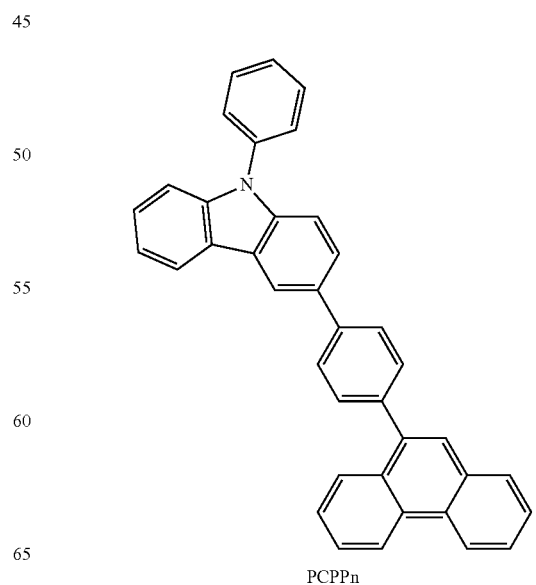
PCPPn

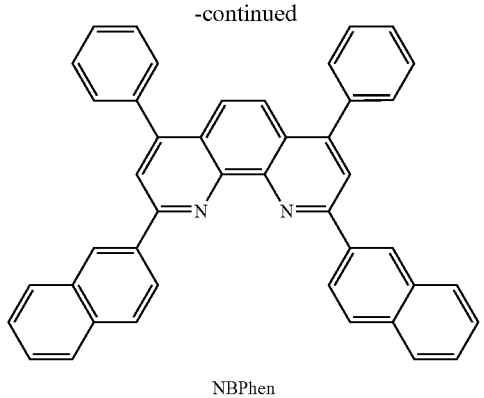

NBPhen

In this example, calculation was carried out using an organic device simulator (a semiconducting emissive thin film optics simulator: setfos; Cybernet Systems Co., Ltd.).

In the calculation, the thickness, refractive index n (measured value), and extinction coefficient k (measured value) of each layer of the light-emitting device, the measured value of an emission spectrum (photoluminescence (PL) spectrum) of a light-emitting material, and the position of a light-emitting region were input and multiplication by the Purcell factor was performed, whereby an emission intensity in the front direction and a spectrum waveform factoring in modulation of the radiative decay rate of an exciton were calculated.

The refractive index n and the extinction coefficient k of each layer were measured with the use of a spectroscopic ellipsometer (M-2000U, produced by J. A. Woollam Japan Corp.). For the measurement, the material for each layer was deposited to a thickness of approximately 50 nm over a quartz substrate by a vacuum evaporation method and the resulting films were used.

The emission spectrum of the light-emitting material was measured using a multi-channel spectrometer (C10029-01 produced by Hamamatsu Photonics K.K.) as a detector for visible light, a near-infrared spectroradiometer (SR-NIR produced by TOPCON CORPORATION) as a detector for near-infrared light, a ultraviolet light-emitting LED (NSCU033B produced by NICHIA CORPORATION) for excitation light, UV U360 (produced by Edmund Optics) as a bandpass filter, and SCF-50S-42L (produced by SIGMA-KOKI CO., LTD.) as a longpass filter.

For the measurement of an emission spectrum of visible light, 7-[4-(10-phenyl-9-anthryl)phenyl]-7H-dibenzo[c,g] carbazole (abbreviation: cgDBCzPA) and N,N-bis(3-methylphenyl)-N,N-bis[3-(9-phenyl-9H-fluoren-9-yl)phenyl] pyrene-1,6-diamine (abbreviation: 1,6mMemFLPAPrn) were co-evaporated over a quartz substrate using a vacuum evaporation method to have a weight ratio of 1:0.03 and a thickness of 50 nm and the resulting film was used.

For the measurement of an emission spectrum of infrared light, 2-[3'-(dibenzothiophen-4-yl)biphenyl-3-yl]dibenzo[f, h]quinoxaline (abbreviation: 2mDBTBPDBq-II), N-(1,1'-biphenyl-4-yl)-N-[4-(9-phenyl-9H-carbazol-3-yl)phenyl]-9, 9-dimethyl-9H-fluoren-2-amine (abbreviation: PCBBiF), and bis{4,6-dimethyl-2-[3-(3,5-dimethylphenyl)-2-benzo[g]quinoxalinyl-N]phenyl-κC}(2,2,6,6-tetramethyl-3,5-heptanedionato-κ$^2$O,O')iridium(III) (abbreviation: [Ir(dmdpbq)$_2$(dpm)]) were co-evaporated over a quartz substrate using a vacuum evaporation method to have a weight ratio of 0.7:0.3:0.1 and a thickness of 50 nm and the resulting film was used. Note that a synthesis example of [Ir(dmdpbq)$_2$(dpm)] will be described later in Reference Example.

Figure 25:
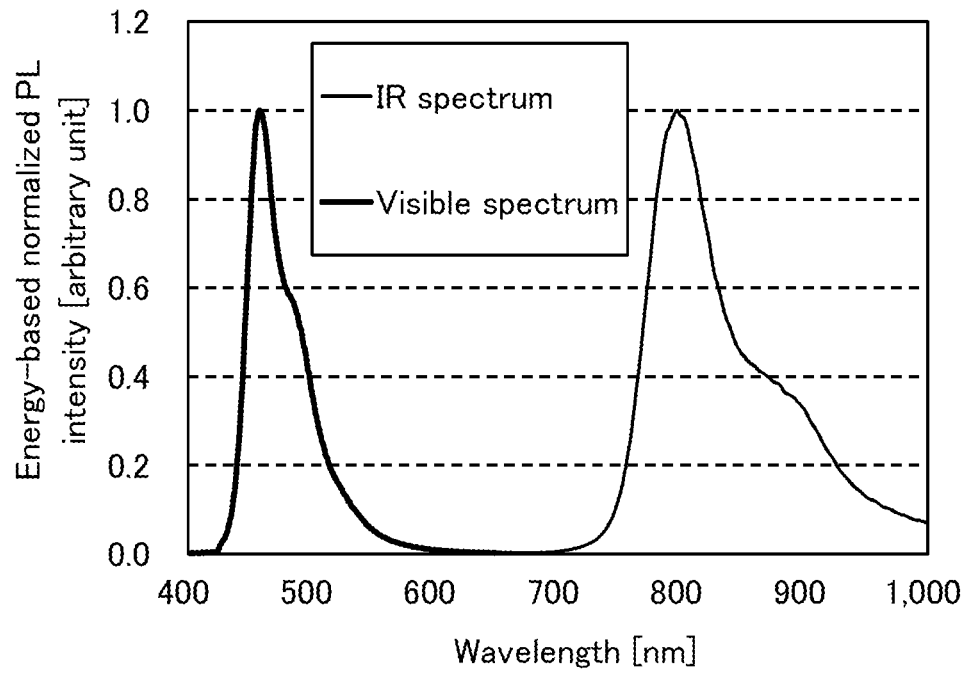
FIG. 25 is a graph showing emission spectra used for calculation in Example 1.

FIG. 25 shows the PL spectra used for the calculation. In FIG. 25, the horizontal axis represents wavelength (unit: nm) and the vertical axis represents energy-based normalized PL intensity (arbitrary unit). Note that photon-based PL intensity can be obtained by multiplying the energy-based PL intensity by a wavelength.

The light-emitting region was assumed to be the center of the light-emitting layer.

For each of visible light and infrared light, the emission quantum yield, exciton generation probability, and recombination probability were assumed to be 100%. That is, calculated external quantum efficiency (under the assumption of Lambertian) indicates the light extraction efficiency calculated from the front emission intensity under the assumption of Lambertian distribution.

The light-emitting device 47B(IR) in FIG. 24A which was used in this example had a tandem structure in which the intermediate layer 198 included a charge generation layer. In the light-emitting device 47B(IR), a light-emitting unit including the light-emitting layer 193B emitting blue light was provided over the light-emitting unit including the light-emitting layer 193N emitting infrared light.

The calculation was carried out with the initial values set such that the optical distance between the pixel electrode 191 and the light-emitting region of the light-emitting layer 193B was approximately 3 μB/4, the optical distance between the common electrode 115 and the light-emitting region of the light-emitting layer 193B was approximately λB/4, the optical distance between the pixel electrode 191 and the light-emitting region of the light-emitting layer 193N was approximately λi/4, and the optical distance between the common electrode 115 and the light-emitting region of the light-emitting layer 193N was approximately λi/4, as shown in FIG. 24A.

In this example, a visible light wavelength λB was the wavelength of blue light (467 nm) which is defined by BT.2020, and the infrared light wavelength λi was assumed to be the secondary light (934 nm) of blue light.

The device structure of the light-emitting device 47B(IR) used in this example will be described with reference to Table 2. Note that for simpler calculation, a hole-injection layer, an electron-injection layer, and a charge generation layer were omitted.

TABLE 2

Light-emitting device 47B(IR)

| Layer | Material | Thickness | |
|---|---|---|---|
| Buffer layer 116 | DBT3P-II | 70 nm | Input value |
| Common electrode 115 | Ag | 15 nm | Input value |
| Buffer layer 194B | NBPhen | 36 nm | ✗ |
| Light-emitting layer 193B | cgDBCzPA | 25 nm | Input value |
| Intermediate layer 198 | PCPPn | 10 nm | Input value |
| | NBPhen | 5.6 nm | ✗ |
| Light-emitting layer 193N | 2mDBTBPDBq-II | 40 nm | Input value |
| Buffer layer 192B | PCBBiF | 63 nm | ✗ |
| Pixel electrode 191 | ITSO | 10 nm | Input value |
| | Ag | 100 nm | Input value |

✗Thickness optimized by calculation

It was assumed that the substrate 151 was a glass substrate having a thickness of 0.7 mm and a refractive index of 1.5.

As the pixel electrode 191, a stacked-layer structure of a 100-nm-thick silver (Ag) film and a 10-nm-thick film of indium tin oxide containing silicon oxide (ITSO) was employed.

For the buffer layer 192B, PCBBiF was employed assuming a hole-transport layer. The buffer layer 192B was a layer used for optical adjustment, whose optimal thickness was obtained by calculation.

The thickness of the light-emitting layer 193N was 40 nm and the host material therein was 2mDBTBPDBq-II.

As the intermediate layer 198, a stacked-layer structure of 2,9-bis(naphthalen-2-yl)-4,7-diphenyl-1,10-phenanthroline (abbreviation: NBphen) and 10-nm-thick 3-[4-(9-phenanthryl)-phenyl]-9-phenyl-9H-carbazole (abbreviation: PCPPn) was employed. The NBphen included in the intermediate layer 198 was a layer used for optical adjustment, whose optimal thickness was obtained by calculation.

As a host material in the light-emitting layer 193B, 25-nm-thick cgDBCzPA was employed.

For the buffer layer 194B, NBphen was employed assuming an electron-transport layer. The buffer layer 194B was a layer used for optical adjustment, whose optimal thickness was obtained by calculation.

As the common electrode 115, a 15-nm-thick silver film was employed.

As the buffer layer 116, 70-nm-thick 1,3,5-tri(dibenzothiophen-4-yl)benzene (abbreviation: DBT3P-II) was employed.

Note that the upper side of the buffer layer 116 (the side opposite to the side in contact with the common electrode 115) was assumed to be the air (refractive index: 1).

An optimal device structure of the light-emitting device was obtained by calculation using the above-described conditions.

In the calculation, the optical distance of the whole light-emitting device and the thickness of NBPhen of the buffer layer 194B with which the external quantum efficiency for visible light (under the assumption of Lambertian) would be maximized were calculated, and then, the thickness of PCBBiF of the buffer layer 192B and the thickness of NBPhen of the intermediate layer 198 were calculated such that the external quantum efficiency (under the assumption of Lambertian) would be maximized with the above optical distance of the whole light-emitting device and the above thickness of NBPhen of the buffer layer 194B.

Specifically, the thickness value of NBPhen of the intermediate layer 198 was set temporarily, and the thickness of PCBBiF of the buffer layer 192B and the thickness of NBPhen of the buffer layer 194B were optimized such that the external quantum efficiency for visible light (under the assumption of Lambertian) would be maximized under that condition. Then, with the peak wavelength of infrared light fixed, the thickness of PCBBiF of the buffer layer 192B and the thickness of NBPhen of the intermediate layer 198 were optimized such that the external quantum efficiency (under the assumption of Lambertian) would be maximized.

As listed in Table 2, the thickness of PCBBiF of the buffer layer 192B was calculated to be 63 nm; the thickness of NBPhen of the intermediate layer 198, 5.6 nm; and the thickness of NBPhen of the buffer layer 194B, 36 nm, in the light-emitting device 47B(IR).

Figure 26:
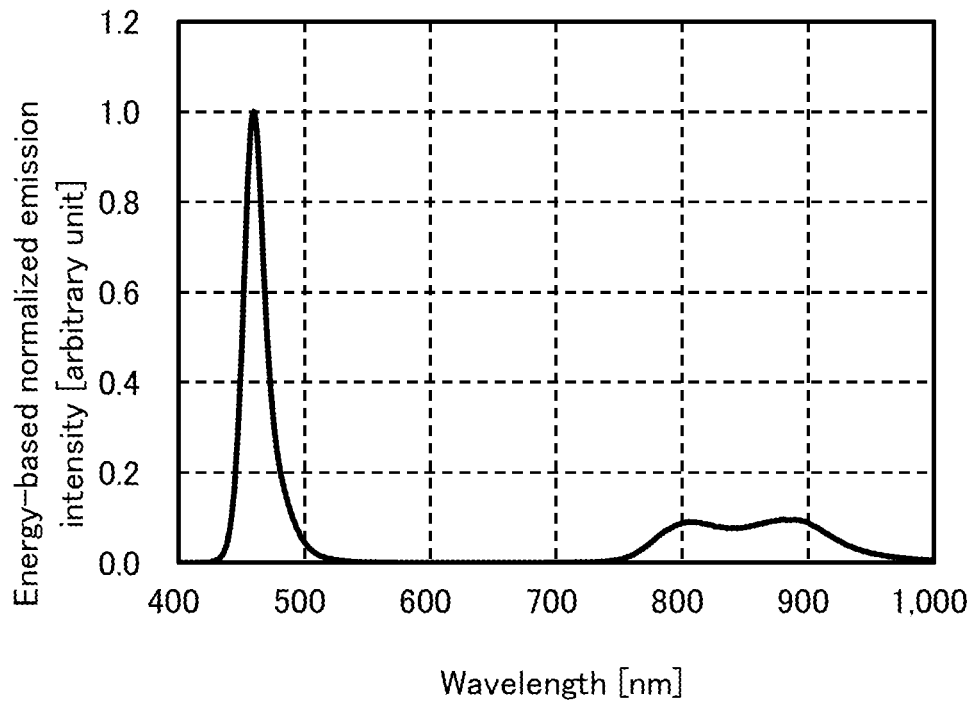
FIG. 26 is a graph showing an emission spectrum resulting from calculation in Example 1.

FIG. 26 shows an emission (EL) spectrum of the light-emitting device 47B(IR) obtained from the calculation. In FIG. 26, the horizontal axis represents wavelength (unit: nm) and the vertical axis represents energy-based normalized emission intensity (arbitrary unit).

As shown in FIG. 26, the peak wavelength of visible light from the light-emitting device 47B(IR) was 460 nm and the peak wavelength of infrared light therefrom was 880 nm. The peak wavelength of the infrared light was found to be shorter than twice the peak wavelength of the visible light (920 nm).

The light-emitting device 47B(IR) obtained from the calculation had an external quantum efficiency for visible light (under the assumption of Lambertian) as high as approximately 30%. In addition, the light-emitting device 47B(IR) had an external quantum efficiency for infrared light (under the assumption of Lambertian) as high as approximately 30%.

Figure 27:
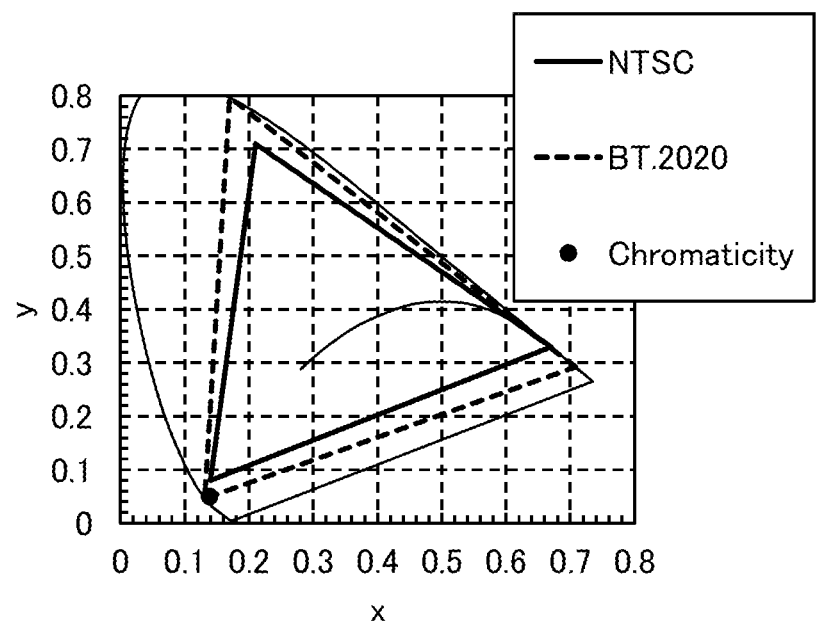
FIG. 27 is a graph showing CIE 1931 chromaticity coordinates resulting from calculation in Example 1.

FIG. 27 shows CIE 1931 chromaticity coordinates (xy chromaticity coordinates) of the light-emitting device obtained from the calculation. FIG. 27 also shows the chromaticity coordinates of the NTSC standard and the BT.2020 standard. As shown in FIG. 27, the chromaticity (x,y) of the light-emitting device in the CIE 1931 chromaticity coordinates was found to be (0.138, 0.050) and to meet the NTSC standard and the BT.2020 standard.

In the light-emitting device obtained from the calculation in this example, the peak wavelength of infrared light was found to be shorter than twice the peak wavelength of visible light (920 nm), as described above. This presumably resulted from the wavelength dependence of a refractive index.

Figure 28:
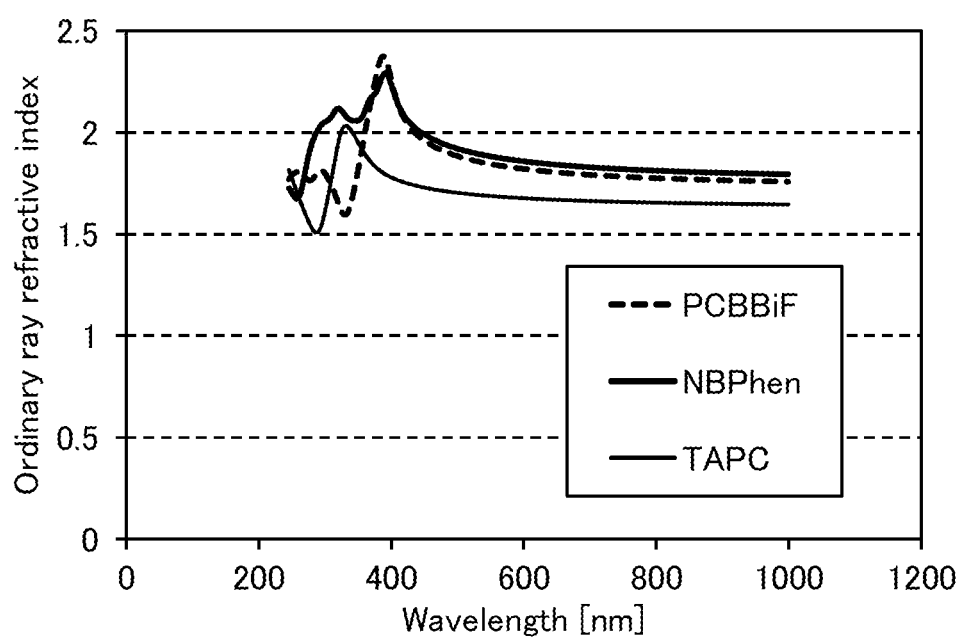
FIG. 28 is a graph showing refractive indices used for calculation in Example 1.

Here, the wavelength dependence of an ordinary ray refractive index of each of PCBBiF and NBPhen is shown in FIG. 28. FIG. 28 also shows the wavelength dependence of an ordinary ray refractive index of 1,1-bis-(4-bis(4-methyl-phenyl)-amino-phenyl)-cyclohexane (abbreviation: TAPC) as a comparative example.

For refractive index measurement, each material was deposited to a thickness of approximately 50 nm over a quartz substrate by a vacuum evaporation method and the resulting films were used. The films had anisotropy in refractive index; thus, at the time of calculation of the refractive index, an ordinary ray refractive index and an extraordinary ray refractive index were separated. Note that an ordinary ray refractive index was used in the above calculation.

From FIG. 28, the ordinary ray refractive index of PCBBiF with respect to light with a wavelength of 460 nm was approximately 1.94, and the ordinary ray refractive index thereof with respect to light with a wavelength of 880 nm was approximately 1.77, where the difference was approximately 0.17. The ordinary ray refractive index of NBPhen with respect to light with a wavelength of 460 nm was approximately 1.97, and the ordinary ray refractive index thereof with respect to light with a wavelength of 880 nm was approximately 1.80, where the difference was approximately 0.17. As described above, it was found that PCBBiF and NBPhen, whose thicknesses were optimized in this example, had a refractive index with respect to infrared light lower than that with respect to visible light. This presumably made the peak wavelength of infrared light shift to the shorter wavelength side to be shorter than twice the peak wavelength of visible light (920 nm).

Meanwhile, the ordinary ray refractive index of TAPC, which was shown as the comparative example, with respect to light with a wavelength of 460 nm was approximately 1.72, and the ordinary ray refractive index thereof with respect to light with a wavelength of 880 nm was approximately 1.65, where the difference was approximately 0.07.

In this manner, a variation in the wavelength dependence of a refractive index between organic films was confirmed. It was suggested that the peak wavelength of infrared light can be controlled by utilizing the wavelength dependence of the refractive index of an organic film.

From the results in this example, the device structure of the light-emitting device from which both blue light and infrared light can be extracted with high efficiency was able to be estimated.

Example 2

In this example, results of studying, with the use of software, a device structure of a light-emitting device that emits visible light and infrared light and that can be used in the light-emitting apparatus or the display apparatus of one embodiment of the present invention will be described.

Figure 24B:
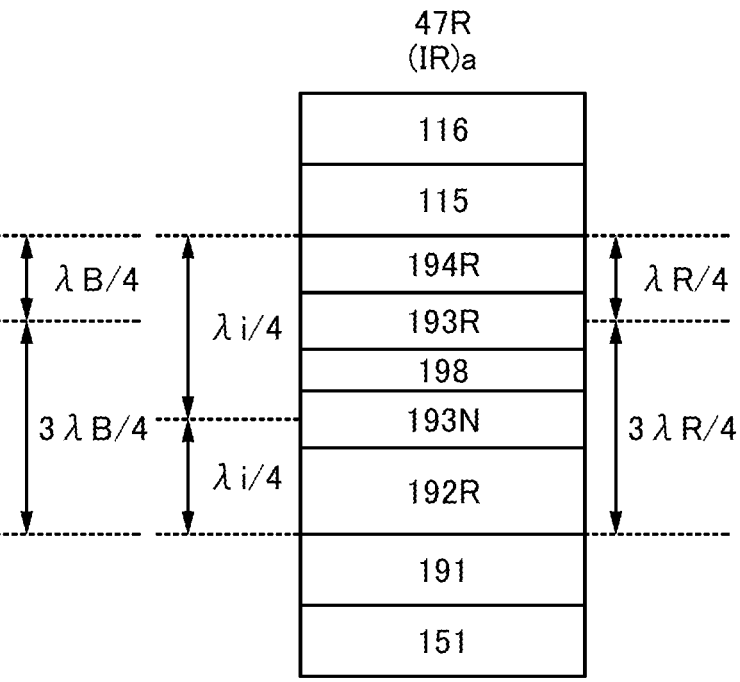
Figure 24C:
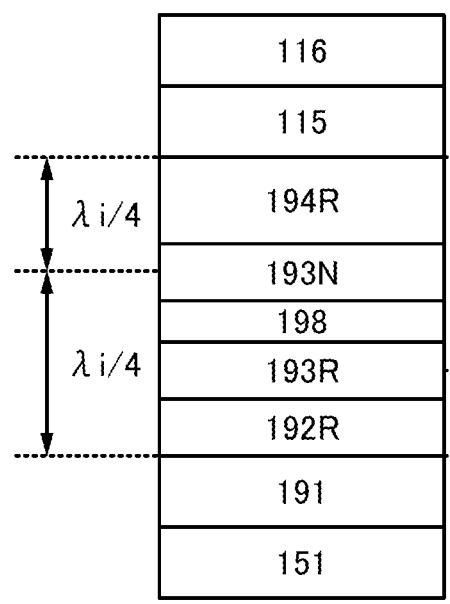

Specifically, results of studying device structures of a light-emitting device 47R(IR)a and a light-emitting device 47R(IR)b that emit red light and infrared light and are shown in FIG. 24B and FIG. 24C will be described in this example.

In this example, calculation was carried out using an organic device simulator similar to that used in Example 1.

In the calculation, the thickness, refractive index n, and extinction coefficient k of each layer of the light-emitting device, the measured value of an emission spectrum (photoluminescence (PL) spectrum) of a light-emitting material, and the position of a light-emitting region were input and multiplication by the Purcell factor was performed, whereby an emission intensity in the front direction and a spectrum waveform factoring in modulation of the radiative decay rate of an exciton were calculated.

Although the case where the wavelength of infrared light exceeds 1000 nm was assumed in this example as described later, measurement values of refractive indices and extinction coefficients of layers other than a silver film for the wavelength region exceeding 1000 nm are absent and thus, in this example, the calculation was carried out on the assumption that the layers other than the silver film each had a refractive index n=1.8.

For the measurement of an emission spectrum of visible light, 2mDBTBPDBq-II, PCBBiF, and bis{2-[5-(2,6-dimethylphenyl)-3-(3,5-dimethylphenyl)-2-pyrazinyl-κN]-4,6-dimethylphenyl-κC}(2,2,6,6-tetramethyl-3,5-heptanedionato-κ²O,O')iridium(III) (abbreviation: [Ir(dmdppr-dmp)$_2$(dpm)]) were co-evaporated over a quartz substrate using a vacuum evaporation method to have a weight ratio of 0.8:0.2:0.05 and a thickness of 50 nm and the resulting film was used. The other measurement conditions are similar to those in Example 1.

The structural formula of [Ir(dmdppr-dmp)$_2$(dpm)] is shown below.

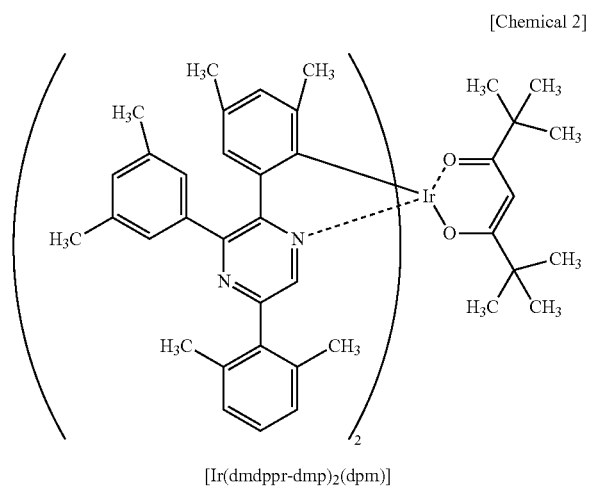

[Chemical 2]

[Ir(dmdppr-dmp)$_2$(dpm)]

As an emission spectrum of infrared light, a spectrum obtained by shifting the emission spectrum of visible light to a longer wavelength side by 655 nm was used.

Figure 29:
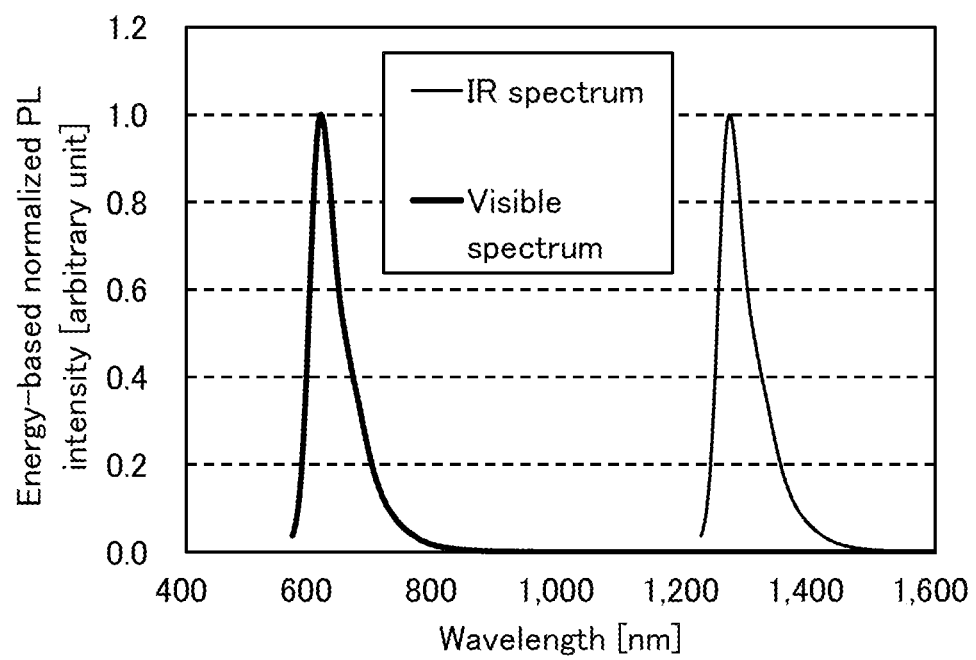
FIG. 29 is a graph showing emission spectra used for calculation in Example 2.

FIG. 29 shows the photoluminescence (PL) spectra used for the calculation. In FIG. 29, the horizontal axis represents wavelength (unit: nm) and the vertical axis represents energy-based normalized PL intensity (arbitrary unit).

The light-emitting region was assumed to be the center of the light-emitting layer.

For each of visible light and infrared light, the emission quantum yield, exciton generation probability, and recombination probability were assumed to be 100%.

The light-emitting device 47R(IR)a and the light-emitting device 47R(IR)b in FIG. 24B and FIG. 24C which were used in this example each had a tandem structure in which the intermediate layer 198 included a charge generation layer. The two light-emitting devices are different from each other in the stacking order of the light-emitting layer 193N and the light-emitting layer 193R.

In the light-emitting device 47R(IR)a shown in FIG. 24B, a light-emitting unit including the light-emitting layer 193R emitting red light was provided over the light-emitting unit including the light-emitting layer 193N emitting infrared light.

The calculation was carried out with the initial values set such that the optical distance between the pixel electrode 191 and the light-emitting region of the light-emitting layer 193R was approximately 3λR/4, the optical distance between the common electrode 115 and the light-emitting region of the light-emitting layer 193R was approximately λR/4, the optical distance between the pixel electrode 191 and the light-emitting region of the light-emitting layer 193N was approximately λi/4, and the optical distance between the common electrode 115 and the light-emitting region of the light-emitting layer 193N was approximately λi/4, as shown in FIG. 24B.

In the light-emitting device 47R(IR)b shown in FIG. 24C, the light-emitting unit including the light-emitting layer 193N emitting infrared light was provided over a light-emitting unit including the light-emitting layer 193R emitting red light.

The calculation was carried out with the initial values set such that the optical distance between the pixel electrode 191 and the light-emitting region of the light-emitting layer 193R was approximately λR/4, the optical distance between the common electrode 115 and the light-emitting region of the light-emitting layer 193R was approximately 3λR/4, the optical distance between the pixel electrode 191 and the light-emitting region of the light-emitting layer 193N was approximately λi/4, and the optical distance between the common electrode 115 and the light-emitting region of the light-emitting layer 193N was approximately λi/4, as shown in FIG. 24C.

In this example, a visible light wavelength λR was the wavelength of red light (630 nm) which is defined by BT.2020, and the infrared light wavelength λi was assumed to be the secondary light (1260 nm) of red light.

The device structures of the light-emitting device 47R(IR)a and the light-emitting device 47R(IR)b used in this example will be described with reference to Table 3 and Table 4.

Note that for simpler calculation, a hole-injection layer, an electron-injection layer, and a charge generation layer were omitted.

TABLE 3

Light-emitting device 47R(IR)a

| Layer | Material | Thickness | |
|---|---|---|---|
| Buffer layer 116 | — | 70 nm | Input value |
| Common electrode 115 | Ag | 15 nm | Input value |
| Buffer layer 194R | — | 58 nm | ※ |
| Light-emitting layer 193R | — | 40 nm | Input value |
| Intermediate layer 198 | — | 10 nm | Input value |
| | — | 27 nm | ※ |
| Light-emitting layer 193N | — | 40 nm | Input value |
| Buffer layer 192R | — | 106 nm | ※ |
| Pixel electrode 191 | — | 10 nm | Input value |
| | Ag | 100 nm | Input value |

※Thickness optimized by calculation

TABLE 4

Light-emitting device 47R(IR)b

| Layer | Material | Thickness | |
|---|---|---|---|
| Buffer layer 116 | — | 70 nm | Input value |
| Common electrode 115 | Ag | 15 nm | Input value |
| Buffer layer 194R | — | 127 nm | ※ |
| Light-emitting layer 193N | — | 40 nm | Input value |
| Intermediate layer 198 | — | 10 nm | Input value |
| | — | 30 nm | ※ |
| Light-emitting layer 193R | — | 40 nm | Input value |
| Buffer layer 192R | — | 35 nm | ※ |
| Pixel electrode 191 | — | 10 nm | Input value |
| | Ag | 100 nm | Input value |

※Thickness optimized by calculation

It was assumed that the substrate 151 was a glass substrate having a thickness of 0.7 mm and a refractive index of 1.5.

As the pixel electrode 191, a stacked-layer structure of a 100-nm-thick silver film and a 10-nm-thick layer (which was assumed to be a transparent electrode) was employed.

It was assumed that the buffer layer 192R was a hole-transport layer. The buffer layer 192R was a layer used for optical adjustment, whose optimal thickness was obtained by calculation.

The thickness of each of the light-emitting layer 193N and the light-emitting layer 193R was 40 nm.

As the intermediate layer 198, a stacked-structure of a layer used for optical adjustment (which was assumed to be an electron-transport layer) and a 10-nm-thick layer (which was assumed to be a hole-transport layer) was employed. The optimal thickness of the layer used for optical adjustment in the intermediate layer 198 was obtained by calculation.

It was assumed that the buffer layer 194R was an electron-transport layer. The buffer layer 194R was a layer used for optical adjustment, whose optimal thickness was obtained by calculation.

As the common electrode 115, a 15-nm-thick silver film was employed.

The buffer layer 116 was a 70-nm-thick layer.

Note that the upper side of the buffer layer 116 (the side opposite to the side in contact with the common electrode 115) was assumed to be the air (refractive index: 1).

Optimal device structures of the light-emitting devices were obtained by calculation using the above-described conditions.

In the calculation, the optical distance of the whole light-emitting device and the thickness of NBPhen of the buffer layer 194R with which the external quantum efficiency for visible light (under the assumption of Lambertian) would be maximized were calculated, and then, the thickness of PCBBiF of the buffer layer 192R and the thickness of NBPhen of the intermediate layer 198 were calculated such that the external quantum efficiency for infrared light (under the assumption of Lambertian) would be maximized with the above optical distance of the whole light-emitting device and the above thickness of NBPhen of the buffer layer 194R.

Specifically, the thickness value of NBPhen of the intermediate layer 198 was set temporarily, and the thickness of PCBBiF of the buffer layer 192R and the thickness of NBPhen of the buffer layer 194R were optimized such that the external quantum efficiency for visible light (under the assumption of Lambertian) would be maximized under that condition. Then, with the peak wavelength of infrared light fixed, the thickness of PCBBiF of the buffer layer 192R and the thickness of NBPhen of the intermediate layer 198 were optimized such that the external quantum efficiency (under the assumption of Lambertian) would be maximized.

As listed in Table 3, the thickness of PCBBiF of the buffer layer 192R was calculated to be 106 nm; the thickness of NBPhen of the intermediate layer 198, 27 nm; and the thickness of NBPhen of the buffer layer 194R, 58 nm, in the light-emitting device 47R(IR)a. As listed in Table 4, the thickness of PCBBiF of the buffer layer 192R was calculated to be 35 nm; the thickness of NBPhen of the intermediate layer 198, 30 nm; and the thickness of NBPhen of the buffer layer 194R, 127 nm, in the light-emitting device 47R(IR)b.

Figure 30:
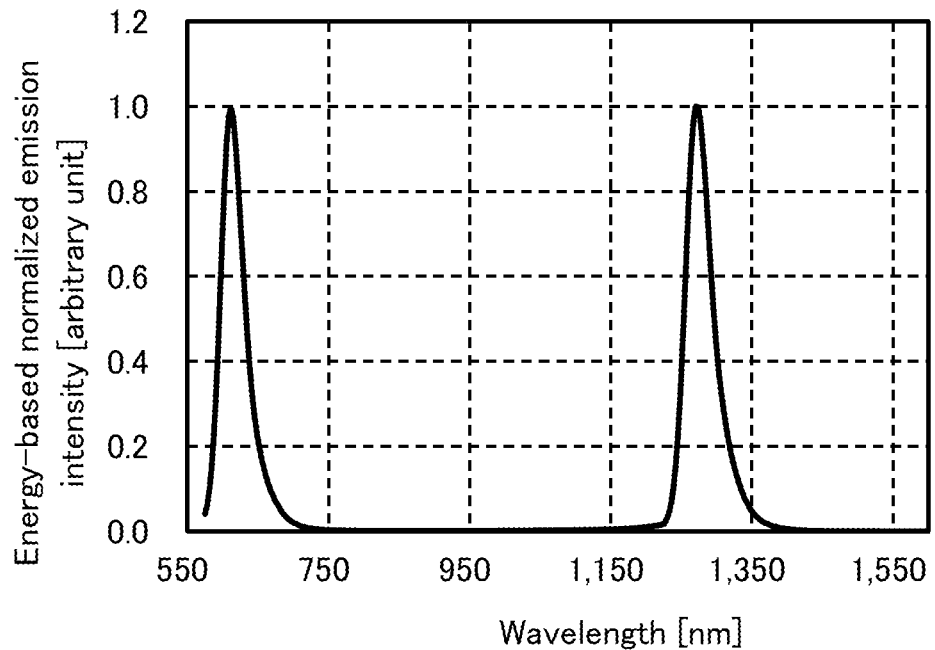
FIG. 30 is a graph showing an emission spectrum resulting from calculation in Example 2.
Figure 31:
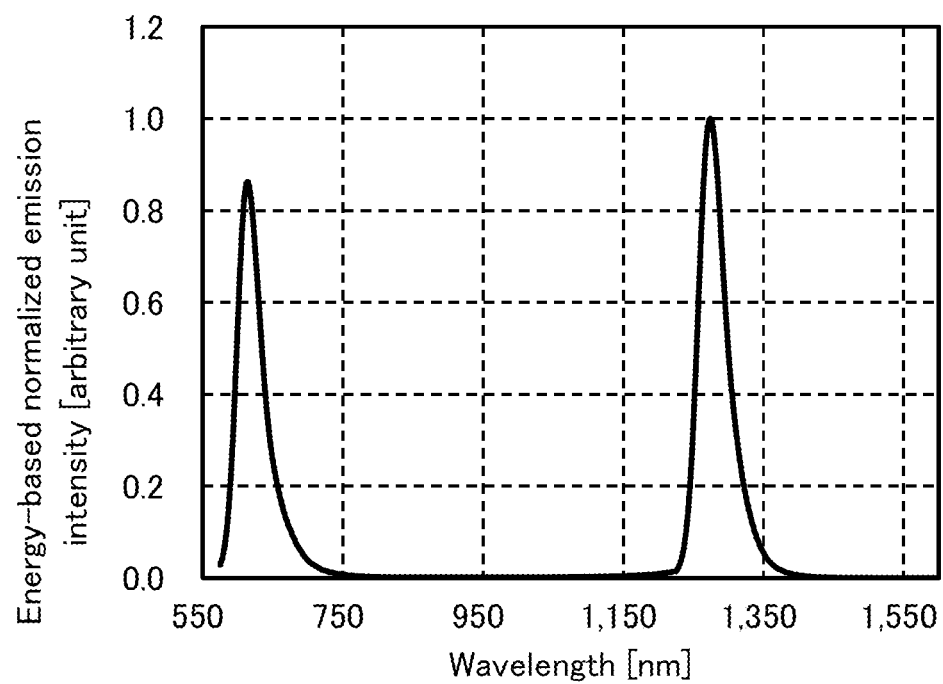
FIG. 31 is a graph showing an emission spectrum resulting from calculation in Example 2.

FIG. 30 and FIG. 31 show emission (EL) spectra of the light-emitting device 47R(IR)a and the light-emitting device 47R(IR)b obtained from the calculation. In FIG. 30 and FIG. 31, the horizontal axis represents wavelength (unit: nm) and the vertical axis represents energy-based normalized emission intensity (arbitrary unit).

As shown in FIG. 30, the peak wavelength of visible light from the light-emitting device 47R(IR)a was 612 nm and the peak wavelength of infrared light therefrom was 1272 nm. The peak wavelength of the infrared light was found to be close to twice the peak wavelength of the visible light (1224 nm).

The light-emitting device 47R(IR)a obtained from the calculation had an external quantum efficiency for visible light (under the assumption of Lambertian) as high as approximately 38%. In addition, the light-emitting device 47R(IR)a had an external quantum efficiency for infrared light (under the assumption of Lambertian) as high as approximately 90%. The peak wavelength of the infrared light had a value close to the assumed wavelength (1260 nm), suggesting that the light extraction efficiency for infrared light was significantly improved by the effect of a microcavity structure.

As shown in FIG. 31, the peak wavelength of visible light from the light-emitting device 47R(IR)b was 614 nm and the peak wavelength of infrared light therefrom was 1274 nm. The peak wavelength of the infrared light was found to be close to twice the peak wavelength of the visible light (1228 nm).

The light-emitting device 47R(IR)b obtained from the calculation had an external quantum efficiency for visible light (under the assumption of Lambertian) as high as approximately 34%. In addition, the light-emitting device 47R(IR)b had an external quantum efficiency for infrared light (under the assumption of Lambertian) as high as approximately 88%. The peak wavelength of the infrared light had a value close to the assumed wavelength (1260 nm), suggesting that the light extraction efficiency for infrared light was significantly improved by the effect of a microcavity structure.

Figure 32:
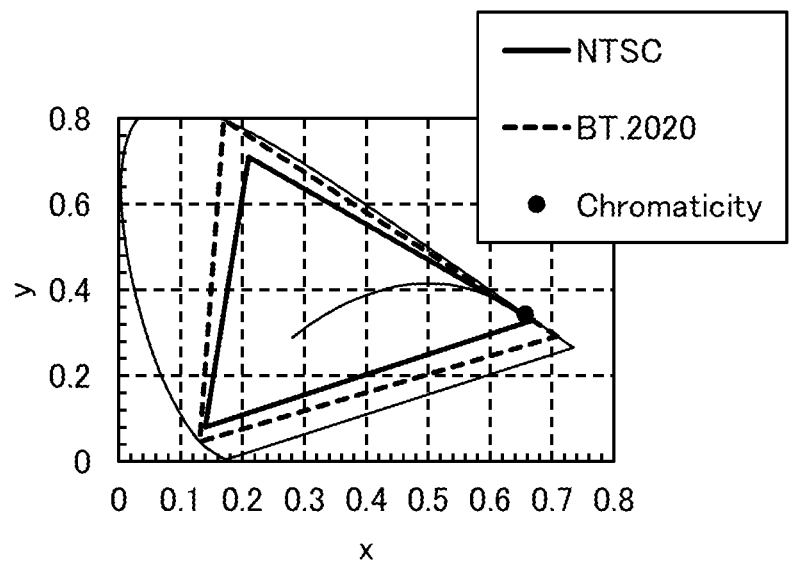
FIG. 32 is a graph showing CIE 1931 chromaticity coordinates resulting from calculation in Example 2.
Figure 33:
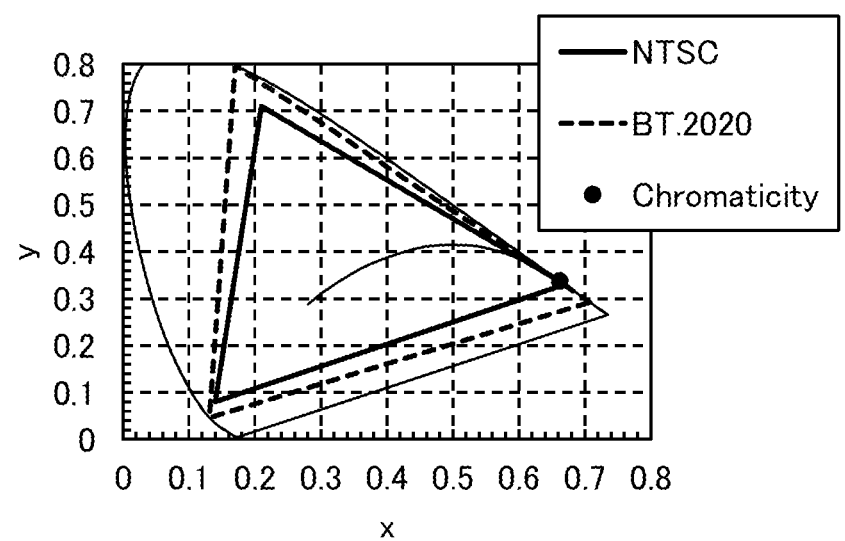
FIG. 33 is a graph showing CIE 1931 chromaticity coordinates resulting from calculation in Example 2.

FIG. 32 and FIG. 33 show CIE 1931 chromaticity coordinates (xy chromaticity coordinates) of the light-emitting device 47R(IR)a and the light-emitting device 47R(IR)b obtained from the calculation. FIG. 32 and FIG. 33 also show the chromaticity coordinates of the NTSC standard and the BT.2020 standard. As shown in FIG. 32, the chromaticity (x,y) of the light-emitting device 47R(IR)a in the CIE 1931 chromaticity coordinates was (0.657, 0.343). As shown in FIG. 33, the chromaticity (x,y) of the light-emitting device 47R(IR)b in the CIE 1931 chromaticity coordinates was (0.662, 0.338). From FIG. 32 and FIG. 33, it was found that each of the light-emitting device 47R(IR)a and the light-emitting device 47R(IR)b had values meeting the NTSC standard and the BT.2020 standard.

From the results in this example, the device structures of the light-emitting devices from which both red light and infrared light can be extracted with high efficiency were able to be estimated regardless of the stacking order of the red-light-emitting layer and the infrared-light-emitting layer.

Example 3

In this example, results of studying, with the use of software, a device structure of a light-emitting device that emits visible light and infrared light and that can be used in the light-emitting apparatus or the display apparatus of one embodiment of the present invention will be described.

Figure 24D:
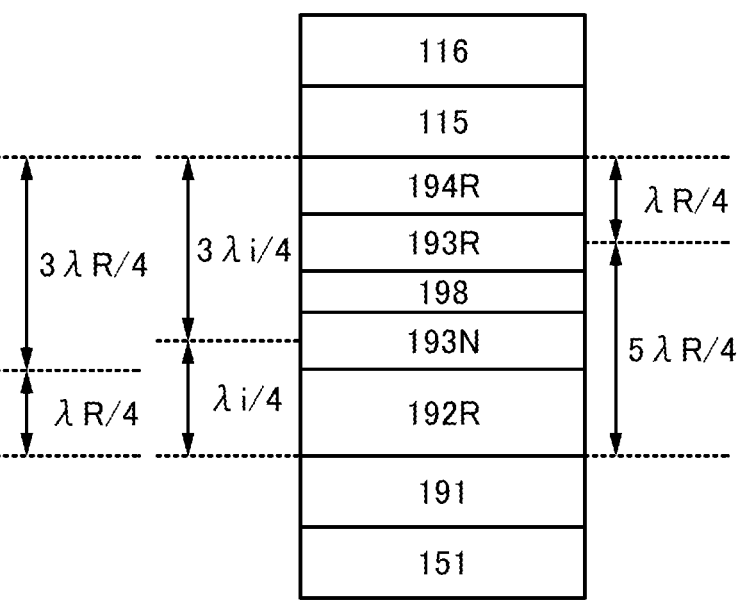

Specifically, results of studying a device structure of a light-emitting device 47R(IR)c that emits red light and infrared light and is shown in FIG. 24D will be described in this example.

In this example, calculation was carried out using an organic device simulator similar to that used in Example 1.

In the calculation, the thickness, refractive index n (measured value), and extinction coefficient k (measured value) of each layer of the light-emitting device, the measured value of an emission spectrum (photoluminescence (PL) spectrum) of a light-emitting material, and the position of a light-emitting region were input and multiplication by the Purcell factor was performed, whereby an emission intensity in the front direction and a spectrum waveform factoring in modulation of the radiative decay rate of an exciton were calculated.

The refractive index n and the extinction coefficient k of each layer were measured with the use of a spectroscopic ellipsometer (M-2000U, produced by J. A. Woollam Japan Corp.). For the measurement, the material for each layer was deposited to a thickness of approximately 50 nm over a quartz substrate by a vacuum evaporation method and the resulting films were used.

For the measurement of an emission spectrum of visible light, 2mDBTBPDBq-II, PCBBiF, and bis{4,6-dimethyl-2-[5-(5-cyano-2-methylphenyl)-3-(3,5-dimethylphenyl)-2-pyrazinyl-κN]phenyl-κC}(2,2,6,6-tetramethyl-3,5-heptanedionato-κ²O,O')iridium(III) (abbreviation: [Ir(dmdppr-m5CP)$_2$(dpm)]) were co-evaporated over a quartz substrate using a vacuum evaporation method to have a weight ratio of 0.8:0.2:0.1 and a thickness of 50 nm and the resulting film was used. The other measurement conditions are similar to those in Example 1.

The following structural formula of [Ir(dmdppr-m5CP)$_2$(dpm)] is shown below.

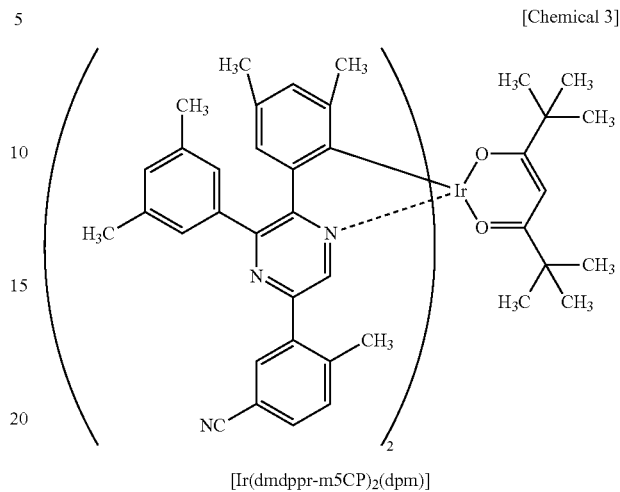

[Ir(dmdppr-m5CP)$_2$(dpm)]

An emission spectrum of infrared light used in this example is similar to that in Example 1.

Figure 34:
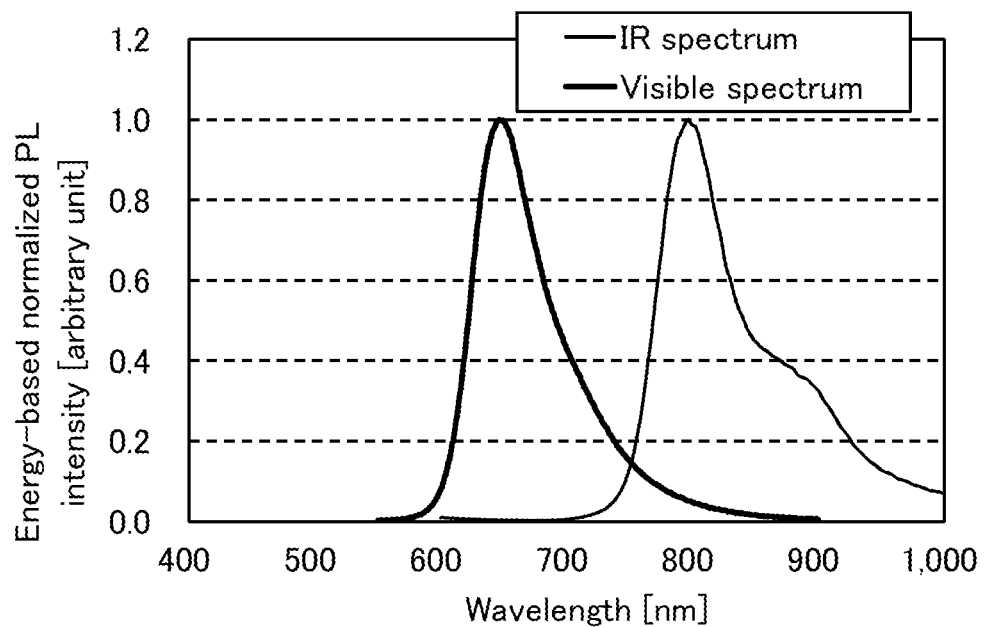
FIG. 34 is a graph showing emission spectra used for calculation in Example 3.

FIG. 34 shows the photoluminescence (PL) spectra used for the calculation. In FIG. 34, the horizontal axis represents wavelength (unit: nm) and the vertical axis represents energy-based normalized PL intensity (arbitrary unit).

The light-emitting region was assumed to be the center of the light-emitting layer.

For each of visible light and infrared light, the emission quantum yield, exciton generation probability, and recombination probability were assumed to be 100%.

The light-emitting device 47R(IR)c in FIG. 24D which was used in this example had a tandem structure in which the intermediate layer 198 included a charge generation layer.

In the light-emitting device 47R(IR)c shown in FIG. 24D, a light-emitting unit including the light-emitting layer 193R emitting red light was provided over the light-emitting unit including the light-emitting layer 193N emitting infrared light.

The calculation was carried out with the initial values set such that the optical distance between the pixel electrode 191 and the light-emitting region of the light-emitting layer 193R was approximately 5λR/4, the optical distance between the common electrode 115 and the light-emitting region of the light-emitting layer 193R was approximately λR/4, the optical distance between the pixel electrode 191 and the light-emitting region of the light-emitting layer 193N was approximately λi/4, and the optical distance between the common electrode 115 and the light-emitting region of the light-emitting layer 193N was approximately 3λi/4, as shown in FIG. 24D.

In this example, the visible light wavelength λR was the wavelength of red light (630 nm) which is defined by BT.2020, and the infrared light wavelength λi was assumed to be 945 nm.

The device structure of the light-emitting device 47R(IR)c used in this example will be described with reference to Table 5.

Note that for simpler calculation, a hole-injection layer, an electron-injection layer, and a charge generation layer were omitted.

TABLE 5

| Layer | Material | Thickness | |
|---|---|---|---|
| Buffer layer 116 | DBT3P-II | 70 nm | Input value |
| Common electrode 115 | Ag | 15 nm | Input value |
| Buffer layer 194R | NBPhen | 60 nm | ✕ |
| Light-emitting layer 193N | 2mDBTBPDBq-II | 40 nm | Input value |
| Intermediate layer 198 | PCBBiF | 10 nm | Input value |
| | NBPhen | 229 nm | ✕ |
| Light-emitting layer 193R | 2mDBTBPDBq-II | 40 nm | Input value |
| Buffer layer 192R | PCBBiF | 99 nm | ✕ |
| Pixel electrode 191 | ITSO | 10 nm | Input value |
| | Ag | 100 nm | Input value |

✕Thickness optimized by calculation

It was assumed that the substrate 151 was a glass substrate having a thickness of 0.7 mm and a refractive index of 1.5.

As the pixel electrode 191, a stacked-layer structure of a 100-nm-thick silver film and a 10-nm-thick ITSO film was employed.

For the buffer layer 192R, PCBBiF was employed assuming a hole-transport layer. The buffer layer 192R was a layer used for optical adjustment, whose optimal thickness was obtained by calculation.

The thickness of each of the light-emitting layer 193N and the light-emitting layer 193R was 40 nm and the host material therein was 2mDBTBPDBq-II.

As the intermediate layer 198, a stacked-layer structure of NBphen and 10-nm-thick PCBBiF was employed. The NBphen included in the intermediate layer 198 was a layer used for optical adjustment, whose optimal thickness was obtained by calculation.

For the buffer layer 194R, NBphen was employed assuming an electron-transport layer. The buffer layer 194R was a layer used for optical adjustment, whose optimal thickness was obtained by calculation.

As the common electrode 115, a 15-nm-thick silver film was employed.

As the buffer layer 116, 70-nm-thick DBT3P-II was employed.

Note that the upper side of the buffer layer 116 (the side opposite to the side in contact with the common electrode 115) was assumed to be the air (refractive index: 1).

An optimal device structure of the light-emitting device was obtained by calculation using the above-described conditions. Since the calculation method is similar to that in Example 2, the detailed description is omitted.

As listed in Table 5, the thickness of PCBBiF of the buffer layer 192R was calculated to be 99 nm; the thickness of NBPhen of the intermediate layer 198, 229 nm; and the thickness of NBPhen of the buffer layer 194R, 60 nm, in the light-emitting device 47R(IR)c.

Figure 35:
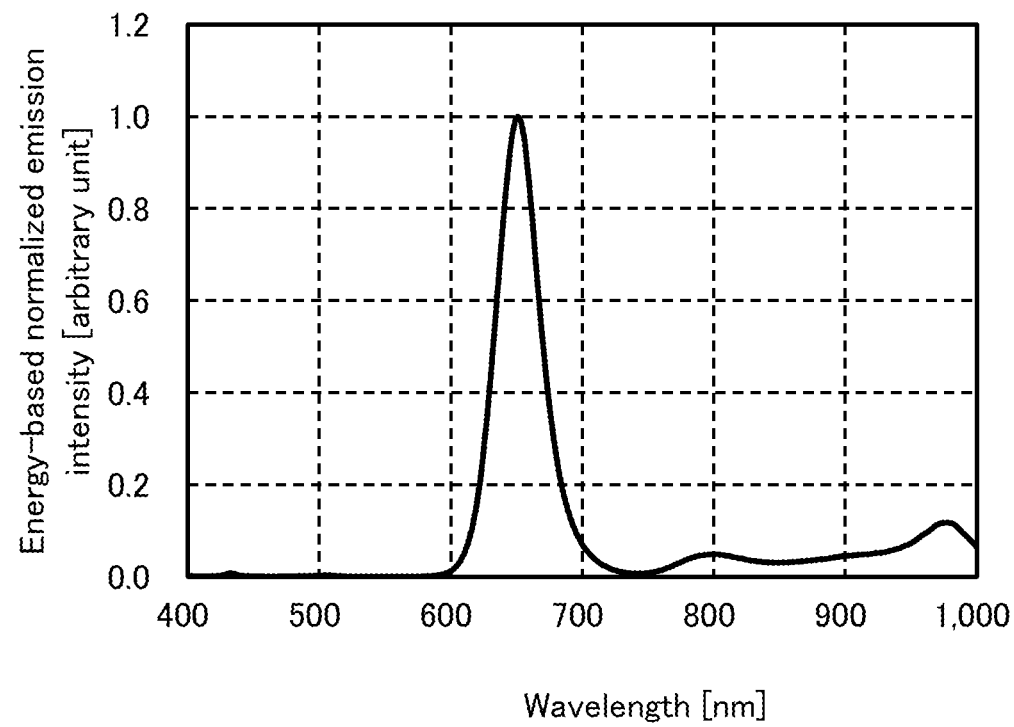
FIG. 35 is a graph showing an emission spectrum resulting from calculation in Example 3.

FIG. 35 shows an emission (EL) spectrum of the light-emitting device 47R(IR)c obtained from the calculation. In FIG. 35, the horizontal axis represents wavelength (unit: nm) and the vertical axis represents energy-based normalized emission intensity (arbitrary unit).

As shown in FIG. 35, the peak wavelength of visible light from the light-emitting device 47R(IR)c was 651 nm and the peak wavelength of infrared light therefrom was 978 nm. The peak wavelength of the infrared light was found to have substantially the same value as 1.5 times the peak wavelength of the visible light (977 nm).

The light-emitting device 47R(IR)c obtained from the calculation had an external quantum efficiency for visible light (under the assumption of Lambertian) as high as approximately 27%. In addition, the light-emitting device 47R(IR)c had an external quantum efficiency for infrared light (under the assumption of Lambertian) as high as approximately 11%.

Figure 36:
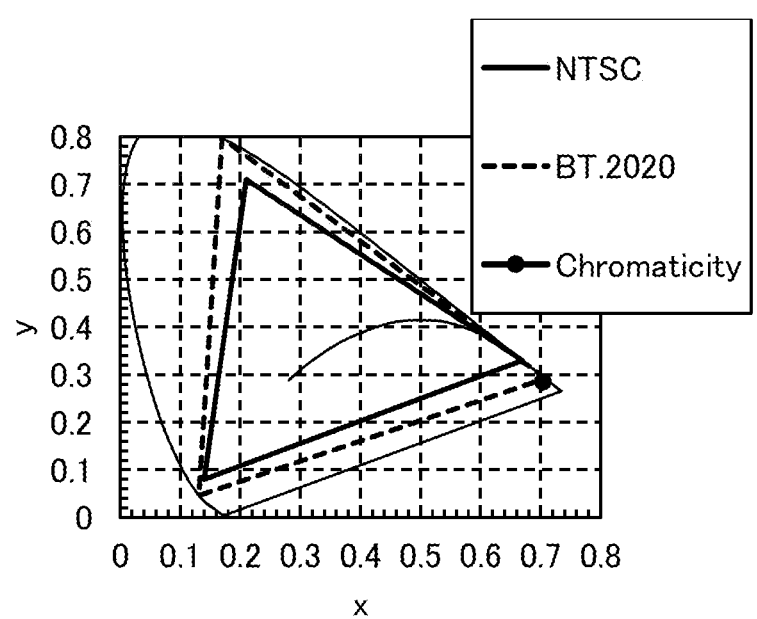
FIG. 36 is a graph showing CIE 1931 chromaticity coordinates resulting from calculation in Example 3.

FIG. 36 shows CIE 1931 chromaticity coordinates (xy chromaticity coordinates) of the light-emitting device 47R (IR)c obtained from the calculation. FIG. 36 also shows the chromaticity coordinates of the NTSC standard and the BT.2020 standard. As shown in FIG. 36, the chromaticity (x,y) of the light-emitting device 47R(IR)c in the CIE 1931 chromaticity coordinates was (0.704, 0.285). From FIG. 36, it was found that the light-emitting device 47R(IR)c had values meeting the NTSC standard and the BT.2020 standard.

From the results in this example, the device structure of the light-emitting device from which both red light and infrared light can be extracted with high efficiency was able to be estimated.

Reference Example

A method for synthesizing bis{4,6-dimethyl-2-[3-(3,5-dimethylphenyl)-2-benzo[g]quinoxalinyl-κN]phenyl-κC} (2,2,6,6-tetramethyl-3,5-heptanedionato-κ2O,O')iridium(III) (abbreviation: [Ir(dmdpbq)$_2$(dpm)]) that was used in the above Example 1 will be specifically described. The structure of [Ir(dmdpbq)$_2$(dpm)] is shown below.

[Chemical 4]

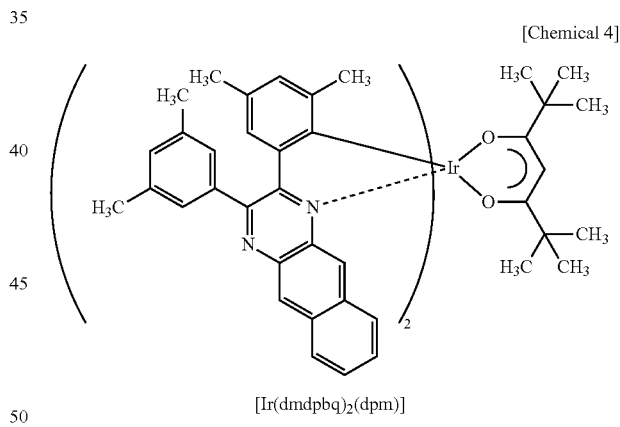

[Ir(dmdpbq)$_2$(dpm)]

Step 1; Synthesis of 2,3-bis-(3,5-dimethylphenyl)-2-benzo[g]quinoxaline (abbreviation: Hdmdpbq)

First, in Step 1, Hdmdpbq was synthesized. Into a three-necked flask equipped with a reflux pipe, 3.20 g of 3,3',5, 5'-tetramethylbenzyl, 1.97 g of 2,3-diaminonaphthalene, and 60 mL of ethanol were put, the air in the flask was replaced with nitrogen, and then the mixture was stirred at 90° C. for 7.5 hours. After a predetermined time elapsed, the solvent was distilled off. Then, purification by silica gel column chromatography using toluene as a developing solvent was performed, whereby the target substance was obtained (a yellow solid, yield: 3.73 g, percent yield: 79%). The synthesis scheme of Step 1 is shown in (a-1).

[Chemical 5]

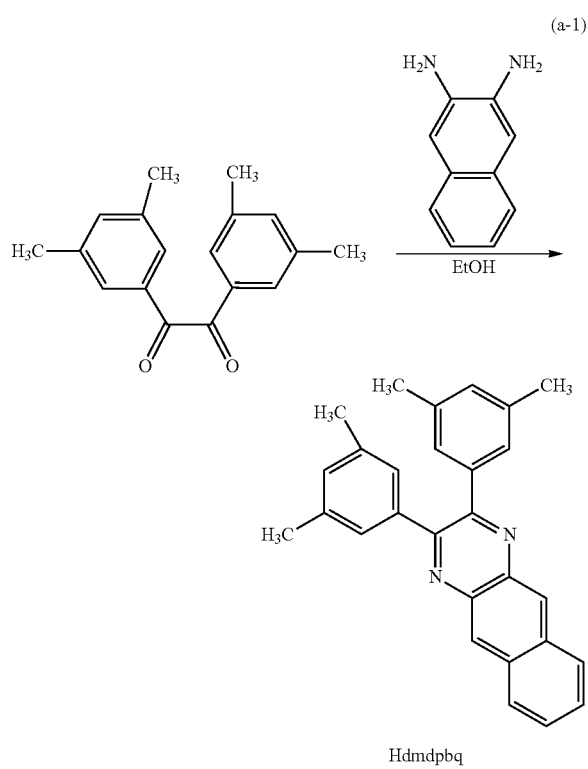

(a-1)

Hdmdpbq

Results of analysis by nuclear magnetic resonance spectroscopy ($^1$H-NMR) of the yellow solid obtained in Step 1 are shown below. The analysis results showed that Hdmdpbq was obtained.

Given below is $^1$H NMR data of the obtained substance.
$^1$H-NMR. δ (CD$_2$Cl$_2$): 2.28 (s, 12H), 7.01 (s, 2H), 7.16 (s, 4H), 7.56-7.58 (m, 2H), 8.11-8.13 (m, 2H), 8.74 (s, 2H).

Step 2; Synthesis of di-μ-chloro-tetrakis{4,6-dimethyl-2-[3-(3,5-dimethylphenyl)-2-benzo[g]quinoxalinyl-κN]phenyl-κC}diiridium(III) (abbreviation: [Ir(dmdpbq)$_2$Cl]$_2$)

Next, in Step 2, [Ir(dmdpbq)$_2$Cl]$_2$ was synthesized. Into a recovery flask equipped with a reflux pipe, 15 mL of 2-ethoxyethanol, 5 mL of water, 1.81 g of Hdmdpbq obtained in Step 1, and 0.66 g of iridium chloride hydrate (IrCl$_3$—H$_2$O) (produced by Furuya Metal Co., Ltd.) were put, and the air in the flask was replaced with argon. Then, microwave irradiation (2.45 GHz, 100 W) was performed for 2 hours to cause reaction. After a predetermined time elapsed, the obtained residue was suction-filtered and washed with methanol, whereby the target substance was obtained (a black solid, yield: 1.76 g, percent yield: 81%). The synthesis scheme of Step 2 is shown in (a-2).

[Chemical 6]

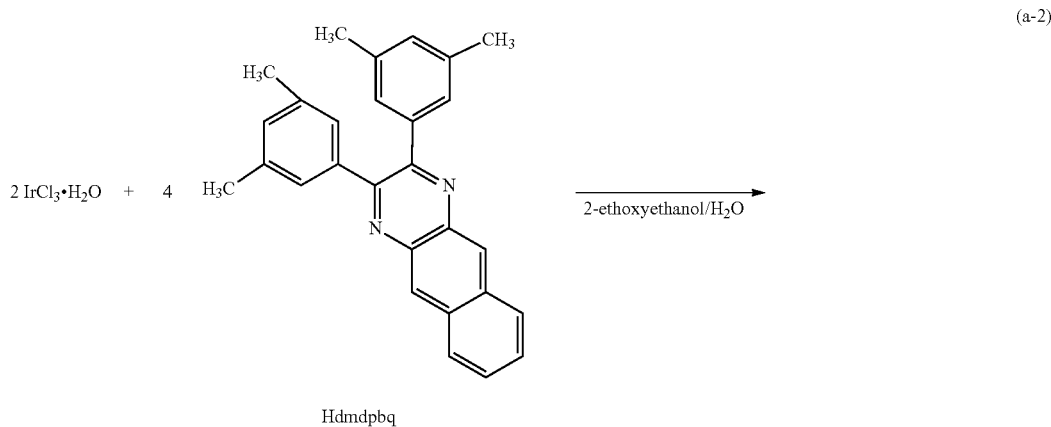

(a-2)

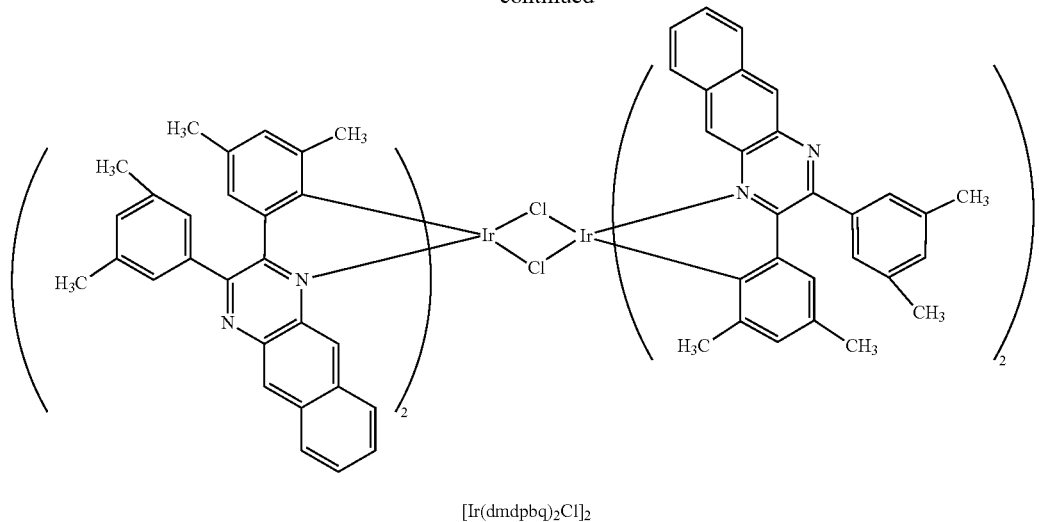

[Ir(dmdpbq)₂Cl]₂

Step 3; Synthesis of [Ir(dmdpbq)₂(dpm)]

Then, in Step 3, [Ir(dmdpbq)₂(dpm)] was synthesized. Into a recovery flask equipped with a reflux pipe, 20 mL of 2-ethoxyethanol, 1.75 g of [Ir(dmdpbq)₂Cl]₂ obtained in Step 2, 0.50 g of dipivaloylmethane (abbreviation: Hdpm), and 0.95 g of sodium carbonate were put, and the air in the flask was replaced with argon. Then, microwave irradiation (2.45 GHz, 100 W) was performed for 3 hours. The obtained residue was suction-filtered with methanol and then washed with water and methanol. The obtained solid was purified by silica gel column chromatography using dichloromethane as a developing solvent, and then recrystallization was performed with a mixed solvent of dichloromethane and methanol, whereby the target substance was obtained (a dark green solid, yield: 0.42 g, percent yield: 21%). Using a train sublimation method, 0.41 g of the obtained dark green solid was purified by sublimation. The conditions of the sublimation purification were such that the dark green solid was heated under a pressure of 2.7 Pa at 300° C. while the argon gas flowed at a flow rate of 10.5 mL/min. After the sublimation purification, a dark green solid was obtained with a percent yield of 78%. The synthesis scheme of Step 3 is shown in (a-3).

[Chemical 7]

(a-3)

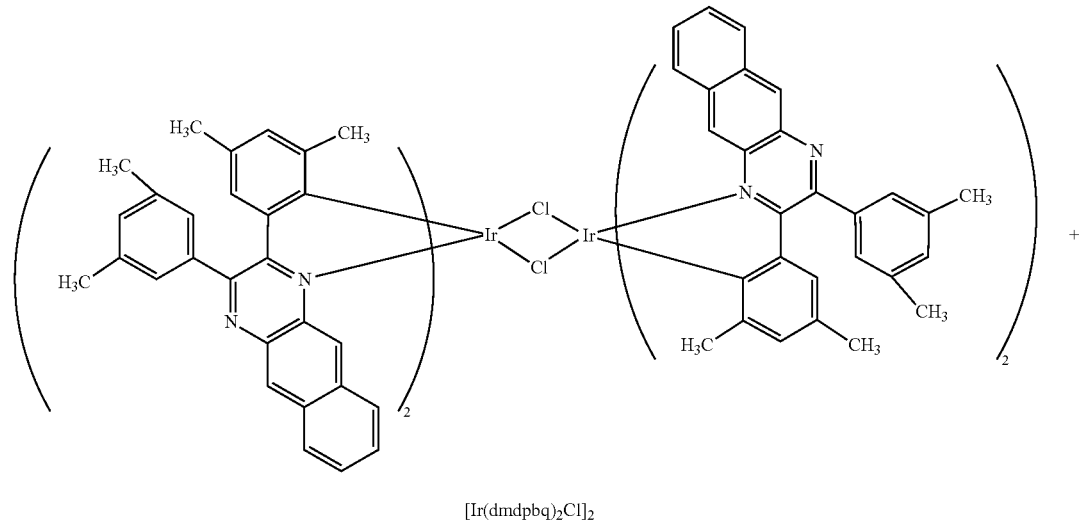

[Ir(dmdpbq)₂Cl]₂ +

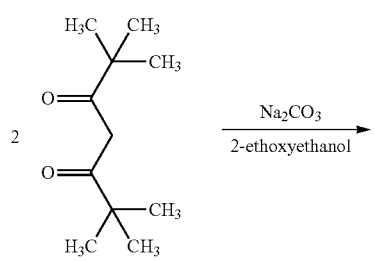 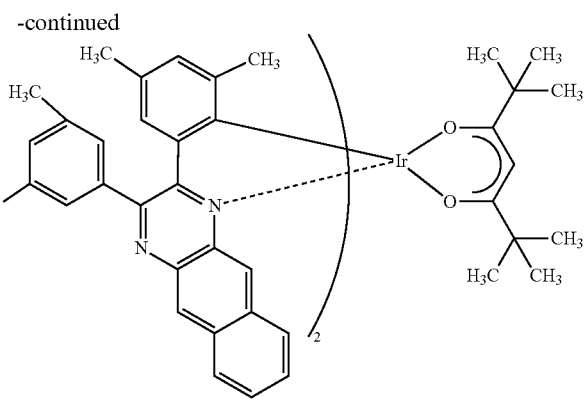

[Ir(dmdpbq)$_2$(dpm)]

Results of analysis by nuclear magnetic resonance spectroscopy ($^1$H-NMR) of the dark green solid obtained in Step 3 are shown below. The analysis results showed that [Ir(dmdpbq)$_2$(dpm)] was obtained.

$^1$H-NMR. δ (CD$_2$Cl$_2$): 0.75 (s, 18H), 0.97 (s, 6H), 2.01 (s, 6H), 2.52 (s, 12H), 4.86 (s, 1H), 6.39 (s, 2H), 7.15 (s, 2H), 7.31 (s, 2H), 7.44-7.51 (m, 4H), 7.80 (d, 2H), 7.86 (s, 4H), 8.04 (d, 2H), 8.42 (s, 2H), 8.58 (s, 2H).

REFERENCE NUMERALS

C1: capacitor, C2: capacitor, M1: transistor, M2: transistor, M3: transistor, M4: transistor, M5: transistor, M6: transistor, M7: transistor, OUT1: wiring, OUT2: wiring, PIX1: pixel circuit, PIX2: pixel circuit, V1: wiring, V2: wiring, V3: wiring, V4: wiring, V5: wiring, 10A: display apparatus, 10B: display apparatus, 10C: display apparatus, 10D: display apparatus, 10E: display apparatus, 10F: display apparatus, 21B: light, 21G: light, 21N: infrared light, 22: light, 23a: light, 23b: reflected light, 30A: light-emitting apparatus, 30B: light-emitting apparatus, 30C: light-emitting apparatus, 30D: light-emitting apparatus, 30E: light-emitting apparatus, 30F: light-emitting apparatus, 40A: light-emitting apparatus, 40B: light-emitting apparatus, 40C: light-emitting apparatus, 40D: light-emitting apparatus, 40E: light-emitting apparatus, 40F: light-emitting apparatus, 40G: light-emitting apparatus, 40H: light-emitting apparatus, 41: transistor, 42: transistor, 45: layer including transistor, 47B: light-emitting device, 47G: light-emitting device, 47N: light-emitting device, 47R: light-emitting device, 50A: display apparatus, 50B: display apparatus, 52: finger, 53: layer including light-receiving device, 55: layer including transistor, 57: layer including light-emitting device, 100A: display apparatus, 100B: display apparatus, 100C: display apparatus, 100D: display apparatus, 110: light-receiving device, 112: common layer, 114: common layer, 115: common electrode, 116: buffer layer, 141a: filter, 141b: filter, 142: adhesive layer, 143: space, 148a: colored layer, 149: lens, 151: substrate, 152: substrate, 153: substrate, 154: substrate, 155: adhesive layer, 162: display portion, 163: light-emitting portion, 164: circuit, 165: wiring, 166: conductive layer, 172: FPC, 173: IC, 181: pixel electrode, 182: buffer layer, 183: active layer, 184: buffer layer, 190: light-emitting device, 190B: light-emitting device, 190G: light-emitting device, 191: pixel electrode, 191B: pixel electrode, 191G: pixel electrode, 192: buffer layer, 192B: buffer layer, 192G: buffer layer, 192R: buffer layer, 193: light-emitting layer, 193B: light-emitting layer, 193G: light-emitting layer, 193N: light-emitting layer, 193R: light-emitting layer, 194: buffer layer, 194B: buffer layer, 194G: buffer layer, 194R: buffer layer, 195: protective layer, 195a: inorganic insulating layer, 195b: organic insulating layer, 195c: inorganic insulating layer, 198: intermediate layer, 200A: light-emitting apparatus, 200B: light-emitting apparatus, 201: transistor, 202: transistor, 204: connection portion, 205: transistor, 206: transistor, 207: transistor, 208: transistor, 209: transistor, 210: transistor, 211: insulating layer, 212: insulating layer, 213: insulating layer, 214: insulating layer, 215: insulating layer, 216: bank, 217: bank, 218: insulating layer, 221: conductive layer, 222a: conductive layer, 222b: conductive layer, 223: conductive layer, 225: insulating layer, 228: region, 231: semiconductor layer, 231i: channel formation region, 231n: low-resistance region, 242: connection layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal This application is based on Japanese Patent Application Serial No. 2018-239832 filed on Dec. 21, 2018 and Japanese Patent Application Serial No. 2018-239835 filed on Dec. 21, 2018, the entire contents of which are hereby incorporated herein by reference.

The invention claimed is:
1. A display apparatus comprising a display portion,
wherein the display portion comprises a first light-emitting device, a second light-emitting device, and a light-receiving device, wherein the first light-emitting device comprises a first pixel electrode, a first light-emitting layer, a second light-emitting layer, and a common electrode, wherein the first light-emitting layer and the second light-emitting layer are each positioned between the first pixel electrode and the common electrode, wherein the second light-emitting device comprises a second pixel electrode, a third light-emitting layer, and the common electrode, wherein the third light-emitting layer is positioned between the second pixel electrode and the common electrode, wherein the light-receiving device comprises a third pixel electrode, an active layer, and the common electrode, wherein the active layer is positioned between the third pixel electrode and the common electrode, wherein the first light-emitting layer comprises a light-emitting material emitting infrared light, wherein the second light-emitting layer and the third light-emitting layer each comprise a light-emitting material emitting visible light, and wherein a wavelength of the visible light emitted from the light-emitting material in the second light-emitting layer is different from a wavelength of the visible light emitted from the light-emitting material in the third light-emitting layer.

2. The display apparatus according to claim 1,
wherein the first light-emitting layer is positioned between the first pixel electrode and the second light-emitting layer.

3. The display apparatus according to claim 1,
wherein the first pixel electrode is configured to reflect visible light and infrared light,
wherein the common electrode is configured to transmit visible light and infrared light, and
wherein the second light-emitting layer comprises a light-emitting material emitting blue light.

4. The display apparatus according to claim 1,
wherein the first light-emitting layer emits light with a peak wavelength of $\lambda_a$,
wherein the second light-emitting layer emits light with a peak wavelength of $\lambda_b$,
wherein a light-emitting region of the first light-emitting layer is positioned to have an optical distance from the first pixel electrode of $\lambda_a/4$ or the neighborhood thereof, and
wherein a light-emitting region of the second light-emitting layer is positioned to have an optical distance from the first pixel electrode of $3\lambda_b/4$ or the neighborhood thereof.

5. The display apparatus according to claim 1,
wherein the first light-emitting device further comprises a hole-transport layer,
wherein the first light-emitting layer emits light with a peak wavelength of $\lambda_a$,
wherein the second light-emitting layer emits light with a peak wavelength of $\lambda_b$, and
wherein an ordinary ray refractive index of the hole-transport layer with respect to light with a wavelength of $\lambda_b$ is 0.1 or more higher than an ordinary ray refractive index of the hole-transport layer with respect to light with a wavelength of $\lambda_a$.

6. The display apparatus according to claim 1,
wherein the first light-emitting device further comprises an electron-transport layer,
wherein the first light-emitting layer emits light with a peak wavelength of $\lambda_a$, wherein the second light-emitting layer emits light with a peak wavelength of $\lambda_b$, and
wherein an ordinary ray refractive index of the electron-transport layer with respect to light with a wavelength of $\lambda_b$ is 0.1 or more higher than an ordinary ray refractive index of the electron-transport layer with respect to light with a wavelength of $\lambda_a$.

7. The display apparatus according to claim 1,
wherein the second light-emitting layer is positioned between the first pixel electrode and the first light-emitting layer.

8. The display apparatus according to claim 7,
wherein the first pixel electrode is configured to transmit visible light and infrared light,
wherein the common electrode is configured to reflect visible light and infrared light, and
wherein the second light-emitting layer comprises a light-emitting material emitting blue light.

9. The display apparatus according to claim 7,
wherein the first light-emitting layer emits light with a peak wavelength of $\lambda_a$,
wherein the second light-emitting layer emits light with a peak wavelength of $\lambda_b$,
wherein a light-emitting region of the first light-emitting layer is positioned to have an optical distance from the first pixel electrode of $3\lambda_a/4$ or the neighborhood thereof, and
wherein a light-emitting region of the second light-emitting layer is positioned to have an optical distance from the first pixel electrode of $\lambda_b/4$ or the neighborhood thereof.

10. The display apparatus according to claim 1,
wherein the first light-emitting device is configured to emit both visible light and infrared light, and
wherein the second light-emitting device is configured to emit visible light.

11. The display apparatus according to claim 1,
wherein the first light-emitting device further comprises a charge generation layer, and
wherein the charge generation layer is positioned between the first light-emitting layer and the second light-emitting layer.

12. The display apparatus according to claim 1,
wherein the first light-emitting device and the second light-emitting device each have a micro optical resonator structure,
wherein the micro optical resonator structure of the first light-emitting device is configured to intensify both red, green, or blue light and infrared light, and
wherein the micro optical resonator structure of the second light-emitting device is configured to intensify red, green, or blue light.

13. The display apparatus according to claim 1, further comprising a third light-emitting device,
wherein the third light-emitting device comprises a fourth pixel electrode, the first light-emitting layer, the second light-emitting layer, and the common electrode,
wherein the first light-emitting device and the third light-emitting device each have a micro optical resonator structure,
wherein the micro optical resonator structure of the first light-emitting device is configured to intensify infrared light, and
wherein the micro optical resonator structure of the third light-emitting device is configured to intensify red, green, or blue light.

14. The display apparatus according to claim 1,
wherein the first light-emitting device and the second light-emitting device further comprise a common layer, and
wherein the common layer comprises a region positioned between the first pixel electrode and the common electrode and a region positioned between the second pixel electrode and the common electrode.

15. A display apparatus comprising a display portion,
wherein the display portion comprises a first light-emitting device, a second light-emitting device, and a light-receiving device,
wherein the first light-emitting device is configured to emit both visible light and infrared light,
wherein the second light-emitting device is configured to emit visible light,
wherein the light-receiving device is configured to absorb at least part of visible light and infrared light,
wherein the first light-emitting device comprises a first pixel electrode, a first light-emitting layer, a second light-emitting layer, and a common electrode,
wherein the first light-emitting layer and the second light-emitting layer are each positioned between the first pixel electrode and the common electrode,
wherein the second light-emitting device comprises a second pixel electrode, a third light-emitting layer, and the common electrode,
wherein the third light-emitting layer is positioned between the second pixel electrode and the common electrode,
wherein the light-receiving device comprises a third pixel electrode, an active layer, and the common electrode,
wherein the active layer is positioned between the third pixel electrode and the common electrode,
wherein the first light-emitting layer comprises a light-emitting material emitting infrared light,
wherein the second light-emitting layer and the third light-emitting layer each comprise a light-emitting material emitting visible light,
wherein a wavelength of the visible light emitted from the light-emitting material in the second light-emitting layer is different from a wavelength of the visible light emitted from the light-emitting material in the third light-emitting layer, and
wherein the active layer comprises an organic compound.

16. The display apparatus according to claim 15,
wherein the first light-emitting device comprises a common layer,
wherein the second light-emitting device comprises the common layer,
wherein the light-receiving device comprises the common layer, and
wherein the common layer comprises a region positioned between the first pixel electrode and the common electrode, a region positioned between the second pixel electrode and the common electrode, and a region positioned between the third pixel electrode and the common electrode.

17. The display apparatus according to claim 15,
wherein the first light-emitting layer is positioned between the first pixel electrode and the second light-emitting layer.

18. The display apparatus according to claim 15,
wherein the first pixel electrode is configured to reflect visible light and infrared light,
wherein the common electrode is configured to transmit visible light and infrared light, and
wherein the second light-emitting layer comprises a light-emitting material emitting blue light.

19. The display apparatus according to claim 15,
wherein the first light-emitting layer emits light with a peak wavelength of $\lambda_a$,
wherein the second light-emitting layer emits light with a peak wavelength of $\lambda_b$,
wherein a light-emitting region of the first light-emitting layer is positioned to have an optical distance from the first pixel electrode of $\lambda_a/4$ or the neighborhood thereof, and
wherein a light-emitting region of the second light-emitting layer is positioned to have an optical distance from the first pixel electrode of $3\lambda_b/4$ or the neighborhood thereof.

20. The display apparatus according to claim 15,
wherein the first light-emitting device further comprises a hole-transport layer,
wherein the first light-emitting layer emits light with a peak wavelength of $\lambda_a$,
wherein the second light-emitting layer emits light with a peak wavelength of $\lambda_b$, and
wherein a refractive index of the hole-transport layer with respect to light with a wavelength of $\lambda_b$ is 0.1 or more higher than a refractive index of the hole-transport layer with respect to light with a wavelength of $\lambda_a$.

21. The display apparatus according to claim 15,
wherein the first light-emitting device further comprises an electron-transport layer,
wherein the first light-emitting layer emits light with a peak wavelength of $\lambda_a$,
wherein the second light-emitting layer emits light with a peak wavelength of $\lambda_b$, and
wherein a refractive index of the electron-transport layer with respect to light with a wavelength of $\lambda_b$ is 0.1 or more higher than a refractive index of the electron-transport layer with respect to light with a wavelength of $\lambda_a$.

22. The display apparatus according to claim 15,
wherein the second light-emitting layer is positioned between the first pixel electrode and the first light-emitting layer.

23. The display apparatus according to claim 22,
wherein the first pixel electrode is configured to transmit visible light and infrared light,
wherein the common electrode is configured to reflect visible light and infrared light, and
wherein the second light-emitting layer comprises a light-emitting material emitting blue light.

24. The display apparatus according to claim 22,
wherein the first light-emitting layer emits light with a peak wavelength of $\lambda_a$,
wherein the second light-emitting layer emits light with a peak wavelength of $\lambda_b$,
wherein a light-emitting region of the first light-emitting layer is positioned to have an optical distance from the first pixel electrode of $3\lambda_a/4$ or the neighborhood thereof, and
wherein a light-emitting region of the second light-emitting layer is positioned to have an optical distance from the first pixel electrode of $\lambda_b/4$ or the neighborhood thereof.

25. The display apparatus according to claim 15,
wherein the first light-emitting device further comprises a charge generation layer, and wherein the charge generation layer is positioned between the first light-emitting layer and the second light-emitting layer.

26. The display apparatus according to claim 15,
wherein the first light-emitting device and the second light-emitting device each have a micro optical resonator structure,
wherein the micro optical resonator structure of the first light-emitting device is configured to intensify both red, green, or blue light and infrared light, and
wherein the micro optical resonator structure of the second light-emitting device is configured to intensify red, green, or blue light.

27. The display apparatus according to claim 15, further comprising a third light-emitting device,
wherein the third light-emitting device comprises a fourth pixel electrode, the first light-emitting layer, the second light-emitting layer, and the common electrode,
wherein the first light-emitting device and the third light-emitting device each have a micro optical resonator structure,
wherein the micro optical resonator structure of the first light-emitting device is configured to intensify infrared light, and
wherein the micro optical resonator structure of the third light-emitting device is configured to intensify red, green, or blue light.

28. The display apparatus according to claim 15,
wherein the display portion has flexibility.

29. A module comprising:
the display apparatus according to claim 15; and
a connector or an integrated circuit.

30. An electronic device comprising:
the module according to claim 29; and
at least one of an antenna, a battery, a housing, a camera, a speaker, a microphone, and an operation button.

31. A display apparatus comprising a light-emitting device and a light-receiving device,
wherein the light-emitting device comprises a first electrode, a first light-emitting layer, a second light-emitting layer, and a second electrode,
wherein the first light-emitting layer and the second light-emitting layer are each positioned between the first electrode and the second electrode,
wherein the light-receiving device comprises a third electrode, an active layer, and the second electrode,
wherein the active layer is positioned between the third electrode and the second electrode,
wherein the first light-emitting layer comprises a light-emitting material emitting infrared light,
wherein the second light-emitting layer comprises a light-emitting material emitting visible light, and
wherein the active layer comprises an organic compound.

32. The display apparatus according to claim 31,
wherein the first electrode is configured to reflect visible light and infrared light,
wherein the second electrode is configured to transmit visible light and infrared light, and
wherein the first light-emitting layer is positioned between the first electrode and the second light-emitting layer.

33. The display apparatus according to claim 32,
wherein the second light-emitting layer comprises a light-emitting material emitting blue light.

34. The display apparatus according to claim 31,
wherein the first light-emitting layer emits light with a peak wavelength of $\lambda_a$,
wherein the second light-emitting layer emits light with a peak wavelength of $\lambda_b$,
wherein a light-emitting region of the first light-emitting layer is positioned to have an optical distance from the first electrode of $\lambda_a/4$ or the neighborhood thereof, and
wherein a light-emitting region of the second light-emitting layer is positioned to have an optical distance from the first electrode of $3\lambda_b/4$ or the neighborhood thereof.

35. The display apparatus according to claim 31, further comprising a hole-transport layer,
wherein the first light-emitting layer emits light with a peak wavelength of $\lambda_a$,
wherein the second light-emitting layer emits light with a peak wavelength of $\lambda_b$, and
wherein an ordinary ray refractive index of the hole-transport layer with respect to light with a wavelength of $\lambda_b$ is 0.1 or more higher than an ordinary ray refractive index of the hole-transport layer with respect to light with a wavelength of $\lambda_a$.

36. The display apparatus according to claim 31, further comprising an electron-transport layer,
wherein the first light-emitting layer emits light with a peak wavelength of $\lambda_a$,
wherein the second light-emitting layer emits light with a peak wavelength of $\lambda_b$, and
wherein an ordinary ray refractive index of the electron-transport layer with respect to light with a wavelength of $\lambda_b$ is 0.1 or more higher than an ordinary ray refractive index of the electron-transport layer with respect to light with a wavelength of $\lambda_a$.

37. The display apparatus according to claim 31,
wherein the first electrode is configured to reflect visible light and infrared light,
wherein the second electrode is configured to transmit visible light and infrared light, and
wherein the second light-emitting layer is positioned between the first electrode and the first light-emitting layer.

38. The display apparatus according to claim 31, further comprising a charge generation layer,
wherein the charge generation layer is positioned between the first light-emitting layer and the second light-emitting layer.

39. The display apparatus according to claim 31,
wherein the light-emitting device has a micro optical resonator structure configured to intensify both red, green, or blue light and infrared light.

* * * * *